US008728955B2

(12) United States Patent
LaVoie et al.

(10) Patent No.: US 8,728,955 B2
(45) Date of Patent: May 20, 2014

(54) METHOD OF PLASMA ACTIVATED DEPOSITION OF A CONFORMAL FILM ON A SUBSTRATE SURFACE

(75) Inventors: Adrien LaVoie, Portland, OR (US); Mark J. Saly, North Andover, MA (US); Daniel Moser, Manitowoc, WI (US); Rajesh Odedra, Cheshire (GB); Ravi Konjolia, North Andover, MA (US)

(73) Assignee: Novellus Systems, Inc., San Jose, CA (US)

( * ) Notice: Subject to any disclaimer, the term of this patent is extended or adjusted under 35 U.S.C. 154(b) by 23 days.

(21) Appl. No.: 13/409,212

(22) Filed: Mar. 1, 2012

(65) Prior Publication Data

US 2013/0210241 A1 Aug. 15, 2013

Related U.S. Application Data

(60) Provisional application No. 61/598,547, filed on Feb. 14, 2012.

(51) Int. Cl.
*H01L 21/469* (2006.01)
*H01L 21/302* (2006.01)

(52) U.S. Cl.
USPC ...... 438/765; 438/780; 438/791; 257/E21.24; 118/723 I; 118/723 R

(58) Field of Classification Search
None
See application file for complete search history.

(56) References Cited

U.S. PATENT DOCUMENTS

| 4,992,299 A | 2/1991 | Hochberg et al. |
| 4,992,306 A | 2/1991 | Hochberg et al. |
| 5,013,690 A | 5/1991 | Hochberg et al. |
| 5,874,368 A | 2/1999 | Laxman et al. |
| 5,932,286 A | 8/1999 | Beinglass et al. |
| 6,270,572 B1 | 8/2001 | Kim et al. |
| 6,391,803 B1 | 5/2002 | Kim et al. |

(Continued)

FOREIGN PATENT DOCUMENTS

| EP | 2 138 604 | 12/2009 |
| EP | 2 144 279 | 1/2010 |

(Continued)

OTHER PUBLICATIONS

"Plasma Enhanced Atomic Layer Deposition (PEALD)", Website: http://www.asm.com/index.php?option=com_content&task=view &id=19&Itemid=16 1 1999-2010, ASM International N.V., 1 page.

(Continued)

*Primary Examiner* — Zandra Smith
*Assistant Examiner* — Khanh Duong

(57) ABSTRACT

A method of depositing a film on a substrate surface includes providing a substrate in a reaction chamber; selecting a silicon-containing reactant from a precursor group consisting of di-tert-butyl diazidosilane, bis(ethylmethylamido)silane, bis(diisopropylamino)silane, bis(tert-butylhydrazido)diethylsilane, tris(dimethylamido)silylazide, tris(dimethylamido)silylamide, ethylsilicon triazide, diisopropylaminosilane, and hexakis(dimethylamido)disilazane; introducing the silicon-containing reactant in vapor phase into the reaction chamber under conditions allowing the silicon-containing reactant to adsorb onto the substrate surface; introducing a second reactant in vapor phase into the reaction chamber while the silicon-containing reactant is adsorbed on the substrate surface, and wherein the second reactant is introduced without first sweeping the silicon-containing reactant out of the reaction chamber; and exposing the substrate surface to plasma to drive a reaction between the silicon-containing reactant and the second reactant on the substrate surface to form the film.

15 Claims, 31 Drawing Sheets

(56) References Cited

U.S. PATENT DOCUMENTS

| | | | |
|---|---|---|---|
| 6,428,859 B1 | 8/2002 | Chiang et al. | |
| 6,468,924 B2 | 10/2002 | Lee et al. | |
| 6,528,430 B2 | 3/2003 | Kwan et al. | |
| 6,551,893 B1 | 4/2003 | Zheng et al. | |
| 6,576,053 B1 | 6/2003 | Kim et al. | |
| 6,632,478 B2 | 10/2003 | Gaillard et al. | |
| 6,645,574 B1 | 11/2003 | Lee et al. | |
| 6,723,595 B2 | 4/2004 | Park | |
| 6,743,738 B2 | 6/2004 | Todd | |
| 6,828,218 B2 | 12/2004 | Kim et al. | |
| 6,835,417 B2 | 12/2004 | Saenger et al. | |
| 6,861,356 B2 | 3/2005 | Matsuse et al. | |
| 6,962,876 B2 | 11/2005 | Ahn et al. | |
| 6,987,240 B2 | 1/2006 | Jennings et al. | |
| 7,001,844 B2 | 2/2006 | Chakravarti et al. | |
| 7,077,904 B2 | 7/2006 | Cho et al. | |
| 7,115,528 B2 | 10/2006 | Vaartstra et al. | |
| 7,122,222 B2 | 10/2006 | Xiao et al. | |
| 7,122,464 B2 | 10/2006 | Vaarstra | |
| 7,132,353 B1 | 11/2006 | Xia et al. | |
| 7,151,039 B2 | 12/2006 | Lee et al. | |
| 7,205,187 B2 | 4/2007 | Leith et al. | |
| 7,223,649 B2 | 5/2007 | Oh et al. | |
| 7,241,686 B2 | 7/2007 | Marcadal et al. | |
| 7,244,668 B2 | 7/2007 | Kim | |
| 7,250,083 B2 | 7/2007 | Sneh | |
| 7,259,050 B2 | 8/2007 | Chen et al. | |
| 7,261,919 B2 | 8/2007 | Mehregany et al. | |
| 7,294,582 B2 | 11/2007 | Haverkort et al. | |
| 7,297,641 B2 | 11/2007 | Todd et al. | |
| 7,314,835 B2 | 1/2008 | Ishizaka et al. | |
| 7,341,959 B2 | 3/2008 | Brcka | |
| 7,361,538 B2 | 4/2008 | Luan et al. | |
| 7,390,743 B2 | 6/2008 | Shin | |
| 7,419,888 B2 | 9/2008 | Yang et al. | |
| 7,435,454 B2 | 10/2008 | Brcka | |
| 7,488,694 B2 | 2/2009 | Kim et al. | |
| 7,521,331 B2 | 4/2009 | Park et al. | |
| 7,524,762 B2 | 4/2009 | Marcadal et al. | |
| 7,544,615 B2 | 6/2009 | Vaartstra | |
| 7,572,052 B2 | 8/2009 | Ravi et al. | |
| 7,592,231 B2 | 9/2009 | Cheng et al. | |
| 7,601,648 B2 | 10/2009 | Chua et al. | |
| 7,615,449 B2 | 11/2009 | Chung et al. | |
| 7,622,369 B1 | 11/2009 | Lee et al. | |
| 7,622,383 B2 | 11/2009 | Kim et al. | |
| 7,632,757 B2 | 12/2009 | Matsuura | |
| 7,633,125 B2 | 12/2009 | Lu et al. | |
| 7,638,170 B2 | 12/2009 | Li | |
| 7,645,484 B2 | 1/2010 | Ishizaka | |
| 7,651,729 B2 | 1/2010 | Kim et al. | |
| 7,651,959 B2 | 1/2010 | Fukazawa et al. | |
| 7,678,422 B2 * | 3/2010 | Lei et al. | 427/255.29 |
| 7,682,657 B2 | 3/2010 | Sherman | |
| 7,713,592 B2 | 5/2010 | Nguyen et al. | |
| 7,776,733 B2 | 8/2010 | Hasegawa | |
| 7,919,416 B2 | 4/2011 | Lee et al. | |
| 7,959,985 B2 | 6/2011 | Ishizaka et al. | |
| 8,336,490 B2 * | 12/2012 | Matsuura et al. | 118/723 I |
| 2005/0159017 A1 | 7/2005 | Kim et al. | |
| 2006/0258173 A1 * | 11/2006 | Xiao et al. | 438/780 |
| 2007/0251444 A1 | 11/2007 | Gros et al. | |
| 2007/0299274 A1 | 12/2007 | Meiere | |
| 2008/0145535 A1 | 6/2008 | Lei et al. | |
| 2008/0207007 A1 | 8/2008 | Thridandam et al. | |
| 2008/0242116 A1 | 10/2008 | Clark | |
| 2009/0056877 A1 | 3/2009 | Matsuura et al. | |
| 2009/0148625 A1 | 6/2009 | Yeom et al. | |
| 2009/0155606 A1 | 6/2009 | Yoon et al. | |
| 2009/0163012 A1 | 6/2009 | Clark et al. | |
| 2009/0246973 A1 | 10/2009 | Clark | |
| 2009/0246974 A1 | 10/2009 | Clark | |
| 2009/0324828 A1 | 12/2009 | Kato et al. | |
| 2010/0055347 A1 | 3/2010 | Kato et al. | |
| 2010/0102417 A1 | 4/2010 | Ganguli et al. | |
| 2010/0143607 A1 | 6/2010 | Lei et al. | |
| 2010/0221925 A1 | 9/2010 | Lee et al. | |
| 2010/0255218 A1 | 10/2010 | Oka et al. | |
| 2011/0086516 A1 | 4/2011 | Lee et al. | |
| 2011/0159286 A1 | 6/2011 | Park et al. | |
| 2011/0256726 A1 | 10/2011 | LaVoie et al. | |
| 2011/0256734 A1 | 10/2011 | Hausmann et al. | |
| 2012/0128897 A1 * | 5/2012 | Xiao et al. | 427/579 |
| 2012/0178264 A1 * | 7/2012 | Murakami et al. | 438/765 |
| 2012/0277457 A1 * | 11/2012 | Lehmann et al. | 556/410 |

FOREIGN PATENT DOCUMENTS

| | | |
|---|---|---|
| JP | 4364320 | 8/2009 |
| KR | 10-2001-0111448 | 12/2001 |
| KR | 10-2004-0001036 | 1/2004 |
| KR | 10-2009-0057665 | 6/2009 |
| KR | 10-2009-0081396 | 7/2009 |
| WO | WO 2005/045899 | 5/2005 |
| WO | WO 2007/112779 | 10/2007 |
| WO | WO 2007/112780 | 10/2007 |
| WO | WO 2007/118474 | 10/2007 |
| WO | WO 2008/121463 | 10/2008 |

OTHER PUBLICATIONS

"PlasmaPro NGP80", Oxford Instruments (2010), 8 pages.

Cecchi et al., "Ultra-thin conformal pore-scaling of low-k materials by plasma-assisted ALD", University of New Mexico, Albuquerque, NM, Sandia National Labs, Albuquerque, NM (2007), 1 page.

International Search Report and Written Opinion, dated Feb. 20, 2012, issued in PCT/US2011/032303, 12 pages.

International Search Report and Written Opinion, dated Oct. 20, 2011, issued in PCT/US2011/032186, 14 pages.

Invitation to Pay Additional Fees; Communication Re Partial International Search, dated Dec. 16, 2011, issued in PCT/US2011/032303, 7 pages.

King, Sean W., "Plasma enhanced atomic layer deposition of SiNx:H and SiO2", J. Vac. Sci. Technol. A 29(4), Jul./Aug. 2011; 2011 American Vacuum Society, pp. 041501-1-041501-9.

Lee et al., "Chemically conformal deposition of SrTiO3 thin films by Atomic Layer Deposition using conventional metal organic precursors and remote-plasma activated H2O", School of Materials Science and Engineering, and Inter-university Semiconductor Research Center, Seoul National University, Microelectronic Engineering 80 (2005), pp. 158-161.

Lee, Jong Ju, "Low-impurity, highly conformal atomic layer deposition of titanium nitride using NH3-Ar-H2 plasma treatment for capacitor electrodes", Lawrence Berkeley National Laboratory, University of California, Berkeley, CA (2004), 3 pages.

U.S. Appl. No. 13/084,305, filed Apr. 11, 2011, entitled "Silicon Nitride Films and Methods." [see US Publication No. 2011-0256734].

U.S. Appl. No. 13/084,399, filed Apr. 11, 2011, entitled "Plasma Activated Conformal Film Deposition." [see US Patent Publication No. 2011-0256726].

U.S. Appl. No. 13/224,240, filed Sep. 1, 2011, entitled "Plasma Activated Conformal Dielectric Film Deposition".

U.S. Appl. No. 13/242,084, filed Sep. 23, 2011, entitled "Plasma Activated Conformal Dielectric Film Deposition".

U.S. Appl. No. 13/414,619, filed Mar. 7, 2012, entitled "Method for Depositing a Chlorine-Free Conformal Sin Film".

U.S. Appl. No. 13/472,282, filed May 15, 2012, entitled "Methods for UV-Assisted Conformal Film Deposition".

* cited by examiner

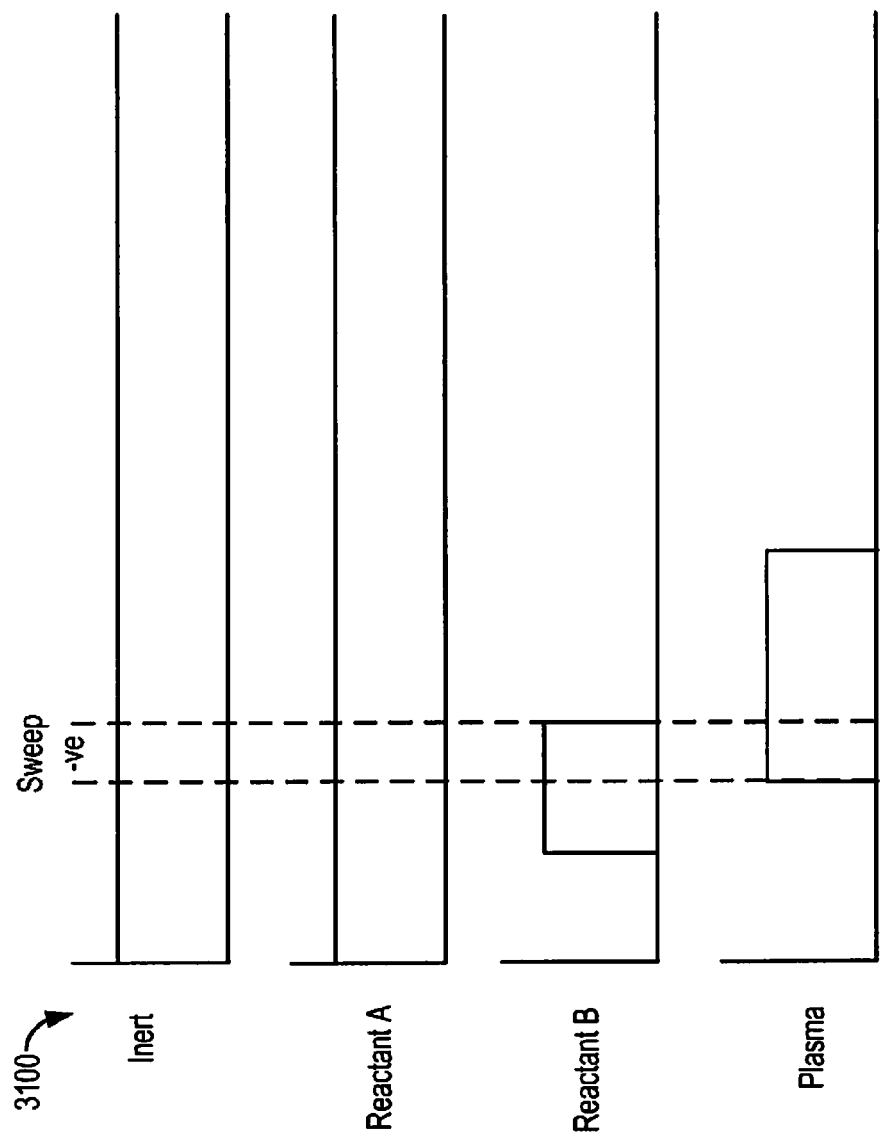

US 8,728,955 B2

METHOD OF PLASMA ACTIVATED DEPOSITION OF A CONFORMAL FILM ON A SUBSTRATE SURFACE

CROSS REFERENCE TO RELATED APPLICATIONS

This application claims the benefit and priority of 61/598,547, filed Feb. 14, 2012. The entire disclosure of the above application is incorporated herein by reference.

This application is related to U.S. patent application Ser. No. 13/084,399, filed on Apr. 11, 2011, U.S. patent application Ser. No. 13/084,305, filed on Apr. 11, 2011, and U.S. patent application Ser. No. 13/083,827, filed on Apr. 11, 2011, which are incorporated herein by reference in their entirety.

BACKGROUND

Various thin film layers for semiconductor devices may be deposited with atomic layer deposition (ALD) processes. Under some conditions, some ALD processes may be unable to saturate the wafer, leading to incomplete film deposition on the wafer, film islanding, and film thickness variation. Some approaches to address incomplete film deposition may include longer dosing times to saturate the wafer surface with film precursor. However, extended dosing time may waste valuable precursor during film nucleation phases. The additive effect of extending processing time may diminish process tool throughput, requiring the installation and maintenance of additional process tools to support a production line. Further, films produced by such approaches may have physical, chemical, or electrical characteristics that provide inadequate device performance.

SUMMARY

A method of depositing a film on a substrate surface includes providing a substrate in a reaction chamber; selecting a silicon-containing reactant from a precursor group consisting of di-tert-butyl diazidosilane, tris(dimethylamido)silylazide, and bis(tert-butylhydrazido)diethylsilane; introducing the silicon-containing reactant in vapor phase into the reaction chamber; and introducing a second reactant in vapor phase into the reaction chamber.

In other features, the method includes introducing the silicon-containing reactant under conditions allowing the silicon-containing reactant to adsorb onto the substrate surface and exposing the substrate surface to plasma to drive a reaction between the silicon-containing reactant and the second reactant on the substrate surface to form the film.

In other features, the method includes introducing the second reactant into the reaction chamber while the silicon-containing reactant is adsorbed on the substrate surface and without first sweeping the silicon-containing reactant out of the reaction chamber. The second reactant flows to the substrate surface at one of a constant flow rate, a non-constant flow rate and an intermittent flow rate.

In other features, the film comprises SiN, the film forms a conformal structure, and deposition of the film is performed at a temperature less than or equal to 400° C.

A method of depositing a film on a substrate surface includes (a) providing a substrate in a reaction chamber; (b) selecting a silicon-containing reactant from a precursor group consisting of di-tert-butyl diazidosilane, bis(ethylmethylamido)silane, bis(diisopropylamino)silane, bis(tert-butylhydrazido)diethylsilane, tris(dimethylamido)silylazide, tris(dimethylamido)silylamide, ethylsilicon triazide, diisopropylaminosilane, and hexakis(dimethylamido)disilazane; (c) introducing the silicon-containing reactant in vapor phase into the reaction chamber under conditions allowing the silicon-containing reactant to adsorb onto the substrate surface; (d) introducing a second reactant in vapor phase into the reaction chamber while the silicon-containing reactant is adsorbed on the substrate surface without first sweeping the silicon-containing reactant out of the reaction chamber; and (e) exposing the substrate surface to plasma to drive a reaction between the silicon-containing reactant and the second reactant on the substrate surface to form the film.

In other features, the method includes igniting the plasma while at least one of the silicon-containing reactant and the second reactant is in a gas phase while being exposed to the substrate. The silicon-containing reactant and the second reactant do not react with one another in the vapor phase.

In other features, the film comprises SiN film and deposition is performed at a temperature less than or equal to 400° C. The second reactant flows to the substrate surface at a non-constant flow rate during (d). The method further includes sweeping out the second reactant in vapor phase prior to (e). The method includes exposing the substrate surface to the second reactant after the sweep phase but prior to (e).

In other features, the silicon-containing reactant and the second reactant co-exist in vapor phase. The silicon-containing reactant and the second reactant do not appreciably react with one another until exposure to plasma in (e). The film formed in (e) forms a conformal structure. After (e), the method includes depositing additional film directly on a portion of the film by chemical vapor deposition. The second reactant flows to the substrate surface at one of a constant flow rate, a non-constant flow rate and an intermittent flow rate.

An apparatus for depositing a film on a substrate includes a reaction chamber and an inlet port that delivers gas phase reactants to the reaction chamber. A plasma generator provides plasma to the reaction chamber. A controller initates flowing a silicon-containing reactant in vapor phase into the reaction chamber under conditions allowing the silicon-containing reactant to adsorb onto a substrate surface. The silicon containing reactant is selected from a precursor group consisting of di-tert-butyl diazidosilane, bis(ethylmethylamido)silane, bis(diisopropylamino)silane, bis(tert-butylhydrazido)diethylsilane, tris(dimethylamido)silylazide, tris(dimethylamido)silylamide, ethylsilicon triazide, diisopropylaminosilane, and hexakis(dimethylamido)disilazane. The controller initiates flowing a second reactant in vapor phase into the reaction chamber while the silicon-containing reactant is adsorbed on the substrate surface and without first sweeping the silicon-containing reactant out of the reaction chamber. The controller causes the plasma generator to generate the plasma in the reaction chamber to drive a reaction between the silicon-containing reactant and the second reactant to form the film.

In other features, the controller initiates chemical vapor deposition directly on a portion of the film. The controller initiates etching the film and depositing additional film on the etched film.

In other features, the film comprises SiN film, the film forms a conformal structure, and deposition of the film is performed at a temperature less than or equal to 400° C.

These and other features will be described in more detail below with reference to the associated drawings.

BRIEF DESCRIPTION OF THE DRAWINGS

FIG. 31 schematically shows a timing diagram for another example CFD process including concurrent PECVD and CFD deposition processes and including an overlap between a supply of reactant B to the process station and plasma activation according to an example of the present disclosure.

DETAILED DESCRIPTION

Figure 1:
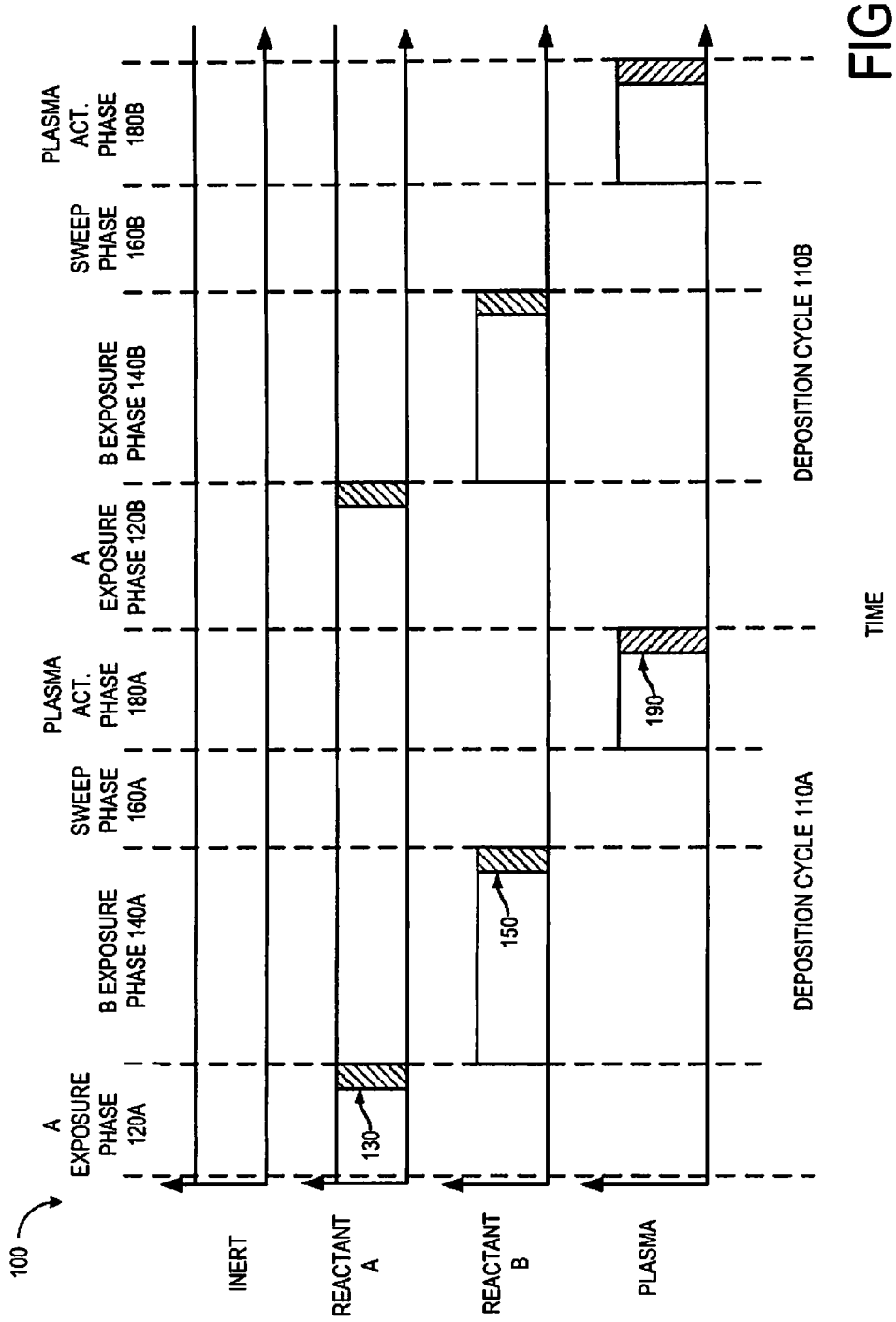
FIG. 1 schematically shows a timing diagram for an example conformal film deposition (CFD) process according to an example of the present disclosure.

Manufacture of semiconductor devices typically involves depositing one or more thin films on a non-planar substrate in an integrated fabrication process. In some aspects of the integrated process it may be useful to deposit thin films that conform to substrate topography. For example, a silicon nitride film may be deposited on top of an elevated gate stack to act as a spacer layer for protecting lightly-doped source and drain regions from subsequent ion implantation processes.

In spacer layer deposition processes, chemical vapor deposition (CVD) processes may be used to form a silicon nitride film on the non-planar substrate, which is then anisotropically etched to form the spacer structure. However, as a distance between gate stacks decreases, mass transport limitations of CVD gas phase reactions may cause "bread-loafing" deposition effects. Such effects typically exhibit thicker deposition at top surfaces of gate stacks and thinner deposition at the bottom corners of gate stacks. Further, because some die may have regions of differing device density, mass transport effects across the wafer surface may result in within-die and within-wafer film thickness variation. These thickness variations may result in over-etching of some regions and under-etching of other regions. This may degrade device performance and/or die yield.

Some approaches to addressing these issues involve atomic layer deposition (ALD). In contrast with a CVD process, where thermally activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, thermal energy provided to the substrate activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness.

Depending on the exposure time of the precursor dosing steps and the sticking coefficients of the precursors, each ALD cycle may deposit a film layer of, in one example, between one-half and three angstroms thick. Thus, ALD processes may be time consuming when depositing films more than a few nanometers thick. Further, some precursors may have long exposure times to deposit a conformal film, which may also reduce wafer throughput.

Conformal films may also be deposited on planar substrates. For example, antireflective layers for lithographic patterning applications may be formed from planar stacks comprising alternating film types. Such antireflective layers may be approximately 100 to 1000 angstroms thick, making ALD processes less attractive than CVD processes. However, such anti-reflective layers may also have a lower tolerance for within-wafer thickness variation than many CVD processes may provide. For example, a 600-angstrom thick antireflective layer may tolerate a thickness range of less than 3 angstroms.

Accordingly, various examples are provided herein providing processes and equipment for plasma-activated conformal film deposition (CFD) on non-planar and planar substrates. These examples incorporate various features employed in some but not all CFD processes. Among these features are (1) eliminating or reducing the time required to "sweep" one or both reactants from the reaction chamber, (2) providing a continuous flow of at least one reactant while a different reactant is intermittently flowed into the reaction chamber, (3) igniting plasma while one of the reactants is present in the gas phase, rather than when all reactants are cleared from the reaction chamber, (4) treating deposited CFD films with a plasma to modify the film properties, (5) depositing a portion of a film by PECVD after depositing a first portion of the film by CFD, typically in the same reaction chamber, (6) etching a partially deposited film between CFD stages, and (7) doping the CFD film by interspersing dopant delivery cycles with film only deposition cycles. Of course, this list is not exhaustive. Various other CFD features will be apparent when considering the remainder of the specification.

The concept of a CFD "cycle" is relevant to the discussion of various examples herein. Generally a cycle is the minimum set of operations required to perform a surface deposition reaction one time. The result of one cycle is production of at least a partial film layer on a substrate surface. Typically, a CFD cycle will include only those steps necessary to deliver and adsorb each reactant to the substrate surface, and then react those adsorbed reactants to form the partial layer of film. Of course, the cycle may include certain ancillary steps such as sweeping one of the reactants or byproducts and/or treating the partial film as deposited. Generally, a cycle contains only one instance of a unique sequence of operations. As an example, a cycle may include the following operations: (i) delivery/adsorption of reactant A, (ii) delivery/adsorption of reactant B, (iii) sweep B out of the reaction chamber, and (iv) apply plasma to drive a surface reaction of A and B to form the partial film layer on the surface.

The seven above-mentioned features will now be discussed further. In the following descriptions, consider a CFD reaction in which one or more reactants adsorb to the substrate surface and then react to form a film on the surface by interaction with plasma.

Feature 1 (Continuous Flow of a Reactant)

Reactant A continues to flow to a reaction chamber during one or more portions of a CFD cycle when the reactant would not normally flow in conventional ALD. In conventional ALD, reactant A flows only for the purpose of having the reactant adsorb onto the substrate surface. At other phases of an ALD cycle, reactant A does not flow. In accordance with certain CFD examples described herein, however, reactant A flows not only during phases associated with its adsorption but also during phases of a CFD cycle that perform operations other than adsorption of A. For example, in many examples, reactant A flows into the reactor while the apparatus is dosing a second reactant (reactant B herein). Thus, during at least a portion of a CFD cycle, reactants A and B coexist in the gas phase. Further, reactant A may flow while plasma is applied to drive a reaction at the substrate surface. Note that the continuously flowing reactant may be delivered to the reaction chamber in conjunction with a carrier gas—e.g., argon.

One advantage of the continuous flow example is that the established flow avoids the delays and flow variations caused by transient initialization and stabilization of flow associated with turning the flow on and off.

As a specific example, an oxide film may be deposited by a conformal film deposition process using a principal reactant (sometimes referred to as a "solid component" precursor or, in this example, simply "reactant B"). Bis(tert-butylamino) silane (BTBAS) is one such principal reactant. In this example, the oxide deposition process involves delivery of an oxidant such as oxygen or nitrous oxide, which flows initially and continuously during delivery of the principal reactant in distinct exposure phases. The oxidant also continues to flow during distinct plasma exposure phases. See for example the sequence depicted in FIG. 1. For comparison, in a conventional ALD process, the flow of oxidant would stop when the solid component precursor is delivered to the reactor. For example, the flow of reactant A would stop when reactant B is delivered.

In some specific examples, the reactant that flows continuously is an "auxiliary" reactant. As used herein, an "auxiliary" reactant is any reactant that is not a principal reactant. As suggested above, a principal reactant contains an element that is solid at room temperature, which element is contributed to the film formed by CFD. Examples of such elements are metals (e.g., aluminum and titanium), semiconductors (e.g., silicon and germanium), and non-metals or metalloids (e.g., boron). Examples of auxiliary reactants include oxygen, ozone, hydrogen, carbon monoxide, nitrous oxide, ammonia, alkyl amines, and the like.

The continuously flowing reactant may be provided at a constant flow rate or at varied but controlled flow rate. In the latter case, as an example, the flow rate of an auxiliary reactant may drop during an exposure phase when the primary reactant is delivered. For example, in oxide deposition, the oxidant (e.g., oxygen or nitrous oxide) may flow continuously during the entire deposition sequence, but its flow rate may drop when the primary reactant (e.g., BTBAS) is delivered. This increases the partial pressure of BTBAS during its dosing, thereby reducing the exposure time needed to saturate the substrate surface. Shortly before igniting the plasma, the flow of oxidant may be increased to reduce the likelihood that BTBAS is present during the plasma exposure phase. In some examples, the continuously flowing reactant flows at a varied flow rate over the course of two or more deposition cycles. For example, the reactant may flow at a first flow rate during a first CFD cycle and at a second flow rate during a second CFD cycle.

When multiple reactants are employed and the flow of one of them is continuous, at least two of them will co-exist in the gas phase during a portion of the CFD cycle. Similarly, when no purge step is performed after delivery of the first reactant, two reactants will co-exist. Therefore, it may be important to employ reactants that do not appreciably react with one another in the gas phase absent application of activation energy. Typically, the reactants should not react until present on the substrate surface and exposed to plasma or another appropriate non-thermal activation condition. Choosing such reactants involves considerations of at least (1) the thermodynamic favorability (Gibb's free energy <0) of the desired reaction, and (2) the activation energy for the reaction, which should be sufficiently great so that there is negligible reaction at the desired deposition temperature.

Feature 2 (Reduce or Eliminate a Sweep Step)

In certain examples, the process dispenses with or reduces the time associated with a sweep step that would normally be performed in conventional ALD. In conventional ALD, a separate sweep step is performed after each reactant is delivered and adsorbed onto the substrate surface. Little or no adsorption or reaction occurs in a conventional ALD sweep step. In a CFD cycle, the sweep step is reduced or eliminated after delivery of at least one of the reactants. An example of a process sequence in which a sweep step is removed is presented in FIG. 1. No sweep step is performed to sweep reactant A from the reaction chamber. In some cases, no sweep step is performed after delivery of the first reactant in a CFD cycle but a sweep step is optionally performed after delivery of the second or last delivered reactant.

The concept of a CFD "sweep" step or phase appears in the discussion of various examples herein. Generally, a sweep phase removes or purges one of the vapor phase reactant from a reaction chamber and typically occurs only after delivery of such reactant is completed. In other words, that reactant is no longer delivered to the reaction chamber during sweep phase. However, the reactant remains adsorbed on the substrate surface during the sweep phase. Typically, the sweep serves to remove any residual vapor phase reactant in the chamber after the reactant is adsorbed on the substrate surface to the desired level. A sweep phase may also remove weakly adsorbed species (e.g., certain precursor ligands or reaction by-products) from the substrate surface. In ALD, the sweep phase has been viewed as necessary to prevent gas phase interaction of two reactants or interaction of one reactant with a thermal, plasma or other driving force for the surface reaction. In general, and unless otherwise specified herein, a sweep phase may be accomplished by (i) evacuating a reaction chamber, and/or (ii) flowing gas not containing the species to be swept out through the reaction chamber. In the case of (ii), such gas may be, for example, an inert gas or an auxiliary reactant such as a continuously flowing auxiliary reactant.

Elimination of the sweep phase may be accomplished with or without continuous flow of the other reactant. In the example depicted in FIG. 1, reactant A is not swept away but rather continues to flow after its adsorption onto the substrate surface is completed (illustrated by reference number 130 in the figure).

In various examples where two or more reactants are employed, the reactant which has its sweep step eliminated or reduced is an auxiliary reactant. As an example, auxiliary reactant is an oxidant or a nitrogen source and the primary reactant is a silicon, boron, or germanium containing precursor. Of course, a sweep of the principal reactant may also be reduced or eliminated. In some examples, no sweep step is performed after delivery of an auxiliary reactant but a sweep step is optionally performed after delivery of a principal reactant.

As mentioned, the sweep phase need not be fully eliminated but simply reduced in duration in comparison to sweep phases in conventional ALD processes. For example, the sweep phase of a reactant such as an auxiliary reactant during a CFD cycle may be performed for about 0.2 seconds or less, e.g., for about 0.001 to 0.1 seconds.

Feature 3 (Igniting Plasma while One of the Reactants is Present in the Gas Phase)

With this feature, a plasma is ignited before all reactants have been cleared from the reaction chamber. This is contrary to conventional ALD, where the plasma activation or other reaction driving operation is provided only after the vapor phase reactants are no longer present in the reaction chamber. Note that this feature would necessarily occur when reactant A flows continuously during the plasma portion of a CFD cycle as depicted in FIG. 1. However, the disclosed examples are not limited in this manner. One or more reactants may flow during the plasma phase of a CFD cycle but need not flow continuously during a CFD cycle. Further, the reactant present in vapor phase during plasma activation may be a principal reactant or an auxiliary reactant (when two or more reactants are employed in a CFD cycle).

For example, a sequence might be (i) introduce reactant A, (ii) purge A, (iii) introduce reactant B and while B is flowing strike a plasma, and (iv) purge. In such examples, the process employs a plasma activated reactant species from the gas phase. This is a general example where CFD is not constrained to a sequence of sequential steps.

If the activation plasma is provided during the time when the solid component precursor (primary reactant) is supplied to the reactor, the step coverage may become less conformal, but the deposition rate will typically increase. However if plasma activation occurs only during delivery of one an auxiliary reactant this is not necessarily the case. The plasma can activate the vapor phase auxiliary component to render it more reactive and thereby increase its reactivity in the conformal film deposition reaction. In certain examples, this feature is employed when depositing a silicon containing film such as an oxide, nitride, or carbide.

Feature 4 (Plasma Treatment of Deposited CFD Films)

In these examples, the plasma may serve two or more roles in the conformal film deposition process. One of its roles is to activate or drive the film formation reaction during each CFD cycle. Its other role is to treat the film after the CFD film has been partially or fully deposited following one or more CFD cycles. The plasma treatment is intended to modify one or more film properties. Typically, though not necessarily, the plasma treatment phase is conducted under conditions that are different from those employed to activate the film formation reaction (i.e., to drive the film formation reaction). As an example, the plasma treatment may be performed in the presence of a reducing or oxidizing environment (e.g., in the presence of hydrogen or oxygen), while this need not be the case during the activation portion of a CFD cycle.

The plasma treatment operation may be performed during every cycle of the CFD process, during every other cycle, or on some less frequent basis. The treatment may be performed on regular intervals, tied to a fixed number of CFD cycles, or it may be performed variably (e.g., at varying intervals of CFD cycles) or even randomly. In a typical example, film deposition is performed for a few CFD cycles, to reach appropriate film thickness, and then the plasma treatment is employed. Thereafter, film deposition is again performed for a number of CFD cycles without plasma treatment before the treatment is again performed. This super-sequence of x number of CFD cycles, followed by plasma treatment (film modification) may be repeated until the film is completely formed by CFD.

In certain examples, the plasma treatment may be performed before initiation of CFD cycling to modify one or more properties of the surface on which the CFD film is deposited. In various examples, the surface is made from silicon (doped or undoped) or a silicon containing material. The modified surface may be better able to produce a high quality interface with the subsequently deposited CFD film. The interface may provide, e.g., good adhesion, reliable electrical properties through, e.g., defect reduction, etc.

The pretreatment of the substrate prior to CFD is not limited to any particular plasma treatment. In certain examples, the pre-treatment involves exposure to hydrogen-plasma, nitrogen-plasma, nitrogen/hydrogen-plasma, ammonia-plasma, argon-plasma, helium-plasma, helium anneal, hydrogen-anneal, ammonia-anneal, and UV-cure in the presence of helium, hydrogen, argon, nitrogen, hydrogen/nitrogen-forming gas, and/or ammonia. Plasma processing may be enabled with various plasma generators including, though not limited to, microwave, ICP-remote, direct and others known to those in the art.

Overall, the treatment may occur before, during and after CFD cycling. When occurring during CFD cycling, the frequency of treatment may be chosen for the appropriate deposition conditions. Typically, the treatment will occur not more often than once per cycle.

As an example, consider a process for forming silicon nitride from precursors having some carbon present. Examples of such precursors include BTBAS. As a consequence of the carbon present in the precursor, the as deposited nitride film includes some carbon impurity, which may degrade the electrical properties of the nitride. To counteract this problem, after a few CFD cycles with the carbon-containing precursor, the partially deposited film is exposed to hydrogen in the presence of plasma to reduce and ultimately remove the carbon impurity.

The plasma conditions employed to modify the film surface may be chosen to effect a desired change in film properties and/or composition. Among the plasma conditions that can be selected and/or tailored for the desired modification are oxidizing conditions, reducing conditions, etching conditions, power used to generate the plasma, frequency used to generate the plasma, use of two or more frequencies to generate the plasma, plasma density, the distance between the plasma and the substrate, etc. Examples of CFD film properties that can be modified by plasma treatment include, internal film stress, etch resistance, density, hardness, optical properties (refractive index, reflectivity, optical density, etc.), dielectric constant, carbon content, electrical properties (Vfb spread, etc.), and the like.

In some examples, a treatment other than a plasma treatment is employed to modify the properties of the as deposited film. Such treatments include electromagnetic radiation treatments, thermal treatments (e.g., anneals or high temperature pulses), and the like. Any of these treatments may be performed alone or in combination with another treatment, including a plasma treatment. Any such treatment can be employed as a substitute for any of the above-described plasma treatments. In a specific example, the treatment involves exposing the film to ultraviolet radiation. As described below, in a specific example, the method involves the application of UV-radiation to an oxide CFD film in situ (i.e., during formation of the film) or post deposition of the oxide. Such treatment serves to reduce or eliminate defect structure and provide improved electrical performance.

In certain specific examples, a UV treatment can be coupled with a plasma treatment. These two operations can be performed concurrently or sequentially. In the sequential option, the UV operation optionally takes place first. In the concurrent option, the two treatments may be provided from separate sources (e.g., an RF power source for the plasma and a lamp for the UV) or from a single source such as a helium plasma that produces UV radiation as a byproduct.

Feature 5 (Depositing by CFD and then Transitioning to PECVD)

In such examples, the completed film is generated in part by CFD and in part by a CVD process such as PECVD. Typically, the CFD portion of the deposition process if performed first and the PECVD portion is performed second, although this need not be the case. Mixed CFD/CVD processes can improve the step coverage over that seen with CVD alone and additionally improve the deposition rate over that seen with CFD alone. In some cases, plasma or other activation is applied while one CFD reactant is flowing in order to produce parasitic CVD operations and thereby achieve higher deposition rates, a different class of films, etc.

In certain examples, two or more CFD phases may be employed and/or two or more CVD phases may be employed. For example, an initial portion of the film may be deposited by CFD, followed by an intermediate portion of the film being deposited by CVD, and a final portion of the film deposited by CFD. In such examples, it may be desirable to modify the CVD portion of the film, as by plasma treatment or etching, prior to depositing the later portion of the film by CFD.

A transition phase may be employed between the CFD and CVD phases. The conditions employed during such transition phase different from those employed in either the CFD or the CVD phases. Typically, though not necessarily, the conditions permit simultaneous CFD surface reactions and CVD type gas phase reaction. The transition phase typically involves exposure to a plasma, which may be pulsed for example. Further, the transition phase may involve delivery of one or more reactants a low flow rate, i.e., a rate that is significantly lower than that employed in the corresponding CFD phase of the process.

Feature 6 (Deposit by CFD, Etch, and then Further Deposit by CFD)

In such examples, CFD deposition is performed for one or more cycles (typically a number of cycles) and then the resulting film is etched to remove, for example, some excess film at or near a recess entrance (a cusp), followed by further cycles of CFD deposition. Other examples of structural features in the deposited film that may be etched in a similar manner. The etchant chosen for this process will depend on the material to be etched. In some cases, the etch operation may be performed with a fluorine containing etchant (e.g., NF3) or hydrogen.

In certain examples, a remote plasma is employed to produce the etchant. Generally, a remote plasma etches in a more isotropic fashion than a direct plasma. A remote plasma generally provides a relatively high fraction of radicals to the substrate. The reactivity of these radicals may vary with the vertical position within the recess. At the top of the feature, the radicals are more concentrated and consequently will etch at a higher rate, while further down the recess and at the bottom, some radicals will have been lost and therefore they will etch at a lower rate. This is of course a desirable reactivity profile for addressing the problem of too much deposition occurring at the recess opening. An additional benefit of using a remote plasma in etching is that the plasma is relatively gentle and hence unlikely to damage the substrate layer. This can be particularly beneficial when the underlying substrate layer is sensitive to oxidation or other damage.

Feature 7 (Tailoring the Film Composition with Additional Reactant)

Many of the examples presented herein concern CFD processes employing one or two reactants. Further, many of the examples employ the same reactants in every CFD cycle. However, this need not be the case. First, many CFD processes may employ three or more reactants. Examples include (i) CFD of tungsten using as reactants diborane, tungsten hexafluoride, and hydrogen, and (ii) CFD of silicon oxide using as reactants diborane, BTBAS, and oxygen. The diborane can be removed from the growing film or it can be incorporated into the film if appropriate.

Further, some examples may employ additional reactants in only some CFD cycles. In such examples, a basic CFD process cycle employs only the reactants to create the base film composition (e.g., silicon oxide or silicon carbide). This basic process is performed in all or nearly all CFD cycles. However, some of the CFD cycles are executed as variant cycles and they deviate from the conditions of the normal deposition cycles. For example, they may employ one or more additional reactants. These variant cycles may also employ the same reactants employed in the basic CFD process, although this need not be the case.

Such CFD processes are particularly beneficial in preparing doped oxides or other doped materials as CFD films. In some implementations, dopant precursors are included as the "additional" reactant in only a small fraction of the CFD cycles. The frequency of adding the dopant is dictated by the desired concentration of dopant. For example, the dopant precursor may be included in every 10th cycle of the base material deposition.

Unlike many other deposition processes, particularly those requiring thermal activation, the CFD process may be conducted at a relatively low temperature. Generally, the CFD temperature will be between about 20 and 400° C. In some cases, temperatures between 400-480° C. are preferred. Such temperature may be chosen to permit deposition in the context of a temperature sensitive process such as deposition on a photoresist core. In a specific example, a temperature of between about 20 and 100° C. is used for double patterning applications (using, e.g., photoresist cores). In another example, a temperature of between about 200 and 350° C. is employed for memory fabrication processing.

As suggested above, CFD is well suited for depositing films in advanced technology nodes. Thus, for example, CFD processing may be integrated in processes at the 32 nm node, the 22 nm node, the 16 nm node, the 11 nm node, and beyond any of these. These nodes are described in the International Technology Roadmap for Semiconductors (ITRS), the industry consensus on microelectronic technology requirements for many years. Generally they reference one-half pitch of a memory cell. In a specific example, the CFD processing is applied to "2×" devices (having device features in the realm of 20-29 nm) and beyond.

While most examples of CFD films presented herein concern silicon based microelectronic devices, the films may also find application in other areas. Microelectronics or optoelectronics using non-silicon semiconductors such as GaAs and other III-V semiconductors, as well as II-VI materials such as HgCdTe may profit from using the CFD processes disclosed herein. Applications for conformal dielectric films in the solar energy field, such as photovoltaic devices, in the electrochromics field, and other fields are possible.

FIG. 1 schematically shows a timing diagram 100 for an example of a plasma-activated CFD process. Two full CFD cycles are depicted. As shown, each includes an exposure to reactant A phase 120, directly followed by an exposure to reactant B phase 140, a sweep of reactant B phase 160, and finally a plasma activation phase 180. Plasma energy provided during plasma activation phases 180A and 180B activates a reaction between surface adsorbed reactant species A and B. In the depicted examples, no sweep phase is performed after one reactant (reactant A) is delivered. In fact, this reactant flows continuously during the film deposition process. Thus, plasma is ignited while reactant A is in the gas phase. Features 1-3 above are embodied in the example of FIG. 1.

In the depicted example, reactant gases A and B may coexist in the gas phase without reacting. Accordingly, one or more of the process steps described in the ALD process may be shortened or eliminated in this example CFD process. For example, sweep steps after A Exposure Phases 120A and 120B may be eliminated.

The CFD process may be employed to deposit any of a number of different types of film. While most of the examples presented herein, concern dielectric materials, the disclosed CFD processes may be employed to form films of conductive and semiconductor materials as well. Nitrides and oxides are featured dielectric materials, but carbides, oxynitrides, carbon-doped oxides, borides, etc. may also be formed. Oxides include a wide range of materials including undoped silicate glass (USG), doped silicate glass. Examples of doped glasses included boron doped silicate glass (BSG), phosphorus doped silicate glass (PSG), and boron phosphorus doped silicate glass (BPSG).

In some examples, a silicon nitride film may be formed by reaction of a silicon-containing reactant and one or more of a nitrogen-containing reactant and/or a nitrogen-containing reactant blend. Example silicon-containing reactants include, but are not limited to, bis(tertiarybutylamino)silane ($SiH_2(NHC(CH_3)_3)_2$ or BTBAS), dichlorosilane ($SiH_2Cl_2$), and chlorosilane ($SiH_3Cl$). Example nitrogen-containing reactants include, but are not limited to, ammonia, nitrogen, and tert-butyl amine (($CH_3)_3CNH_2$ or t-butyl amine). An example nitrogen-containing reactant blend, includes, but is not limited to, a blend of nitrogen and hydrogen.

Selection of one or more reactants may be driven by various film and/or hardware considerations. For example, in some examples, a silicon nitride film may be formed from reaction of dichlorosilane and plasma-activated nitrogen. Chemisorption of dichlorosilane to a silicon nitride surface may create a silicon-hydrogen terminated surface, liberating hydrogen chloride (HCl). An example of this chemisorption reaction is schematically depicted in Reaction 1.

Reaction 1:

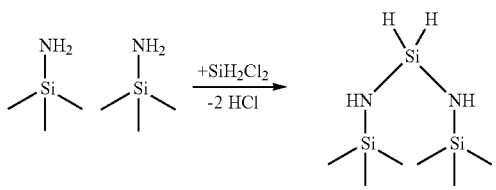

The cyclic intermediate shown in Reaction 1 may then be transformed into a silicon amine terminated surface via reaction with plasma-activated nitrogen.

However, some molecules of dichlorosilane may chemisorb by alternative mechanisms. For example, surface morphology may hinder the formation of the cyclic intermediate depicted in Reaction 1. An example of another chemisorption mechanism is shown schematically in Reaction 2.

Reaction 2:

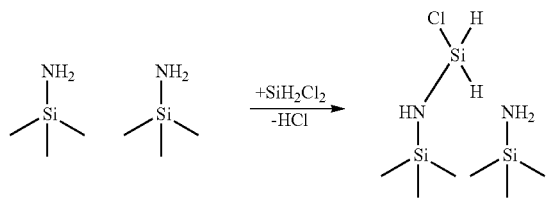

During subsequent plasma activation of nitrogen, the remaining chlorine atom of the intermediate species shown in Reaction 2 may be liberated and may become activated by the plasma. This may cause etching of the silicon nitride surface, potentially causing the silicon nitride film to become rough or hazy. Further, the residual chlorine atom may readsorb, physically and/or chemically, potentially contaminating the deposited film. This contamination may alter physical and/or electrical properties of the silicon nitride film. Further still, the activated chlorine atom may cause etch damage to portions of the process station hardware, potentially reducing the service life of portions of the process station.

Thus, in some examples, chlorosilane may be substituted for dichlorosilane. This may reduce film contamination, film damage, and/or process station damage. An example of the chemisorption of chlorosilane is schematically shown in Reaction 3.

Reaction 3:

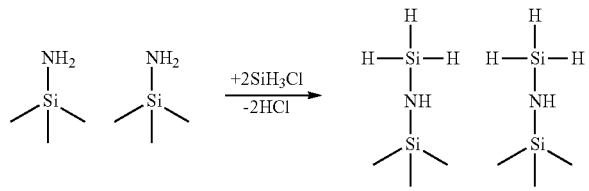

While the example depicted in Reaction 3 uses chlorosilane as the silicon-containing reactant, it will be appreciated that any suitable mono-substituted halosilane may be used.

As explained above, the depicted intermediate structures may react with a nitrogen source to form a silicon amine terminated surface of silicon nitride. For example, ammonia may be activated by a plasma, forming various ammonia radical species. The radical species react with the intermediate, forming the silicon amine terminated surface.

However, ammonia may physisorb strongly to surfaces of the reactant delivery lines, process station, and exhaust plumbing, which may lead to extended purge and evacuation times. Further, ammonia may have a high reactivity with some gas phase silicon-containing reactants. For example gas-phase mixtures of dichlorosilane ($SiH_2Cl_2$) and ammonia may create unstable species such as diaminosilane ($SiH_2(NH_2)_2$). Such species may decompose in the gas phase, nucleating small particles. Small particles may also be formed if ammonia reacts with hydrogen chloride generated during chemisorption of a halosilane. Such particles may accumulate in the process station where they may contaminate substrate surfaces, potentially leading to integrated device defects, and where they may contaminate process station hardware, potentially leading to tool down time and cleaning. The small particles may also accumulate in exhaust plumbing, may clog pumps and blowers, and may create a need for special environmental exhaust scrubbers and/or cold traps.

Thus, in some examples, a substituted amine may be used as a nitrogen-containing reactant. For example, various radicals formed from plasma activation of an alkyl substituted amine, such as t-butyl amine, may be supplied to the process station. Substituted amines such as t-butyl amine may have a lower sticking coefficient on process hardware than ammonia, which may result in comparatively lower phyisorbption rates and comparatively lower process purge time.

Further, such nitrogen-containing reactants may form halogenated salts that are comparatively more volatile than ammonium chloride. For example, t-butylammonium chloride may be more volatile than ammonium chloride. This may reduce tool down time, device defect creation, and environmental abatement expense.

Further still, such nitrogen-containing reactants may form other amine precursors via various byproduct reactions. For example, the reaction of t-butyl amine with dichlorosilane may form BTBAS. Thus, the side products may provide alternate routes to form silicon nitride, potentially increasing film yield. In another example, substituted amines may provide low temperature thermally activated routes to silicon nitride films. For example, t-butyl amine decomposes thermally at temperatures above 300° C. to form isobutylene and ammonia.

While the illustrative example provided above describes silicon nitride film formation using t-butyl amine, it will be appreciated that any suitable substituted amine may be employed within the scope of the present disclosure. Suitable substituted amines may be selected, in some examples, based on thermodynamic characteristics and/or reactivity characteristics of the reactant. For example, the relative volatility of halogenated salts formed from the reactant may be considered, as well as the existence and selectivity of various thermal decomposition paths at relevant temperatures.

Further, while the examples provided above describe the deposition of silicon nitride films, it will be appreciated that the principles discussed above apply generally to the deposition of other films. For example, some examples may use suitable halosilanes in combination with a suitable oxygen-containing reactant species, such as an oxygen plasma, to deposit silicon oxides.

A non-limiting list of reactants, product films, and film and process property ranges are provided in Table 1.

TABLE 1

| Film | Reactant A | Reactant B | Reactant C | Temp. (C.) | Press. (torr) | Ref. index |
|---|---|---|---|---|---|---|
| $SiO_2$ | BTBAS | $O_2$ | — | 50-400 | 1-4 | 1.45-1.47 |
| SiN | $SiH_3Cl$ | $O_2$ | — | 50-400 | 1-4 | |
| $SiO_2$ | $SiH(N(CH_3)_2)_3$ | $O_2$ | — | 50-400 | 1-4 | 1.45-1.47 |
| SiN | BTBAS | $NH_3$ | — | 50-400 | 1-4 | 1.80-2.05 |
| SiN | BTBAS | — | $N_2/H_2$ | 50-400 | 1-4 | 1.80-2.05 |
| SiN | BTBAS | $NH_3$ | $N_2/H_2$ | 50-400 | 1-4 | 1.80-2.05 |
| SiN | $SiH_3Cl$ | $NH_3$ | Optionally $N_2/H_2$ | 50-400 | 1-4 | |
| SiN | $SiH_3Cl$ | t-butyl amine | Optionally $N_2/H_2$ | | | |
| SiN | $SiH_2Cl_2$ | $NH_3$ | Optionally $N_2/H_2$ | 50-400 | 1-4 | 1.80-2.05 |
| SiN | $SiH_2Cl_2$ | t-butyl amine | Optionally $N_2/H_2$ | | | |
| SiN | $SiH(CH_3)—(N(CH_3)_2)_2$ | $NH_3$ | Optionally $N_2/H_2$ | 50-400 | 1-4 | 1.80-2.05 |
| SiN | $SiH(CH_3)(Cl_2)$ | $NH_3$ | Optionally $N_2/H_2$ | 50-400 | 1-4 | 1.80-2.05 |
| SiN | $SiHCl—(N(CH_3)_2)_2$ | $NH_3$ | Optionally $N_2/H_2$ | 50-400 | 1-4 | 1.80-2.05 |
| SiN | $(Si(CH_3)_2NH)_3$ | $NH_3$ | Optionally $N_2/H_2$ | 50-400 | 1-4 | 1.80-2.05 |

FIG. 1 also shows an example of a temporal progression of example CFD process phases for various CFD process parameters. FIG. 1 depicts two example deposition cycles 110A and 110B, though it will be appreciated that any suitable number of deposition cycles may be included in a CFD process to deposit a desired film thickness. Example CFD process parameters include, but are not limited to, flow rates for inert and reactant species, plasma power and frequency, substrate temperature, and process station pressure. Non-limiting parameter ranges for an example silicon dioxide deposition cycle using BTBAS and oxygen are provided in Table 2.

TABLE 2

| Phase | Reactant A exposure phase | Reactant B exposure phase | Sweep phase | Plasma activation phase |
|---|---|---|---|---|
| Time (sec) | continuing | 0.25-10 | 0.25-10 | 0.25-10 |
| BTBAS (sccm) | n/a | 0.5-5.0 | 0 | 0 |
| $O_2$ (slm) | 1-20 | 1-20 | 1-20 | 1-20 |
| Ar (slm) | 1-20 | 1-20 | 1-20 | 1-20 |
| Pressure (torr) | 1-4 | 1-4 | 1-4 | 1-4 |
| Temp (C.) | 50-400 | 50-400 | 50-400 | 0-400 |
| HF Power (W) | 0 | 0 | 0 | 50-2500 |
| LF Power (W) | 0 | 0 | 0 | 0-2500 |

A CFD cycle typically contains an exposure phase for each reactant. During this "exposure phase," a reactant is delivered to a process chamber to cause adsorption of the reactant on the substrate surface. Typically, at the beginning of an exposure phase, the substrate surface does not have any appreciable amount of the reactant adsorbed. In FIG. 1, at reactant A exposure phases 120A and B, reactant A is supplied at a controlled flow rate to a process station to saturate exposed surfaces of a substrate. Reactant A may be any suitable deposition reactant; e.g., a principal reactant or an auxiliary reactant. In one example where CFD produces a silicon dioxide film, reactant A may be oxygen. In the example shown in FIG. 1, reactant A flows continuously throughout deposition cycles 110A and 110B. Unlike a typical ALD process, where film precursor exposures are separated to prevent gas phase reaction, reactants A and B are allowed to mingle in the gas phase of some examples of a CFD process. As indicated above, in some examples reactants A and B are chosen so that they can co-existence in the gas phase without appreciably reacting with one another under conditions encountered in the reactor prior to application of plasma energy or the activation of the surface reaction. In some cases, the reactants are chosen such that (1) a reaction between them is thermodynamically favorable (i.e., Gibb's free energy <0) and (2) the reaction has a sufficiently high activation energy that there is negligible reaction at the desired deposition temperature. Various reactant combinations meeting these criteria are identified at other locations in this disclosure. Many such combinations include a primary reactant, which contributes an element that is solid at room temperature, and an auxiliary reactant, which does not. Examples of auxiliary reactants used in some combinations include oxygen, nitrogen, alkyl amines, and hydrogen.

Continuously supplying reactant A to the process station may reduce or eliminate a reactant A flow rate turn-on and stabilization time compared to an ALD process where reactant A is first turned on, then stabilized and exposed to the substrate, then turned off, and finally removed from a reactor. While the example shown in FIG. 1 depicts reactant A exposure phases 120A and B as having a constant flow rate, it will be appreciated that any suitable flow of reactant A, including a variable flow, may be employed within the scope of the present disclosure. Further, while FIG. 1 shows reactant A having a constant flow rate during the entire CFD cycle (deposition cycle 110A), this need not be the case. For example, the flow rate of reactant A may decrease during B exposure phases 140A and 140B. This may increase the partial pressure of B and thereby increase the driving force of reactant B adsorbing on the substrate surface.

In some examples, reactant A exposure phase 120A may have a duration that exceeds a substrate surface saturation time for reactant A. For example, the example of FIG. 1 includes a reactant A post-saturation exposure time 130 in reactant A exposure phase 120A. Optionally, reactant A exposure phase 120A includes a controlled flow rate of an inert gas. Example inert gases include, but are not limited to, nitrogen, argon, and helium. The inert gas may be provided to assist with pressure and/or temperature control of the process station, evaporation of a liquid precursor, more rapid delivery of the precursor and/or as a sweep gas for removing process gases from the process station and/or process station plumbing.

At Reactant B exposure phase 140A of the example shown in FIG. 1, reactant B is supplied at a controlled flow rate to the process station to saturate the exposed substrate surface. In one example silicon dioxide film, reactant B may be BTBAS. While the example of FIG. 1 depicts reactant B exposure phase 140A as having a constant flow rate, it will be appreciated that any suitable flow of reactant B, including a variable flow, may be employed within the scope of the present disclosure. Further, it will be appreciated that reactant B exposure phase 140A may have any suitable duration. In some examples, reactant B exposure phase 140A may have a duration exceeding a substrate surface saturation time for reactant B. For example, the example shown in FIG. 1 depicts a reactant B post-saturation exposure time 150 included in reactant B exposure phase 140A. Optionally, reactant B exposure phase 140A may include a controlled flow of a suitable inert gas, which, as described above, may assist with pressure and/or temperature control of the process station, evaporation of a liquid precursor, more rapid delivery of the precursor and may prevent back-diffusion of process station gases. In the example shown in FIG. 11, an inert gas is continually supplied to the process station throughout reactant B exposure phase 140A.

In some examples, plasma activation of deposition reactions may result in lower deposition temperatures than in thermally-activated reactions, potentially reducing consumption of the available thermal budget of an integrated process. For example, in some examples, a plasma activated CFD process may occur at room temperature.

While the CFD process example depicted in FIG. 1 is plasma activated, it will be appreciated that other non-thermal energy sources may be used within the scope of the present disclosure. Non-limiting examples of non-thermal energy sources include, but are not limited to, ultraviolet lamps, downstream or remote plasma sources, inductively-coupled plasmas, and microwave surface wave plasmas.

Further, while many examples discussed herein include two reactants (A and B), it will be appreciated that any suitable number of reactants may be employed within the scope of the present disclosure. In some examples, a single reactant and an inert gas used to supply plasma energy for a surface decomposition reaction of the reactant may be used. Alternatively, as discussed above in the context of feature 7, some examples may use three or more reactants to deposit a film.

In some scenarios, surface adsorbed B species may exist as discontinuous islands on the substrate surface, making it difficult to achieve surface saturation of reactant B. Various surface conditions may delay nucleation and saturation of reactant B on the substrate surface. For example, ligands released on adsorption of reactants A and/or B may block some surface active sites, preventing further adsorption of reactant B. Accordingly, in some examples, continuous adlayers of reactant B may be provided by modulating a flow of and/or discretely pulsing reactant B into the process station during reactant B exposure phase 140A. This may provide extra time for surface adsorption and desorption processes while conserving reactant B compared to a constant flow scenario.

Figure 2:
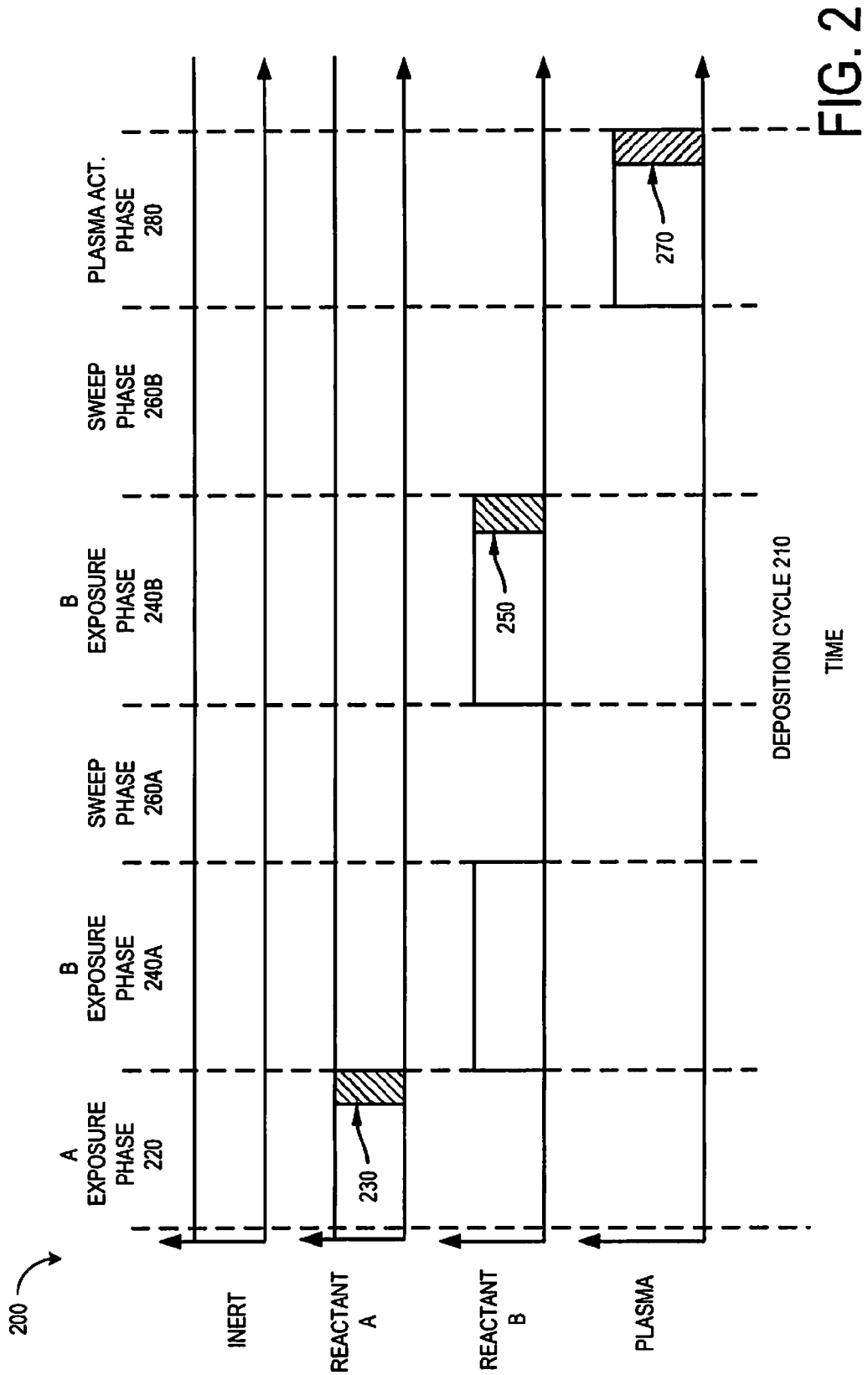
FIG. 2 schematically shows a timing diagram for another example CFD process according to an example of the present disclosure.

Additionally or alternatively, in some examples, one or more sweep phases may be included between consecutive exposures of reactant B. For example, the example of FIG. 2 schematically shows an example CFD process timing diagram 200 for a deposition cycle 210. At reactant B exposure phase 240A, reactant B is exposed to the substrate surface. Subsequently, at sweep phase 260A, reactant B is turned off, and gas phase species of reactant B are removed from the process station. In one scenario, gas phase reactant B may be displaced by a continuous flow of reactant A and/or the inert gas. In another scenario, gas phase reactant B may be removed by evacuating the process station. Removal of gas phase reactant B may shift an adsorption/desorption process equilibrium, desorbing ligands, promoting surface rearrangement of adsorbed reactant B to merge discontinuous islands of adsorbed reactant B. At reactant B exposure phase 240B, reactant B is again exposed to the substrate surface. While the example shown in FIG. 2 include one instance of a reactant B sweep and exposure cycle, it will be appreciated that any suitable number of iterations of alternating sweep and exposure cycles may be employed within the scope of the present disclosure.

Returning to the example of FIG. 1, prior to activation by the plasma at phase 180A, gas phase reactant B may be removed from the process station in sweep phase 160A in some examples. A CFD cycle may include one or more sweep phases in addition to the above-described exposure phases. Sweeping the process station may avoid gas phase reactions where reactant B is susceptible to plasma activation. Further, sweeping the process station may remove surface adsorbed ligands that may otherwise remain and contaminate the film. Examples sweep gases include, but are not limited to, argon, helium, and nitrogen. In the example shown in FIG. 1, sweep gas for sweep phase 160A is supplied by the inert gas stream. In some examples, sweep phase 160A may include one or more evacuation subphases for evacuating the process station. Alternatively, it will be appreciated that sweep phase 160A may be omitted in some examples.

Sweep phase 160A may have any suitable duration. In some examples, increasing a flow rate of a one or more sweep gases may decrease the duration of sweep phase 160A. For example, a sweep gas flow rate may be adjusted according to various reactant thermodynamic characteristics and/or geometric characteristics of the process station and/or process station plumbing for modifying the duration of sweep phase 160A. In one non-limiting example, the duration of a sweep phase may be optimized by adjustment of the sweep gas flow rate. This may reduce deposition cycle time, which may improve substrate throughput.

A CFD cycle, typically includes an "activation phase" in addition to the exposure and optional sweep phases described above. The activation phase serves to drive the reaction of the one or more reactants adsorbed on the substrate surface. At plasma activation phase 180A of the example shown in FIG. 1, plasma energy is provided to activate surface reactions between surface adsorbed reactants A and B. For example, the plasma may directly or indirectly activate gas phase molecules of reactant A to form reactant A radicals. These radicals may then interact with surface adsorbed reactant B, resulting in film-forming surface reactions. Plasma activation phase 180A concludes deposition cycle 110A, which in the example of FIG. 1 is followed by deposition cycle 110B, commencing with reactant A exposure phase 120B.

In some examples, the plasma ignited in plasma activation phase 180A may be formed directly above the substrate surface. This may provide a greater plasma density and enhanced surface reaction rate between reactants A and B. For example, plasmas for CFD processes may be generated by applying a radio frequency (RF) field to a low-pressure gas using two capacitively coupled plates. In alternative examples, a remotely generated plasma may be generated outside of the main reaction chamber.

Any suitable gas may be used to form the plasma. In a first example, and inert gas such as argon or helium or nitrogen may be used to form the plasma. In a second example, a reactant gas such as oxygen or ammonia may be used to form the plasma. In a third example, a sweep gas such as nitrogen may be used to form the plasma. Of course, combinations of these categories of gases may be employed. Ionization of the gas between the plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for CFD processes may be formed by one or more suitable methods other than capacitive coupling of an RF field to a gas.

Plasma activation phase 180A may have any suitable duration. In some examples, plasma activation phase 180A may have a duration that exceeds a time for plasma-activated radicals to interact with all exposed substrate surfaces and adsorbates, forming a continuous film atop the substrate surface. For example, the example shown in FIG. 1 includes a plasma post-saturation exposure time 190 in plasma activation phase 180A.

As explained more fully below, and as suggested in the discussion of feature 4 above, extending a plasma exposure time and/or providing a plurality of plasma exposure phases may provide a post-reaction treatment of bulk and/or near-surface portions of the deposited film. In one scenario, decreasing surface contamination by plasma treatment may prepare the surface for adsorption of reactant A. For example, a silicon nitride film formed from reaction of a silicon-containing reactant and a nitrogen-containing reactant may have a surface that resists adsorption of subsequent reactants. Treating the silicon nitride surface with a plasma may create hydrogen bonds for facilitating subsequent adsorption and reaction events.

In some examples, film properties, such as film stress, dielectric constant, refractive index, etch rate may be adjusted by varying plasma parameters, which will be discussed in more detail below. Table 3 provides an example list of various film properties for three example CFD silicon dioxide films deposited at 400 degrees Celsius. For reference purposes, Table 3 also includes film information for an example PECVD silicon dioxide film deposited at 400 degrees Celsius.

TABLE 3

| $SiO_2$ Process | Dep. rate (ang./cycle) | NU ((max-min)/average) | NU (1 σ) | Ref. Index | Film stress (MPa) | Di-electric constant | Wet etch rate ratio |
|---|---|---|---|---|---|---|---|
| 1 sec. 200 W $O_2$ plasma (HF only) | 0.9 | 5% | 2% | 1.456 | −165 | 6.6 | 7.87 |
| 10 sec. 1000 W $O_2$ plasma (HF only) | 0.6 | 5% | 2% | 1.466 | −138 | 3.9 | 1.59 |
| 10 sec. 1000 W $O_2$ plasma (HF/LF) | 0.6 | 12% | 5% | 1.472 | −264 | 3.9 | 1.55 |
| PECVD $SiO_2$ | 600 | 3% | 1% | 1.477 | −238 | 4.2 | 5.28 |

Figure 3:
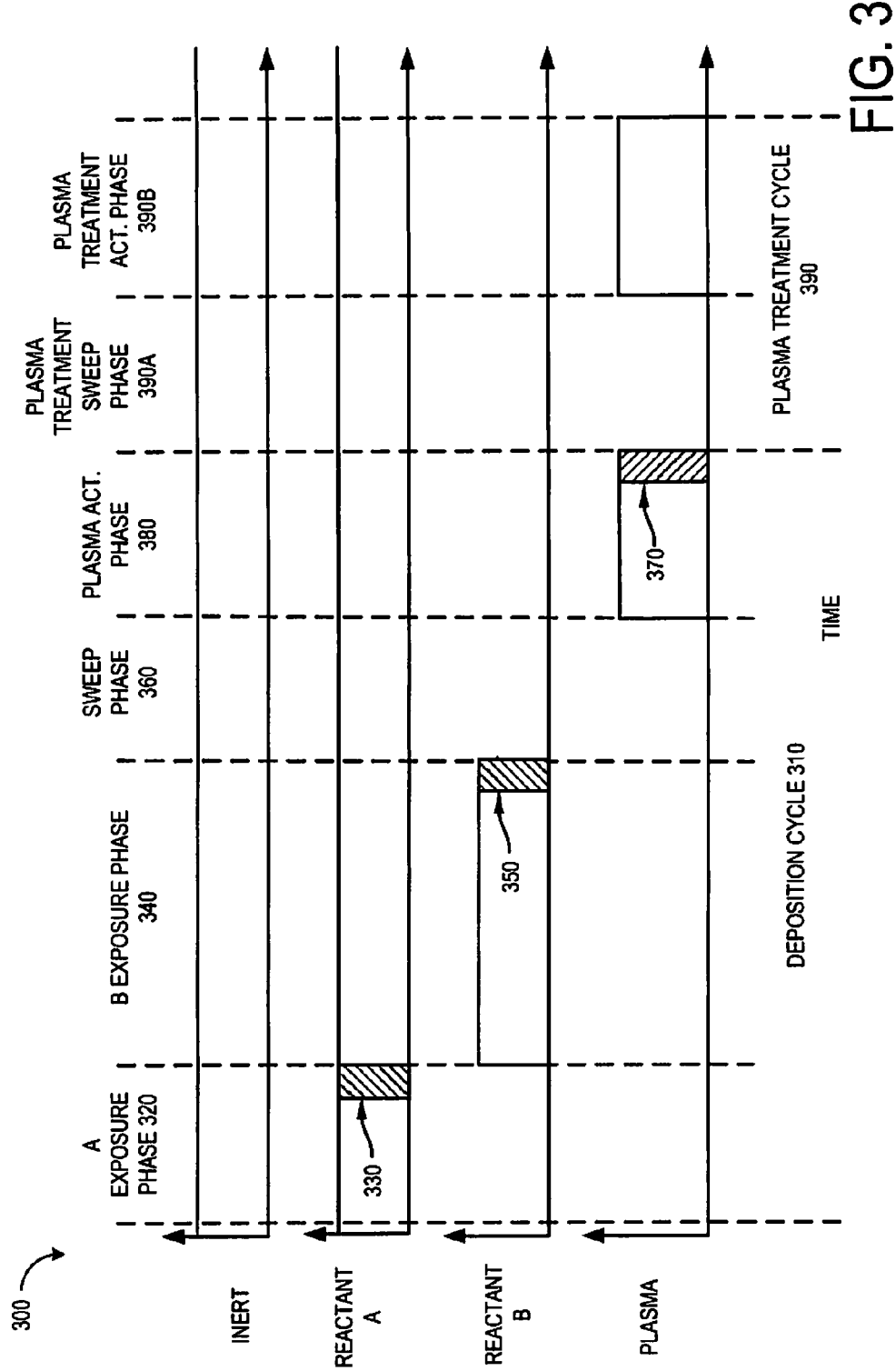
FIG. 3 schematically shows a timing diagram for another example CFD process according to an example of the present disclosure.

For example, FIG. 3 schematically shows an example of a CFD process timing diagram 300 including a deposition phase 310 followed by a plasma treatment phase 390. It will be appreciated that any suitable plasma may be used during a plasma treatment phase. In a first scenario, a first plasma gas may be used during activation in the deposition cycle and a second, different plasma gas may be used during a plasma treatment phase. In a second scenario, a second, different plasma gas may supplement a first plasma gas during the plasma treatment phase. Non-limiting parameter ranges for an example in-situ plasma treatment cycle are provided in Table 4.

TABLE 4

| Phase | Plasma treatment sweep phase | Plasma treatment activation phase |
|---|---|---|
| Time (sec) | 0.25-10.0 | 0.25-10.0 |
| Ar (sccm) | 1-20 | 1-20 |
| Pressure (torr) | 1-4 | 1-4 |
| Temp (C.) | 50-400 | 50-400 |
| HF Power (W) | 50-2500 | 50-2500 |
| LF Power (W) | 0-2500 | 0-2500 |

At plasma activation phase 380 shown in FIG. 3, the substrate surface is exposed to a plasma to activate a film deposition reaction. As depicted in the example shown in FIG. 3, the process station is provided with a continuous flow of reactant A, which may be, e.g., an auxiliary reactant such as oxygen, and an inert gas at plasma treatment sweep phase 390A. Sweeping the process station may remove volatile contaminants from the process station. While a sweep gas is shown in FIG. 3, it will be appreciated that any suitable reactant removal method may be used within the scope of the present disclosure. At plasma treatment activation phase 390B, a plasma is ignited to treat the bulk and/or near-surface region of the newly deposited film.

Figure 4:
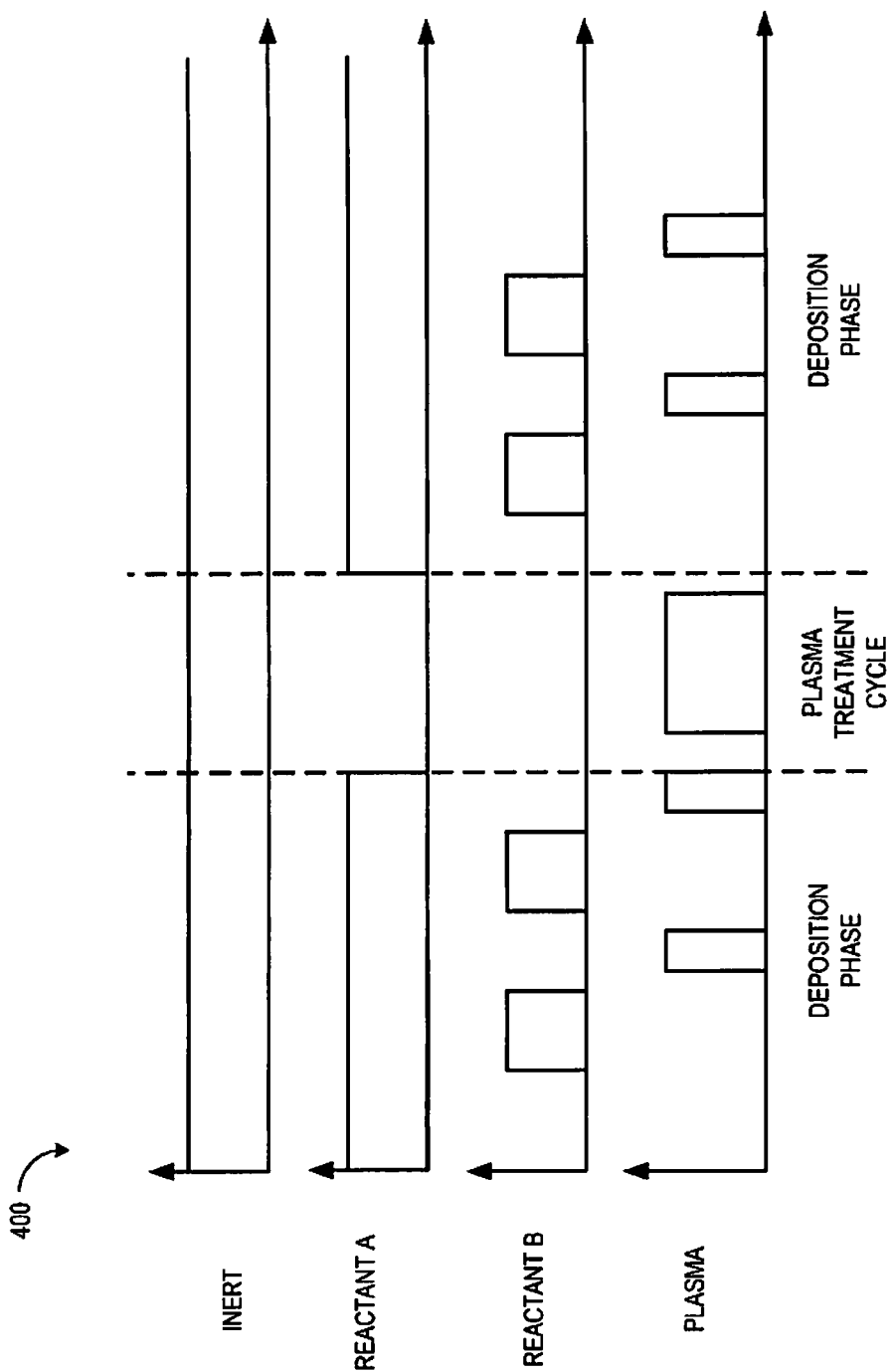
FIG. 4 schematically shows a timing diagram for an example CFD process including a plasma treatment cycle according to an example of the present disclosure.

While the example of FIG. 3 includes one instance of a CFD cycle including a plasma treatment phase, it will be appreciated that any suitable number of iterations may be employed within the scope of the present disclosure. Further, it will be appreciated that one or more plasma treatment cycles may be inserted at intervals (regular or otherwise) between normal deposition cycles. For example, FIG. 4 shows an example of a CFD process timing diagram 400 including a plasma treatment phase inserted between two deposition cycles. While the example of FIG. 4 includes a plasma treatment cycle inserted between two deposition cycles, it will be appreciated that any suitable number of deposition cycles may precede or follow one or more plasma treatment cycles. For example, in a scenario where a plasma treatment is used to alter a film density, a plasma treatment cycle may be inserted after every tenth deposition cycle. In a scenario where a plasma treatment is used to prepare a surface for adsorption and reaction events, a plasma treatment phase may be incorporated in every CFD cycle, e.g., after each CFD deposition phase.

Figure 5:
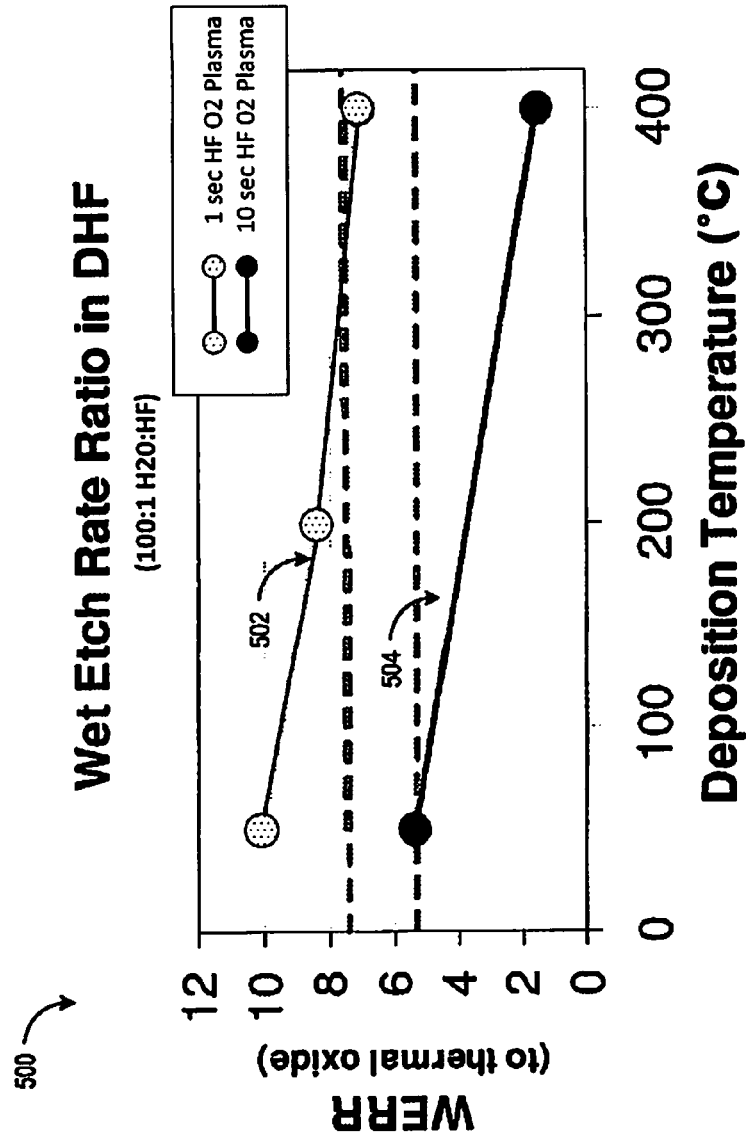
FIG. 5 shows an example correlation between a wet etch rate ratio and a deposition temperature for films deposited according to an example of the present disclosure.

Plasma treatment of the deposited film may alter one or more physical characteristics of the film. In one scenario, a plasma treatment may densify a newly deposited film. Densified films may be more etch-resistant than non-densified films. For example, FIG. 5 shows an example of a comparison 500 of etch rates for example CFD processed silicon dioxide films relative to thermally grown silicon dioxide films. The example film examples of FIG. 5 were deposited over a range of temperatures from 50 to 400 degrees Celsius by CFD processes 502 and 504. For reference, relative etch rates for undoped silicate glass (USG) and silicon dioxide spacer layers deposited by plasma-enhanced CVD processes are displayed in FIG. 5. Films produced by process 502, which included a one-second high-frequency oxygen plasma activation phase in each deposition cycle, were approximately one-half as resistant to a dilute hydrofluoric acid wet etch (100:1 H2O:HF) as films produced by process 504, which included a ten-second high-frequency oxygen plasma activation phase in each deposition cycle. Accordingly, it will be appreciated that varying one or more aspects of the plasma activation phase and/or including one or more plasma treatment cycles may vary an etch rate of a deposited film.

Figure 6:
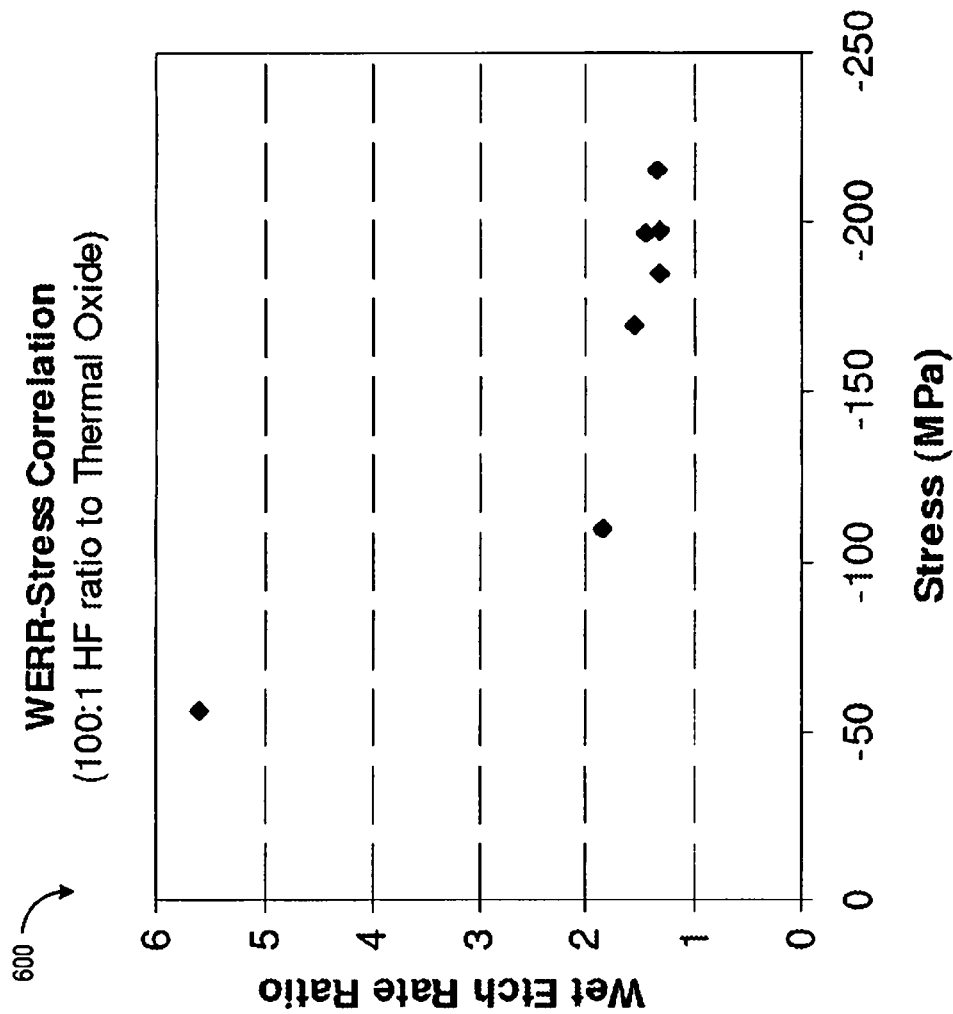
FIG. 6 shows an example correlation between a wet etch rate ratio and a film stress for films deposited according to an example the present disclosure.

In another scenario, plasma treatment of a film may vary the stress characteristics of the film. For example, FIG. 6 shows an example of a correlation 600 between wet etch rate ratio and film stress for example CFD silicon dioxide films. In the example shown in FIG. 6, decreases in the wet etch rate ratio by, for example, extending a plasma exposure time, may increase a compressive film stress.

Figure 7:
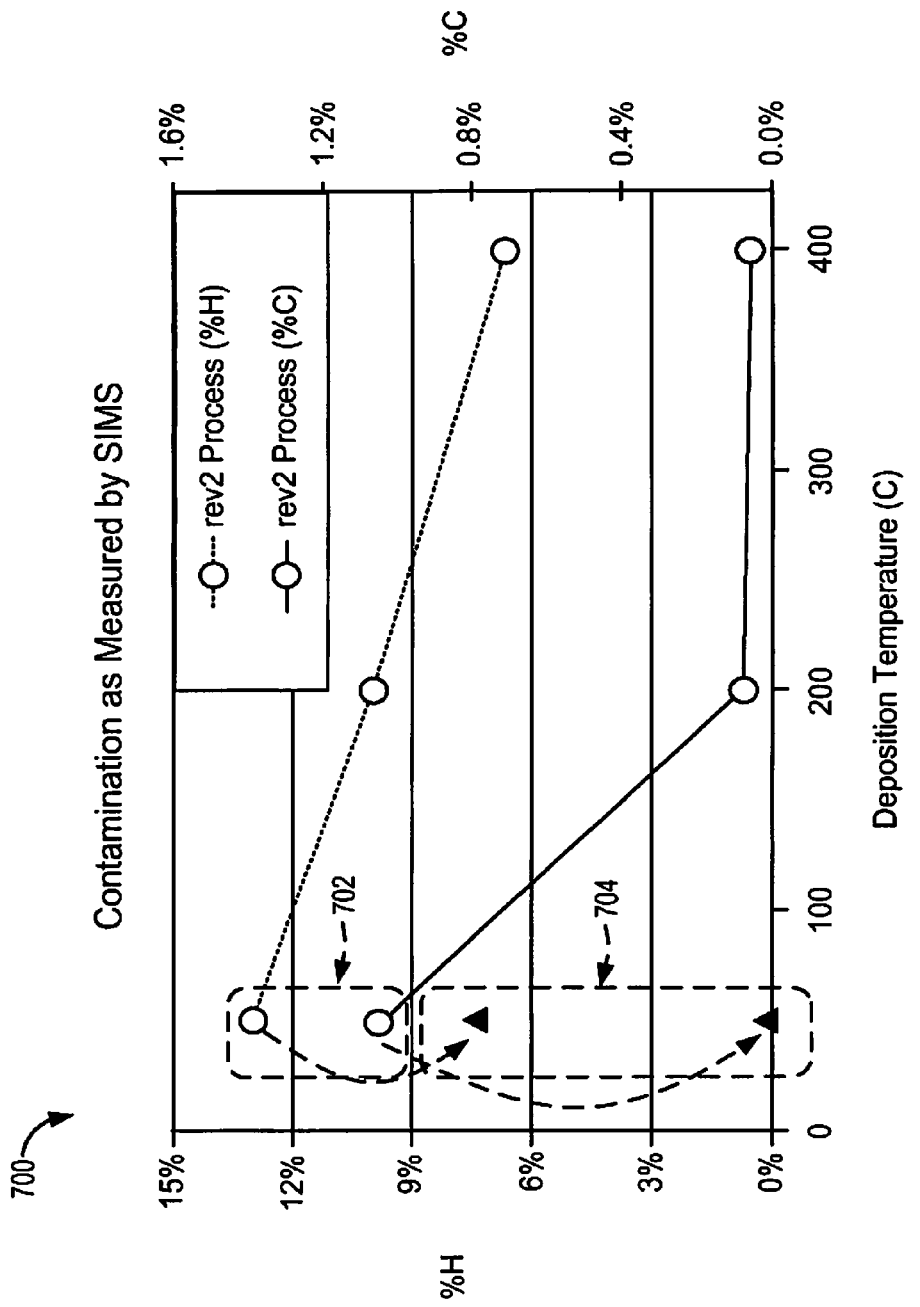
FIG. 7 shows an example correlation between film contaminant concentration and deposition temperature for films deposited according to an example of the present disclosure.

In another scenario, plasma treatment of a deposited film may provide transient differential removal of trace film contaminants (e.g., hydrogen, nitrogen and/or carbon in an example silicon dioxide film) relative to other film constituents (e.g., silicon and/or oxygen in an example silicon dioxide film). For example, FIG. 7 shows an example of a correlation 700 between deposition temperature, plasma exposure time, and film contaminant concentrations. In the example shown in FIG. 7, a CFD silicon dioxide film 704 deposited at 50 degrees Celsius and having a ten-second oxygen plasma activation phase exhibits lower concentrations of hydrogen and carbon than a CFD silicon dioxide film 702 deposited at the same temperature but having a one-second oxygen plasma activation phase. Modifying contaminant concentrations in a film may modify electrical and/or physical properties of the film. For example, modulating carbon and/or hydrogen content may modulate a film dielectric constant and/or a film etch rate. Accordingly, it will be appreciated that varying one or more aspects of the plasma activation phase and/or including one or more plasma treatment cycles may provide an approach for varying film composition.

While the plasma treatment discussed above relates to an oxygen plasma treatment, it will be appreciated that any suitable plasma treatment may be employed without departing from the scope of the present example. For example, in some examples a substituted amine may be employed as a nitrogen-containing reactant in a suitable CFD process in place of $NH_3$. Although replacement of $NH_3$ with a substituted amine (e.g., an alkyl amine like t-butyl amine) for conformal SiN deposition may provide a number of benefits, in some instances, the deposited film may include carbon residue originating from the alkyl amine reactant (e.g., carbon residue from the three methyl groups included in each t-butyl amine molecule ($NH_2$—$(CH_3)_3$)). This in-film carbon may result in electrical leakage and may render the film unusable for some dielectric barrier applications.

Thus, in some examples, igniting a hydrogen plasma during SiN film deposition may reduce carbon residue in the SiN film, which may comparatively improve the insulating character of the film. In some examples, the reduction in carbon residue may be readily observable in FTIR spectra. For example, the SiN:C—H levels may be reduced from approximately 10% atomic to approximately 1% atomic.

Therefore, in some examples, a silicon nitride film may be deposited with a CFD process using an alkyl amine or a mixture of alkyl amines included in the nitrogen-containing reactant and one or more instances of a hydrogen plasma treatment. It will be appreciated that any suitable hydrogen plasma may be employed without departing from the scope of the present disclosure. Thus, in some examples, an admixture of $H_2$ with a gas such as He or Ar, or other H-containing gases, or active H atoms produced by a remote plasma source, may be used to treat the deposited film. Further, in some examples, the carbon content of the film may be tuned to any suitable concentration by varying one or more of the number of treatment pulses and their duration, the intensity of the treatment plasma, the substrate temperature, and the treatment gas composition.

While the hydrogen plasma treatment discussed above relates to a silicon nitride film, it will be appreciated that application of a suitable hydrogen plasma treatment may be used to adjust the carbon content of other CFD deposited films, including, but not limited to, SiOx, GeOx, and SiOxNy.

Certain examples disclosed herein pertain to ultraviolet treatment (with or without plasma treatment) of oxide CFD films. The treatment may mitigate defects in the oxide and improve electrical properties such as CV characteristics of a gate dielectric. Device and package applications employing CFD oxides that can benefit from such treatment include thru-silicon vias, logic technology employing gate oxides, shallow trench isolation (STI), thin thermal oxidation formed after STI-photoresist strip, sacrificial oxide (e.g., ~60 A) before a P-well implant, post "well" thermal oxide growth, gate/channel oxide, DRAM PMD PECVD Oxide.

In some cases, untreated CFD oxide films have been observed to have relatively poor electrical performance due to, it is believed, fixed charge in the as deposited film. For example, some films have been found to have significant within-wafer Vfb variations. Such problems have been resolved by using a post-deposition treatment with UV-radiation and/or a thermal anneal in the presence of hydrogen. It is believed that this process passivates and/or alleviates defects related to fixed charge at the (1) oxide to silicon interface or (2) within the deposited dielectric film or (3) at the air to oxide surface (surface charge). Using such treatment, the Vfb spread for as deposited oxide has been tightened from 8.3V to about 1.5V after UV cure.

While the these examples are primarily concerned with improving oxide films, the disclosed method may be applied generally to the growth of dielectrics, metals, metal to dielectric interface engineering. Specific dielectric materials include, for example, silicon oxides, including doped silicon oxides, silicon carbides, silicon oxycarbides, silicon nitrides, silicon oxynitrides, and ashable hard mask materials.

Examples of treatments that may be applied to improve dielectric properties include the following:

(A) Post deposition treatment of dielectric films synthesized by CFD with UV cure and then hydrogen-anneal. In the simplest example, UV treatment may be used alone to reduce fixed charge.

(B) Pre-treatment of the substrate prior to CFD-dielectric film deposition with treatments including: $H_2$-plasma, $N_2$-plasma, $N_2/H_2$-plasma, $NH_3$-plasma, Ar-plasma, He-plasma, He anneal, $H_2$-anneal, $NH_3$-anneal, and UV cure in the presence of He, $H_2$, Ar, $N_2$, $H_2/N_2$-forming gas, $NH_3$. Plasma processing may be enabled with various plasma generators including, though not limited to, microwave, ICP-remote, direct and the like.

(C) Concurrent treatment (curing during deposition) with treatments including: $H_2$-plasma, $N_2$-plasma, $N_2/H_2$-plasma, $NH_3$-plasma, Ar-plasma, He-plasma, He anneal, $H_2$-anneal, $NH_3$-anneal, and UV cure in the presence of He, $H_2$, Ar, $N_2$, $H_2/N_2$-forming gas, $NH_3$. Plasma processing may be implemented with various plasma generators including, though not limited to, microwave, ICP-remote, direct and others known to those in the art. Isotropic and directional processing may be applied including, though not limited to, remote plasma, UV exposure, direct plasma, and microwave plasma. An example method includes intermittent treatment of the film between groups of CFD cycles. A group of CFD cycles may vary from about 1 to 10000 cycles. A typical scenario includes: (1) 5 cycles of CFD oxide growth followed by (2) one or more film treatments with any of the methods described above (e.g., He-plasma, UV-treatment), followed by (3) 5 cycles of CFD oxide growth. This method may be used to grow a film of any desired thickness.

(D) UV treatment imparted as byproduct by any plasma listed above (e.g., a helium plasma emits UV radiation).

One example of a procedure for in situ "cure" during the CFD cycling involves the following operations:

(1) UV treatment via He-plasma
(2) BTBAS dose
(3) Purge
(4) O2/Ar—RF plasma activation
(5) Purge
(6) Repeat steps 1-5 to yield a film of desired thickness.

A range of UV cure conditions may be employed in any of the listed contexts. Generally, the pedestal temperature will be maintained between about 250 and 500 C during the cure. For many device fabrication applications, the upper temperature will be limited to 450 C or even 400 C. The ambient employed during the cure may be inert or reactive. Examples of gases that may be present during the cure include helium, argon, nitrogen, forming gas, and ammonia. The flow rate of such gases may be about 2 to 20,000 sccm, preferably about 4000 to 18,000 sccm. The power of the UV lamp may be, for example, about 2-10 kW, and preferably between about 3.5 and 7 kW. An appropriate duration of exposure to UV from such source is between about 20 and 200 seconds (e.g., about 90 seconds). Finally, the pressure may be held at a level between 0 Torr and about 40 Torr.

In a specific example, an effective treatment of CFD oxide was obtained using the following conditions:

1. Pedestal temperature=400 C
2. Ambient=He
3. Pressure=40 Torr He
4. Flow rate=10,000 sccm In some examples, a thermal anneal of the oxide is performed after the UV cure operation. In one example, the following conditions were used in the anneal:

1. Ped T=400 C
2. Ambient=H2+N2
3. Pressure=2.5 Torr
4. Flow rates=750 sccm H2; 3000 sccm N2

The physical and electrical characteristics of the deposited film may also be altered by adjusting other process parameters, such as deposition temperature. For example, correlation 700 of the example depicted in FIG. 7 also shows an example relationship between CFD film deposition temperature and film contaminants concentration. As film deposition temperature increases, incorporation of film contaminants decreases. In another example, the example shown in FIG. 5 illustrates that a wet etch rate ratio of example silicon dioxide CFD films decreases as deposition temperature increases, as described above. Other deposition parameters that may be adjusted to tune the film properties include RF power, RF frequency, pressure, and flow rates. Further, in some examples, film characteristics may be altered by altering a reactant selection. For example, a hydrogen content of a silicon dioxide film may be reduced by using tetra isocyanate silane (TICS) as a silicon-containing reactant and oxygen and/or nitrous oxide as an oxygen-containing reactant.

It will be appreciated that variation of physical and/or electrical film characteristics, like those discussed above, may provide opportunities to adjust device performance and yield, as well as opportunities to modify aspects of device manufacturing process integration. As one non-limiting example, the ability to tune etch rate characteristics of a CFD silicon dioxide film may make the film a candidate for etch stop, hard mask, and other process integration applications. Accordingly, various examples of CFD-produced films are provided herein for application throughout an integrated semiconductor device fabrication process.

In one scenario, a CFD process may deposit a conformal silicon dioxide film on a non-planar substrate. For example, a CFD silicon dioxide film may be used for gap fill of structures, such as a trench fill of shallow trench isolation (STI) structures. While the various examples described below relate to a gap fill application, it will be appreciated that this is merely a non-limiting, illustrative application, and that other suitable applications, utilizing other suitable film materials, may be within the scope of the present disclosure. Other applications for CFD silicon dioxide films include, but are not limited to, interlayer dielectric (ILD) applications, intermetal dielectric (IMD) applications, pre-metal dielectric (PMD) applications, dielectric liners for through-silicon via (TSV) applications, resistive RAM (ReRAM) applications, and/or stacked capacitor fabrication in DRAM applications.

Doped silicon oxide may be used as a diffusion source for boron, phosphorus, or even arsenic dopants. For example, a boron doped silicate glass (BSG), a phosphorus doped silicate glass (PSG), or even a boron phosphorus doped silicate glass (BPSG) could be used. Doped CFD layers can be employed to provide conformal doping in, for example, three-dimensional transistor structures such as multi-gate FinFET's and three-dimensional memory devices. Conventional ion implanters cannot easily dope sidewalls, especially in high aspect ratio structures. CFD doped oxides as diffusion sources have various advantages. First, they provide high conformality at low temperature. In comparison, low-pressure CVD produced doped TEOS (tetraethylorthosilicate) is known but requires deposition at high temperature, and sub-atmospheric CVD and PECVD doped oxide films are possible at lower temperature but have inadequate conformality. Conformality of doping is important, but so is conformality of the film itself, since the film typically is a sacrificial application and will then need to be removed. A non-conformal film typically faces more challenges in removal, i.e. some areas can be overetched. Additionally, CFD provides extremely well controlled doping concentration. As mentioned, a CFD process can provide from a few layers of undoped oxide followed by a single layer of doping. The level of doping can be tightly controlled by the frequency with which the doped layer is deposited and the conditions of the doping cycle. In certain examples, the doping cycle is controlled by for instance using a dopant source with significant steric hindrance. In addition to conventional silicon-based microelectronics, other applications of CFD doping include microelectronics and optoelectronics based on III-V semiconductors such as GaAs and II-VI semiconductors such as HgCdTe, photovoltaics, flat panel displays, and electrochromic technology.

Figure 8:
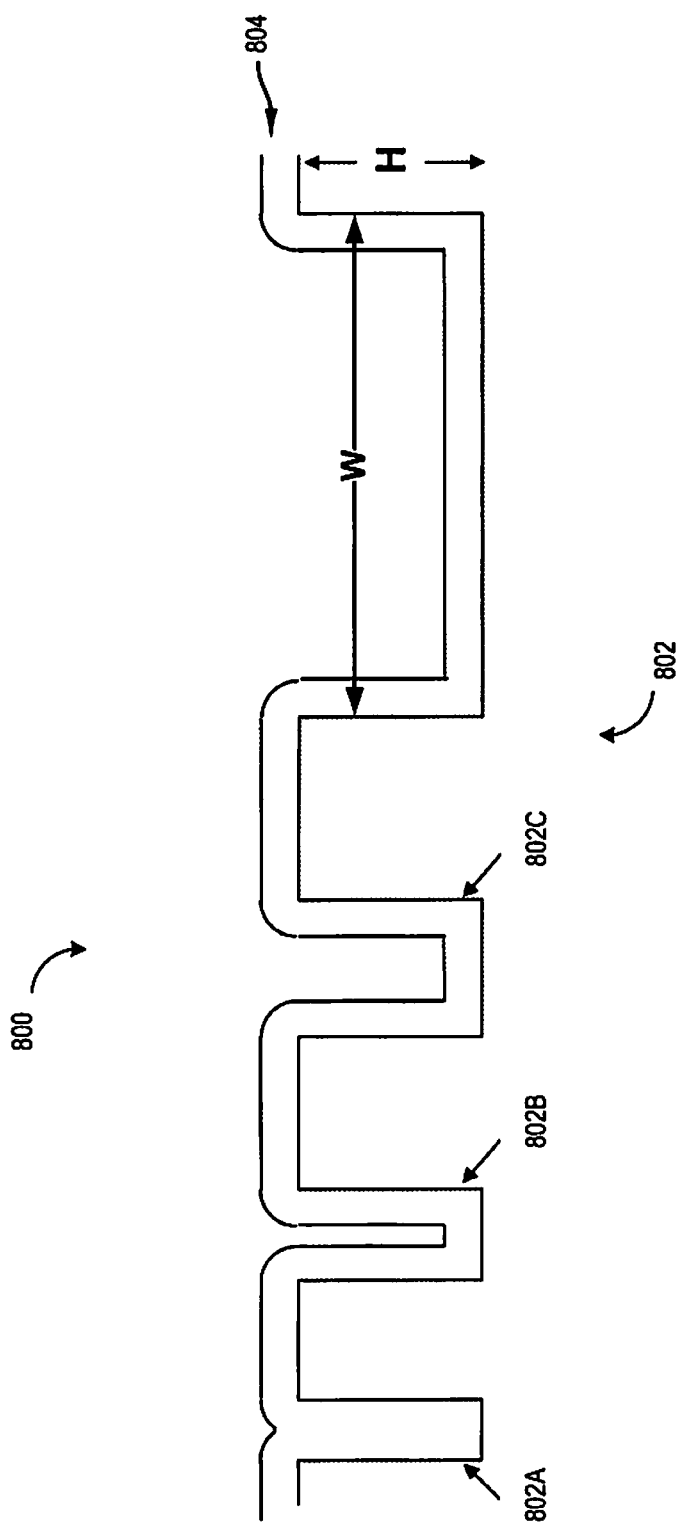
FIG. 8 schematically shows an example cross-section of a non-planar substrate comprising a plurality of gaps.

Some gap fill processes involve two film deposition steps performed on different deposition tools, requiring a vacuum break and air exposure between deposition processes. FIG. 8 schematically shows an example non-planar substrate 800 including a plurality of gaps 802. As depicted in FIG. 8, gaps 802 may have varying aspect ratios, which may be defined as a ratio of gap depth (H) to gap width (W) for each gap 802. For example, a logic area of an integrated semiconductor device may have varying gap aspect ratios corresponding to different logic device structures.

As depicted in FIG. 8, non-planar substrate 800 is covered by a thin, conformal film 804. While conformal film 804 has completely filled gap 802A, gaps 802B and 802C remain open. Closing gaps 802B and 802C with a conformal film may lead to extended process times. Thus, in some approaches, a thicker film may be deposited ex-situ by a higher deposition rate process, such as a CVD and/or PECVD method. However, ex-situ deposition of gap fill films may reduce wafer throughput in a production line. For example, substrate handling and transfer time between a deposition tools may reduce a number of substrate processing activities during a production period. This may diminish production line throughput and may require the installation and maintenance of additional process tools in the production line.

Figure 10:
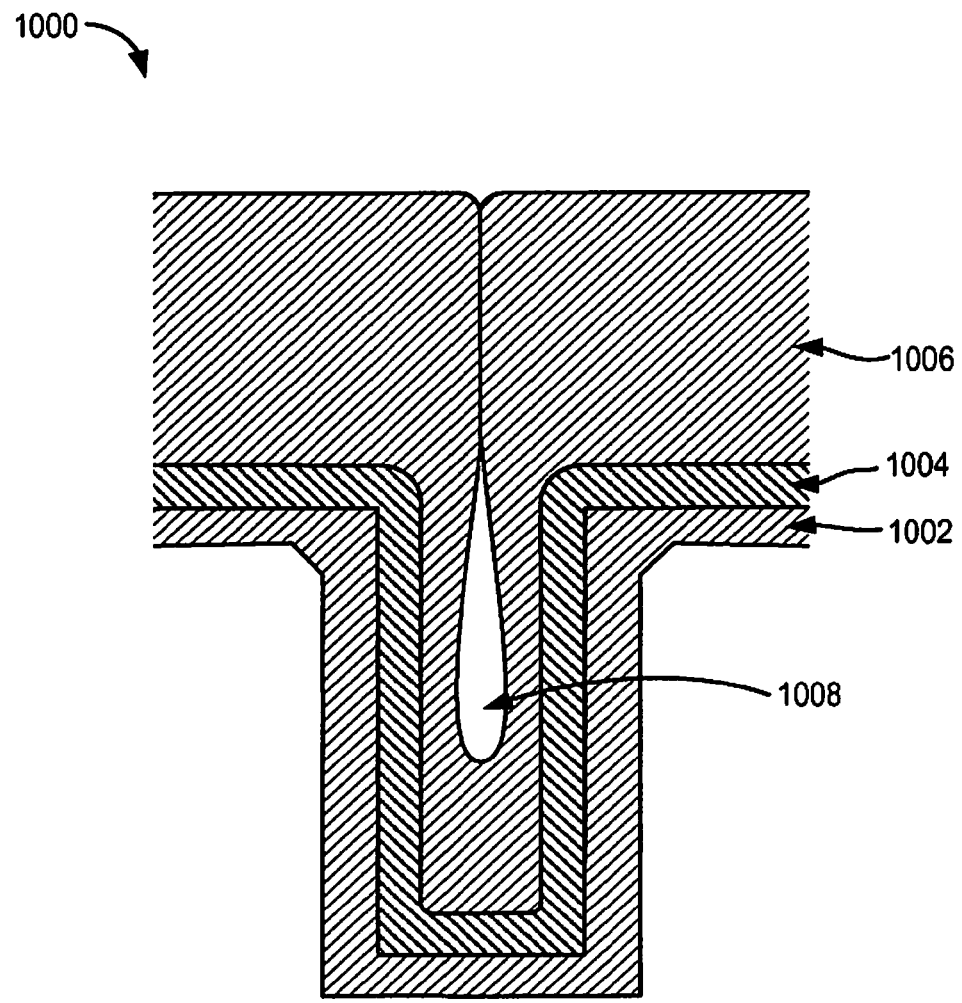
FIG. 10 schematically shows an example cross-section of a gap fill including a keyhole void.

Further, while gap 802C may have an aspect ratio suitable for a gas-phase deposition process, gap 802B may have an aspect ratio that may lead to incomplete filling by a higher deposition rate process and may form a keyhole void. For example, FIG. 10 shows an example high aspect ratio structure 1000 formed in substrate 1002. As depicted in FIG. 10, bread loafing effects during the deposition of thicker film 1006 have produced keyhole void 1008. Keyhole voids may be re-opened and filled with conductive films in subsequent processes, which may lead to device shorting.

Figure 9:
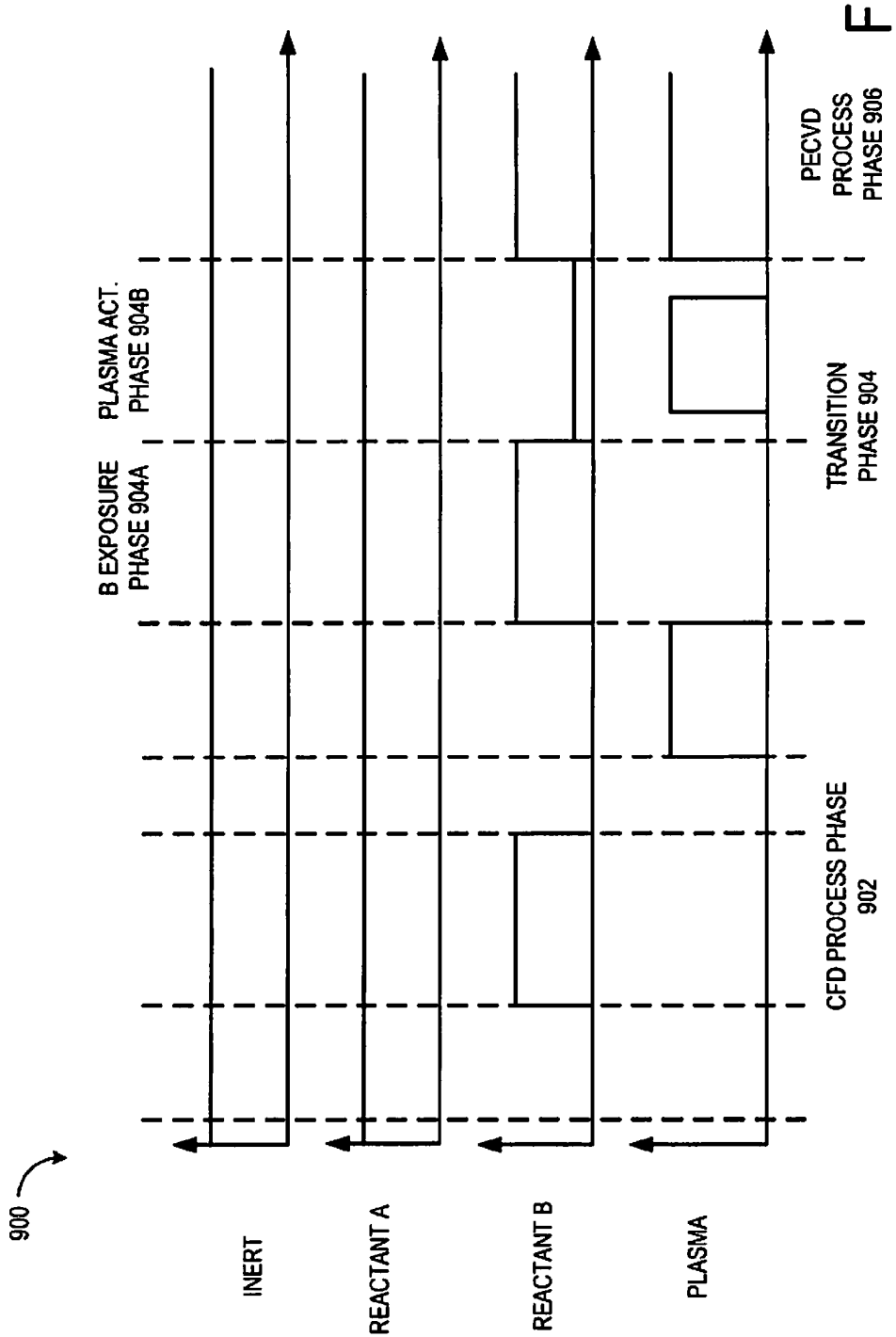
FIG. 9 schematically shows a timing diagram for an example CFD process including a transition to a PECVD process according to an example of the present disclosure.

Some approaches to addressing high aspect ratio gaps such as gap 802B include providing device design rules that avoid creation of such gaps. However, such design rules may require additional masking steps, may make device design difficult, and/or may lead to increased integrated semiconductor device area, which may increase manufacturing cost. Thus, in some examples, a CFD process may include an in-situ transition from a CFD process to a CVD and/or a PECVD process. For example, FIG. 9 shows an example of a CFD process timing diagram 900 that has been divided into three phases. CFD process phase 902 depicts an example CFD process cycle. For clarity, a single CFD process cycle is shown in the example depicted in FIG. 9, though it will be appreciated that any suitable number of CFD process cycles and plasma treatment cycles may be included in CFD process phase 902. A transition phase 904 follows CFD process phase 902. As depicted in the example of FIG. 9, transition phase 904 includes aspects of both a CFD process and a PECVD process. Specifically, reactant B is provided to the process station past the end of reactant B exposure phase 904A so that reactants A and B are both present in the gas phase during plasma activation phase 904B. This may provide PECVD-type gas phase reactions concurrently with CFD-type surface reactions. While transition phase 904 includes only one iteration of reactant B exposure phase 904A and plasma activation phase 904B, it will be appreciated that any suitable number of iterations may be included within a transition phase.

In some examples, a plasma generator may be controlled to provide intermittent pulses of plasma energy during plasma activation phase 904B. For example, the plasma may be pulsed at one or more frequencies including, but not limited to, frequencies between of 10 Hz and 150 Hz. This may enhance step coverage by reducing a directionality of ion bombardment in comparison to a continuous plasma. Further, this may reduce ion bombardment damage to the substrate. For example, photoresist substrates may be eroded by ion bombardment during a continuous plasma. Pulsing the plasma energy may reduce photoresist erosion.

In the example shown in FIG. 9, the flow rate of reactant B during plasma activation phase 904B is less than the flow rate of reactant B during reactant B exposure phase 904A. Thus, reactant B may be "trickled" into the process station during plasma activation phase 904B. This may provide a gas-phase PECVD reaction supplementing the CFD-type surface reactions. However, it will be appreciated that, in some examples, flow rate of reactant B may be varied during a single plasma activation phase or over the course of a transition phase. For example, in a transition phase including two iterations of reactant B exposure and plasma activation, a flow rate of reactant B during a first plasma activation phase may be lower than a flow rate of reactant B during the second plasma activation phase. Varying a flow rate of reactant B during plasma activation phase 904B may provide a smooth transition from the step-coverage characteristics of CFD process phase 902 to the deposition rate characteristics of PECVD process phase 906.

Figure 26:
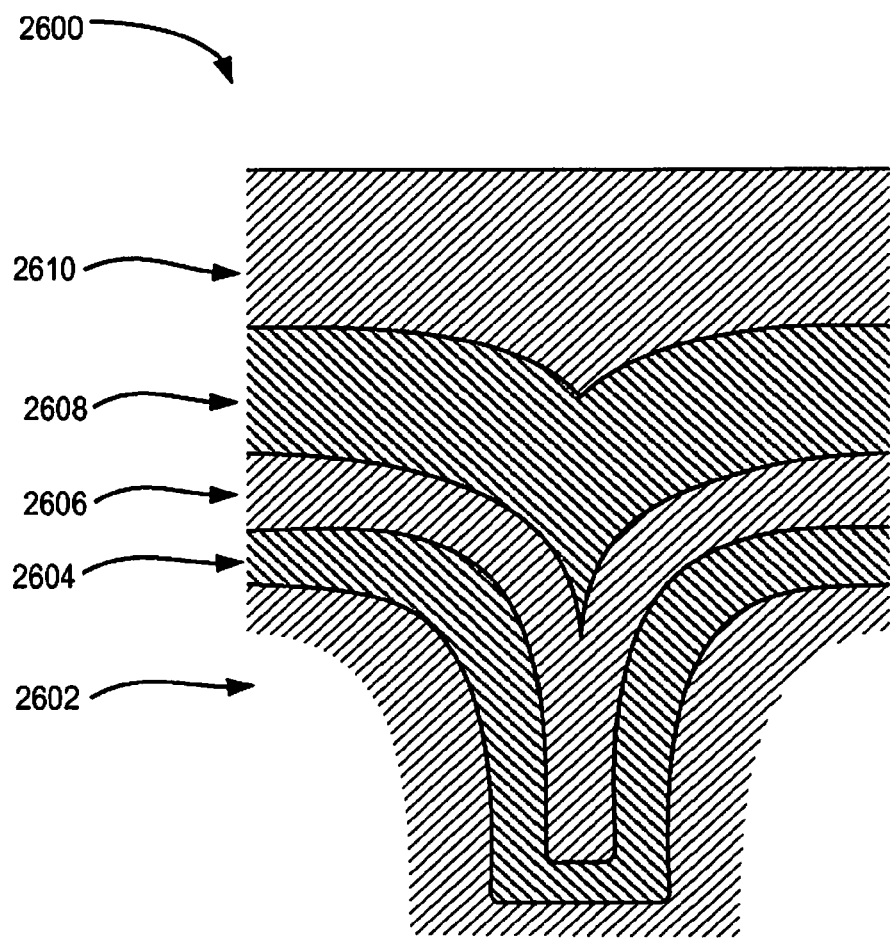
FIG. 26 schematically shows an example cross-section of a non-planar substrate comprising a gap fill deposited in accordance with an example of the present disclosure.
Figure 28:
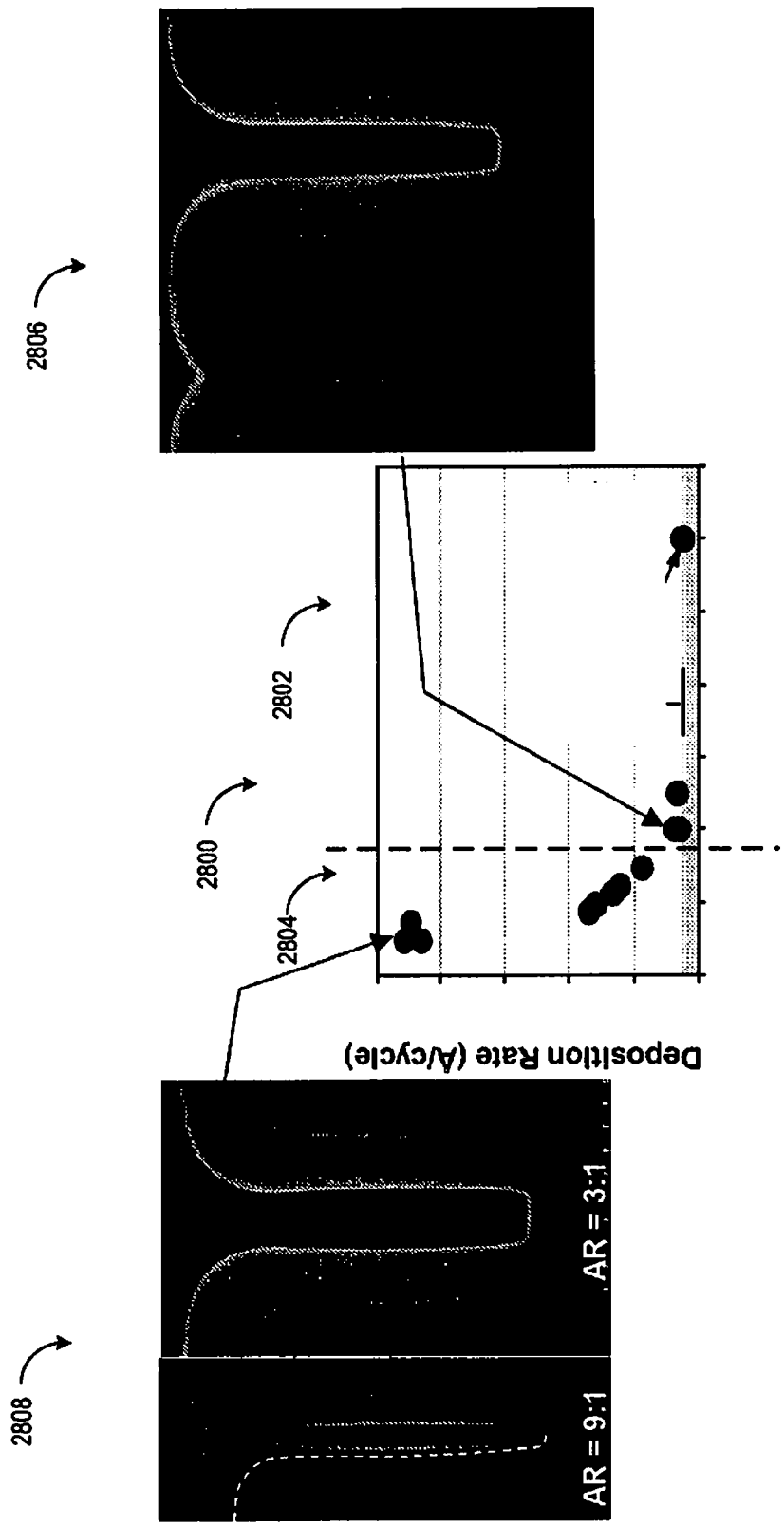
FIG. 28 shows a graph depicting an example deposition rate correlation and also shows example scanning electron microscope (SEM) images of non-planar substrates processed by two example CFD processes including in-situ transitions to PECVD processes according to an example of the present disclosure.

FIG. 26 depicts an example cross-section 2600 of a non-planar substrate 2602 exhibiting various layers deposited by an example of the in-situ transition process described above. Conformal film 2604 may be deposited in an example of a CFD process phase. First transition film 2606 and second transition film 2608 may be deposited in an example of a transition phase like the example described above. For example, first transition film 2606 may be deposited at a first, lower flow rate of reactant B during the transition phase, and second transition film 2608 may be deposited at a second, higher flow rate of reactant B later in the transition phase. This may provide an increase in deposition rate during the transition phase, which may reduce a cycle time of the tool and increase tool throughput. FIG. 28 shows an example correlation 2800 between deposition rate and a transition from a CFD surface reaction phase 2802 to a PECVD phase 2804 according to an example of the present disclosure. FIG. 28 also shows example scanning electron microscope (SEM) images 2806 and 2808 corresponding to the CFD surface reaction phase 2802 and to the PECVD phase 2804, respectively.

Figure 27:
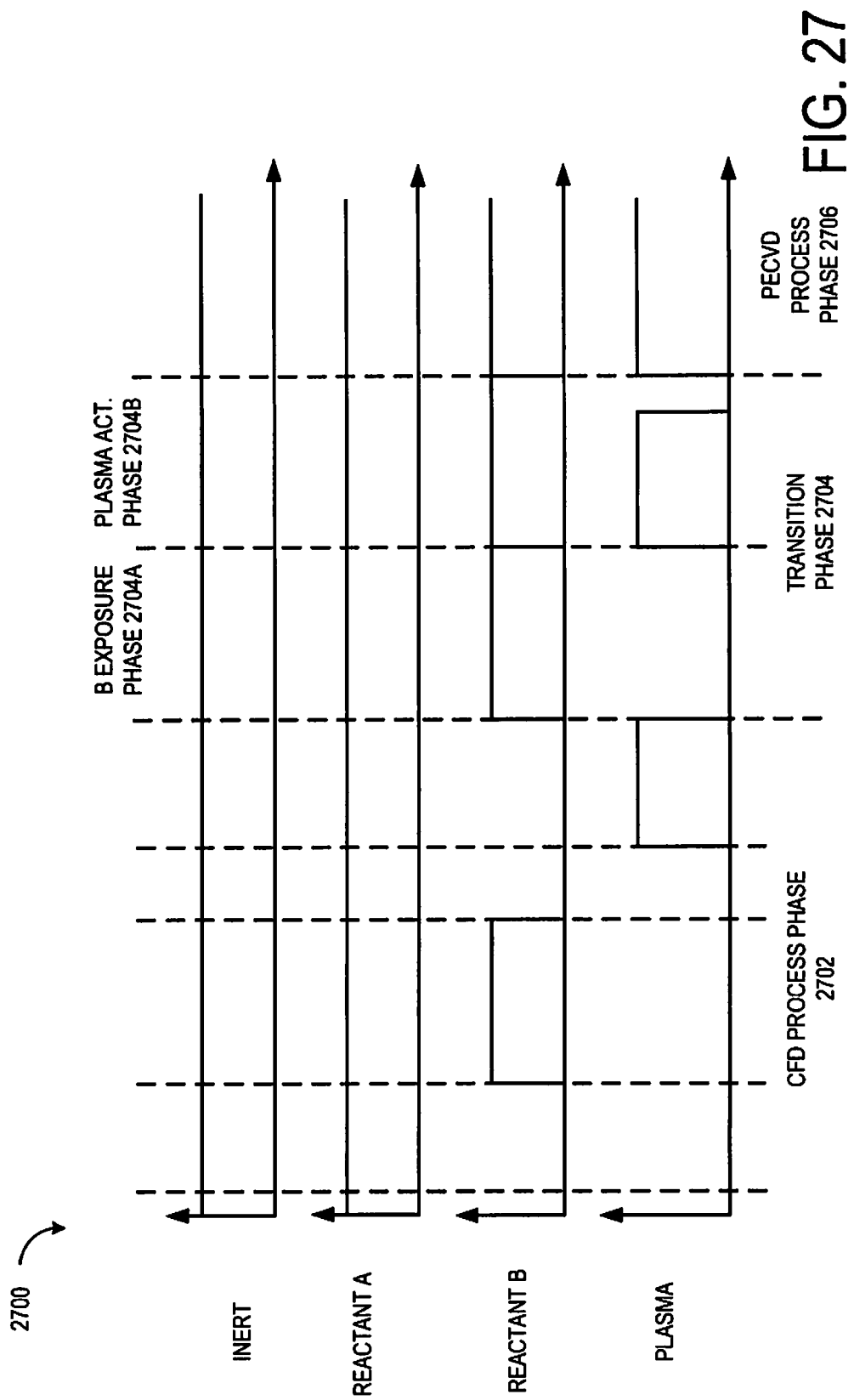
FIG. 27 schematically shows another timing diagram for an example CFD process including a transition to a PECVD process according to an example of the present disclosure.

Alternatively or additionally, in some examples, a flow rate of reactant B may be constant during a plasma activation phase of a transition phase. FIG. 27 depicts an example of a CFD process timing diagram 2700 wherein the flow rate of reactant B is constant during a plasma activation phase 2704B of transition phase 2704.

In some examples, concurrent PECVD-type gas phase reactions and CFD-type surface reactions may be employed throughout a film deposition process. For example, a dielectric liner for a through-silicon via (TSV) may be filled with a semi-conformal film by concurrent CFD-type and PECVD-type reactions.

Figure 29:
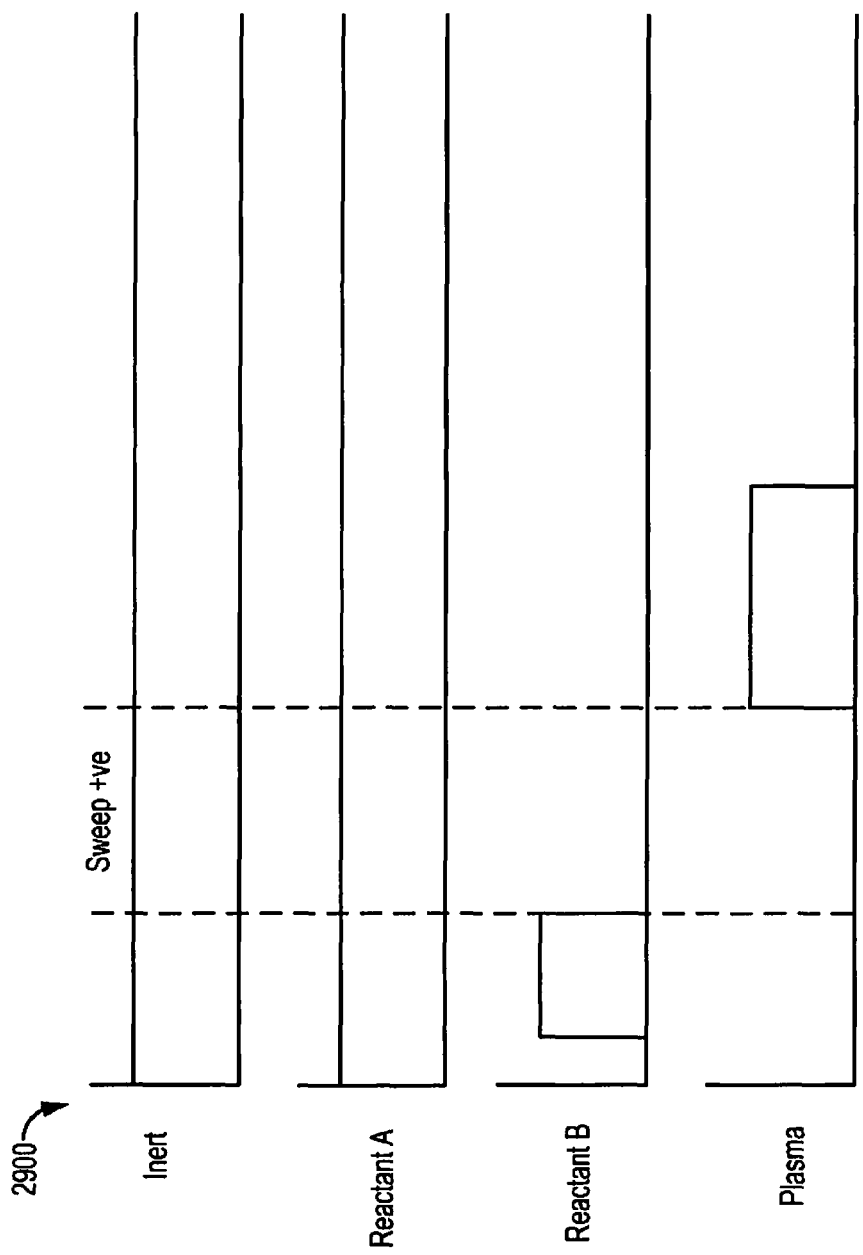
FIG. 29 schematically shows a timing diagram for another example CFD process including concurrent PECVD and CFD deposition processes and including a sweep phase having a positive time duration between discontinuing a supply of reactant B to the process station and plasma activation according to an example of the present disclosure.
Figure 30:
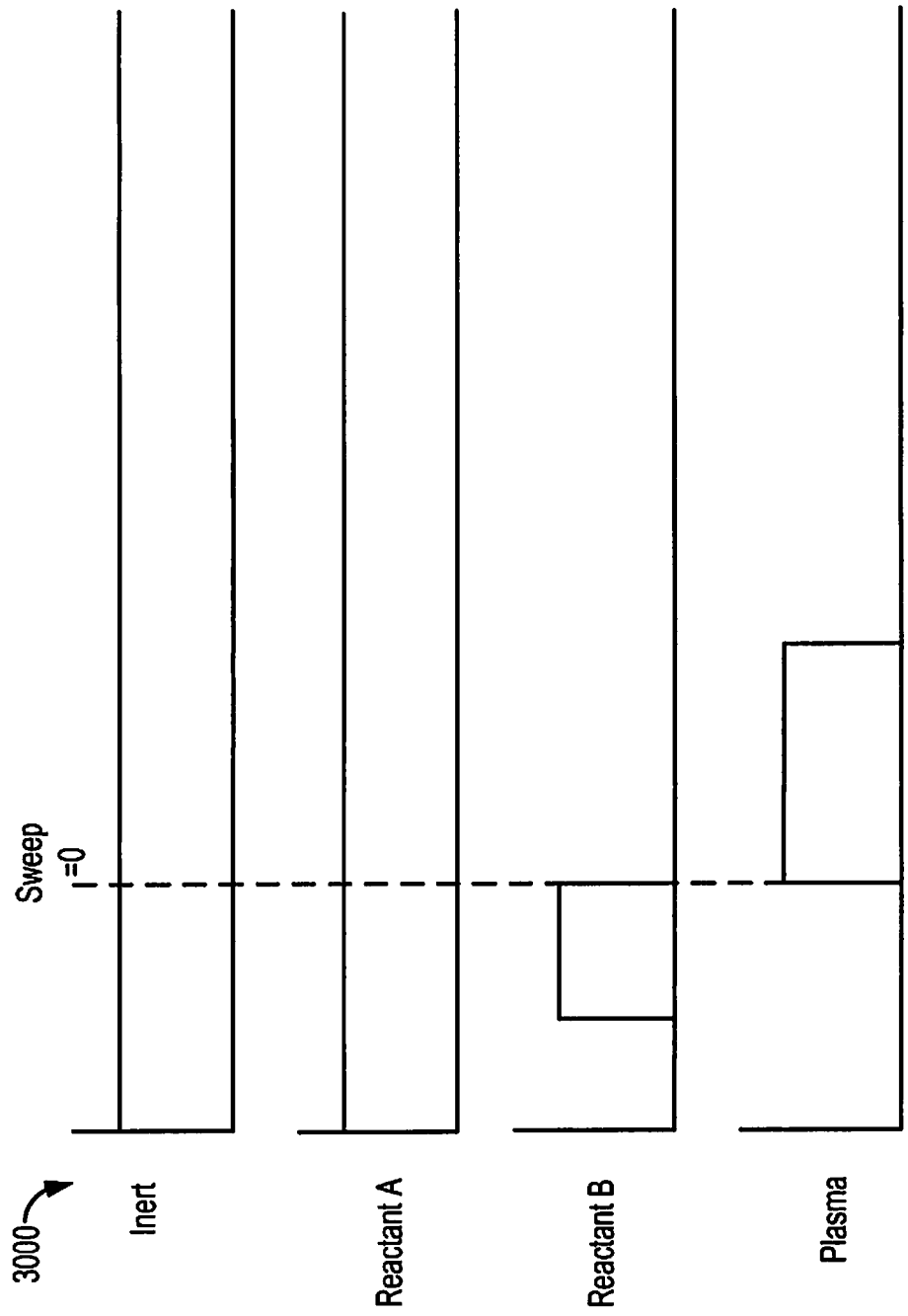
FIG. 30 schematically shows a timing diagram for another example CFD process including concurrent PECVD and CFD deposition processes and excluding a sweep phase between discontinuing a supply of reactant B and plasma activation according to an example of the present disclosure.

Concurrent PECVD-type and CFD-type reactions may occur where reactant B co-exists with reactant A in a plasma environment. In some examples, co-existence of reactants in a plasma environment may result from a persistence of reactant B in a process station after a supply of reactant B has been discontinued, continuing an exposure of reactant B to the substrate. For example, FIG. 29 shows a timing diagram 2900 for an example of a CFD process including a sweep phase having a positive time duration between discontinuing a supply of reactant B to the process station and plasma activation. As another example, FIG. 30 shows another timing diagram 3000 for an example of a CFD process excluding a sweep phase (e.g., having a sweep time=0) between discontinuing a supply of reactant B and plasma activation.

In some examples, co-existence of reactants in a plasma environment may result from concurrent supply of reactant B to the process station and plasma activation. For example, FIG. 31 shows a timing diagram 3100 for an example of a CFD process having an overlap (indicated by a "negative" sweep time) between a supply of reactant B to the process station and plasma activation.

In some examples, a CFD process may include an in-situ etch for selectively removing a re-entrant portion of deposited film. Non-limiting parameter ranges for an example silicon dioxide deposition process including an in-situ etch for a gap fill CFD process are provided in Table 5.

TABLE 5

| Phase | Reactant A exposure phase | Reactant B exposure phase | Sweep phase | Plasma activation phase | Etch phase |
|---|---|---|---|---|---|
| Time (sec) | continuing | 0.25-10.0 | 0.25-10.0 | 0.25-10.0 | 0.25-10.0 |
| BTBAS (sccm) | — | 0.5-2.0 | 0 | 0 | 0 |
| $O_2$ (slm) | 1-20 | 1-20 | 1-20 | 1-20 | 0 |
| $NF_3$ (sccm) | 0 | 0 | 0 | 0 | 1-15 |
| Ar (slm) | 1-20 | 1-20 | 1-20 | 1-20 | 1-20 |
| Pressure (torr) | 1-4 | 1-4 | 1-4 | 1-4 | 1-4 |
| Temp (C.) | 50-400 | 50-400 | 50-400 | 50-400 | 50-400 |
| HF Power (W) | 0 | 0 | 0 | 50-2500 | 50-2500 |
| LF Power (W) | 0 | 0 | 0 | 0-2500 | 0-2500 |

Figure 11:
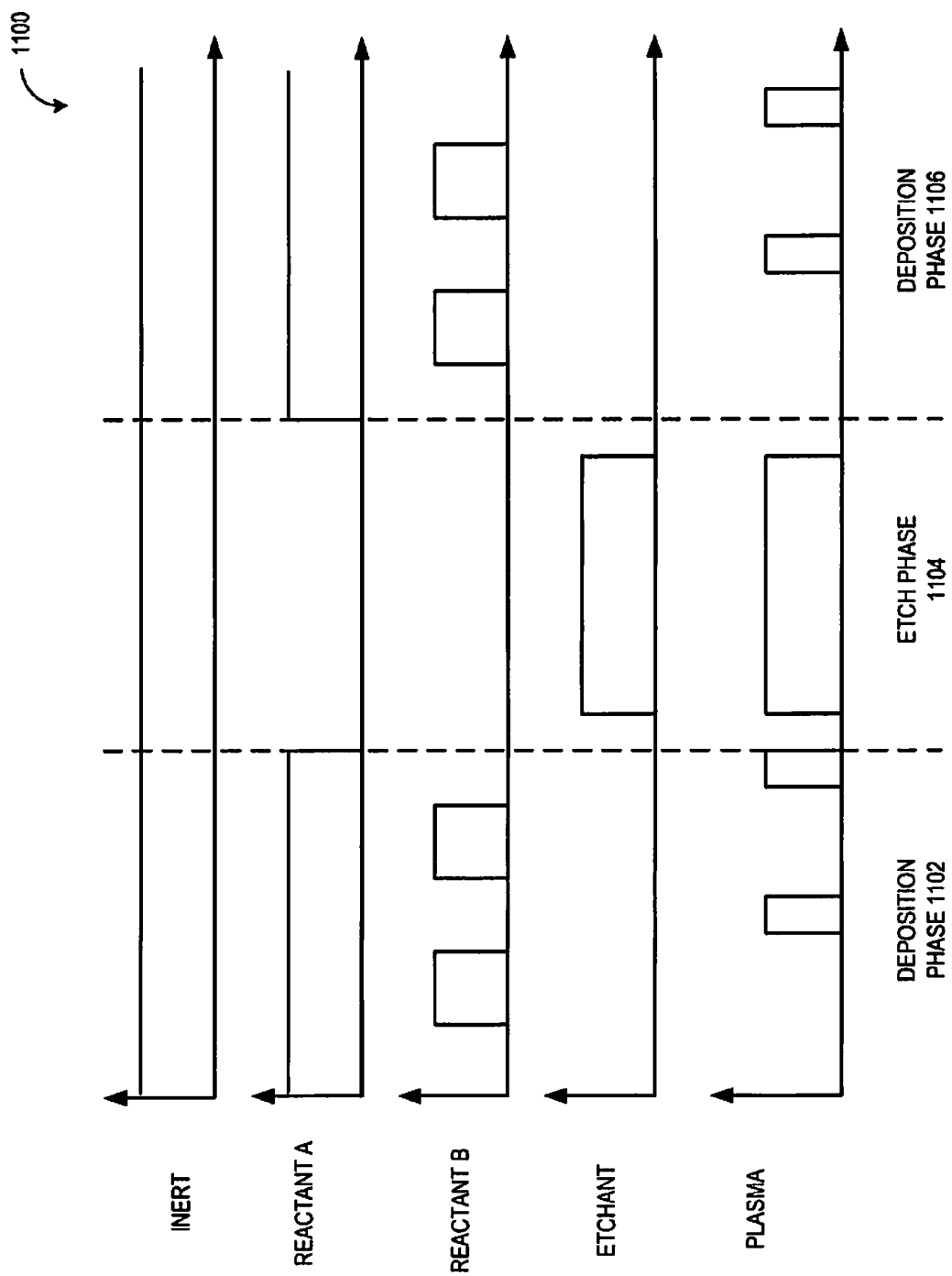
FIG. 11 schematically shows a timing diagram for an example CFD process including an in-situ etch according to an example of the present disclosure.

FIG. 11 shows an example of a CFD process timing diagram 1100 including a deposition phase 1102, an etch phase 1104, and a subsequent deposition phase 1106. At deposition phase 1102 of the example shown in FIG. 11, film is deposited onto the exposed surfaces of the substrate. For example, deposition phase 1102 may include one or more CFD process deposition cycles.

At etch phase 1104 of the example of FIG. 11, reactants A and B are turned off and an etch gas is introduced to the process station. One non-limiting example of an etch gas is nitrogen trifluoride (NF3). In the example depicted in FIG. 11, the etch gas is activated by a plasma ignited during etch phase 1104. Various process parameters, such as process station pressure, substrate temperature, etch gas flow rate, may be adjusted during etch phase 1104 for selectively removing a re-entrant portion of a deposited film on a non-planar substrate. Any suitable etch process may be employed within the scope of the present disclosure. Other example etch processes include, but are not limited to, reactive ion etching, non-plasma vapor phase etching, solid phase sublimation, and adsorption and directional activation (e.g., by ion bombardment) of the etch species.

In some examples, incompatible gas phase species may be removed from the process station before and after etching the film. For example, the example of FIG. 11 includes a continuous flow of an inert gas after reactants A and B have been turned off and after the etch gas has been turned off during etch phase 1104.

At the conclusion of etch phase 1104, a deposition phase 1106 begins, further filling gaps on the non-planar substrate. Deposition phase 1106 may be any suitable deposition process. For example, deposition phase 1106 may include one or more of a CFD process, a CVD process, a PECVD process, etc. While the example of FIG. 11 shows a single etch phase 1104, it will be appreciated that a plurality of in-situ etch processes may be inserted at intervals among multiple deposition phases of any suitable type during a gap fill process.

Figure 12A:
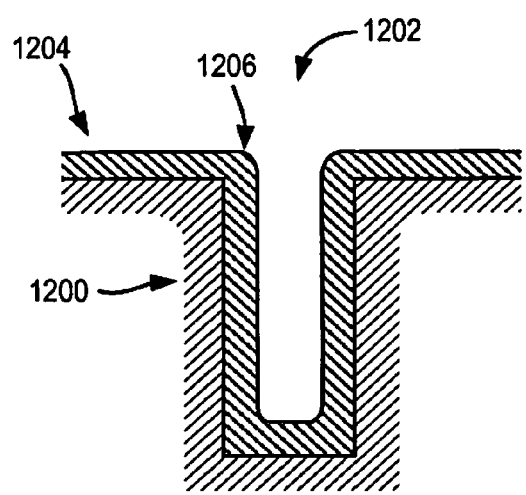
FIG. 12A schematically shows an example cross-section of a re-entrant gap fill profile.
Figure 12B:
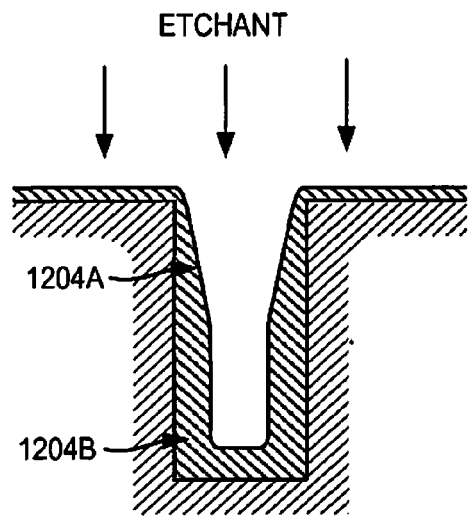
FIG. 12B schematically shows an example cross-section of the re-entrant gap fill profile of FIG. 12A during an in-situ etch process according to an example of the present disclosure.
Figure 12C:
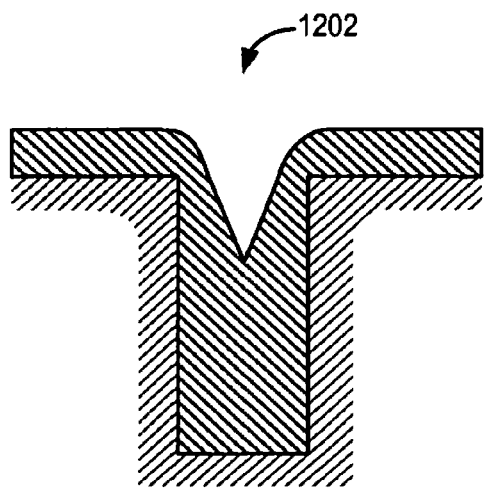
FIG. 12C schematically shows an example cross-section of the gap fill profile of FIG. 12B during a deposition process after an in-situ etch according to an example of the present disclosure.

FIGS. 12A-C depict example cross-sections of a non-planar substrate at various phases of an example of the in-situ deposition and etch processes described above. FIG. 12A shows a cross-section of an example non-planar substrate 1200, including a gap 1202. Gap 1202 is covered with a thin film 1204. Thin film 1204 is nearly conformal with gap 1202, but thin film 1204 includes a re-entrant portion 1206 near the top of gap 1202.

In the example depicted in FIG. 12B, re-entrant portion 1206 of thin film 1204 has been selectively removed and that an upper region 1204A of thin film 1204 is thinner than a lower region 1204B. Selective removal of the re-entrant portion and/or sidewall angle adjustment may be achieved by imposing mass transfer limitations and/or lifetime limitations on the active etch species. In some examples, selective etching at the top of gap 1202 may also adjust a sidewall angle of gap 1202, so that gap 1202 is wider at the top than at the bottom. This may further reduce bread loafing effects in subsequent deposition phases. In the example shown in FIG. 12C, after a subsequent deposition phase, gap 1202 is nearly filled and exhibits no voids.

Figure 25:
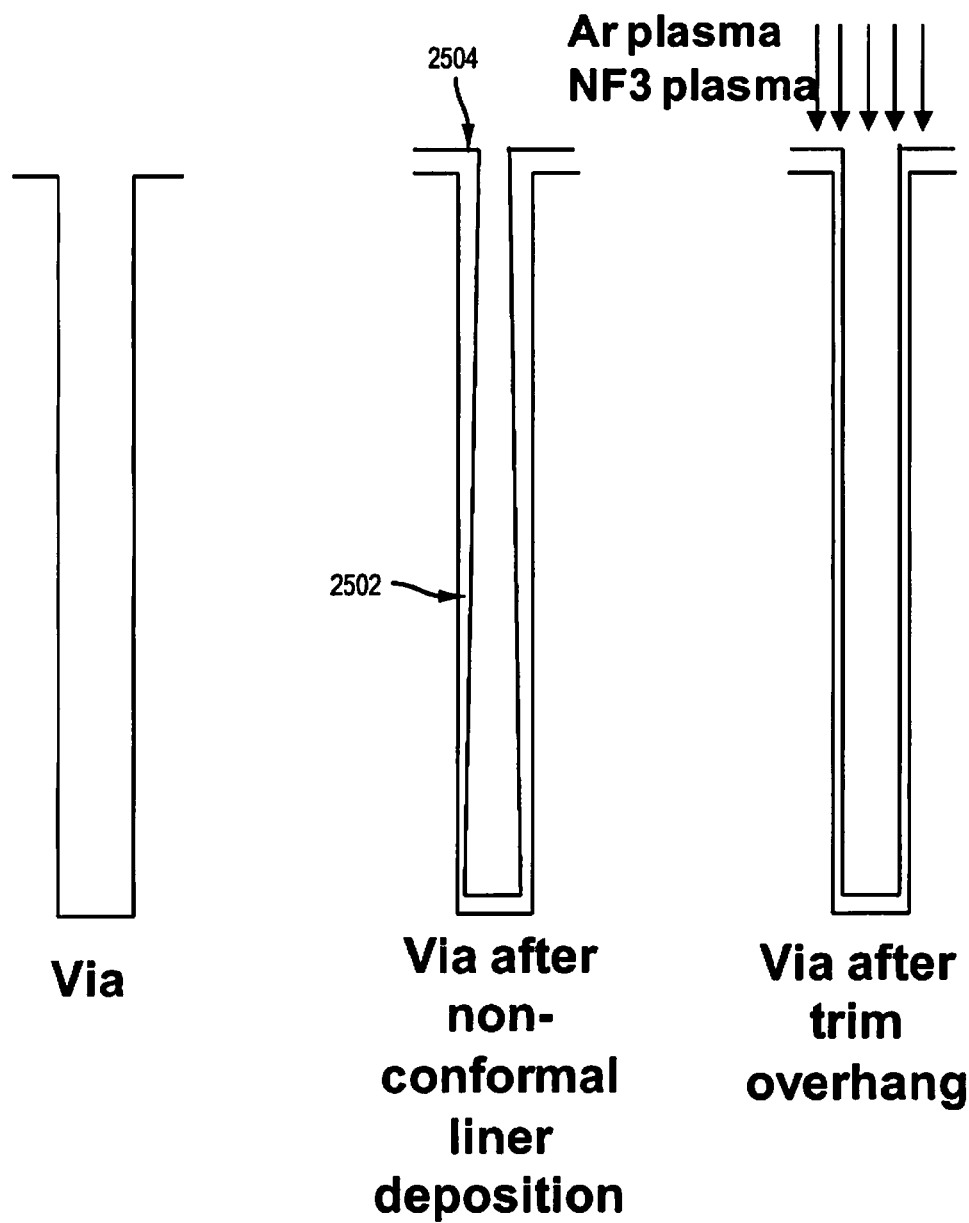
FIG. 25 schematically shows an example cross-sectional view of a through-silicon via during a CFD process including an in-situ etch according to an example of the present disclosure.

Another example of an in-situ etch process is shown in FIG. 25, which depicts a through-silicon via (TSV) for a copper electrode. Some example TSVs have depths of approximately 105 microns and diameters of approximately 6 microns, giving an approximately 17.5:1 aspect ratio, and may have a thermal budget ceiling of approximately 200 degrees Celsius. As shown in the example of FIG. 25, through-silicon via is covered by a dielectric isolation layer 2502 to electrically isolate a silicon substrate from a metal-filled via. Example dielectric isolation layer materials include, but are not limited to, silicon oxide, silicon nitride, a low-k dielectric material. In some examples, the example etch processes described above may be supplemented with physical sputtering of the re-entrant portion using a suitable sputter gas, such as argon.

Other example applications for CFD films include, but are not limited to conformal low-k films (e.g., k approximately 3.0 or lower in some non-limiting examples) for back-end-of-line interconnect isolation applications, conformal silicon nitride films for etch stop and spacer layer applications, conformal antireflective layers, and copper adhesion and barrier layers. Many different compositions of low-k dielectrics for BEOL processing can be fabricated using CFD. Examples include silicon oxides, oxygen doped carbides, carbon doped oxides, oxynitrides, and the like.

In another example, in one integrated process scenario, a silicon dioxide spacer layer may be deposited over a photoresist "core." Use of a photoresist core instead of an alternative core material (such as a silicon carbide layer) may eliminate a patterning step in the integrated process. The process may involve patterning photoresist using normal lithographic techniques and then depositing a thin layer of CFD oxide directly over that core. A directional dry etch process may be then used to remove the CFD oxide film at the top of the patterned photoresist and at the bottom leaving only material along the sidewall of the patterned photoresist (consider trenches). At this stage, simple ashing can be used to remove the exposed core leaving behind the CFD oxide. Where once there was a single photoresist line, now there are two CFD-oxide lines. In this manner the process doubles the pattern density; hence it is sometimes referred to as "double patterning". Unfortunately, use of a photoresist core may limit a spacer layer deposition temperature to less than 70 degrees Celsius, which may be less than deposition temperatures for conventional CVD, PECVD, and/or ALD processes. Thus, in some examples, a low temperature CFD silicon dioxide film may be deposited at temperatures below 70 degrees Celsius. It will be appreciated that other potential integrated process applications exist for suitable CFD-generated films within the scope of the present disclosure. Additionally, in various examples, a nitride such as a silicon nitride deposited as above may be employed as a conformal diffusion barrier layer and/or etch stop in various stages of semiconductor device manufacture.

While the various CFD deposition processes described above have been directed at depositing, treating, and/or etching single film types, it will be appreciated that some CFD processes within the scope of the present disclosure may include in-situ deposition of a plurality of film types. For example, alternating layers of film types may be deposited in-situ. In a first scenario, a double spacer for a gate device may be fabricated by in-situ deposition of a silicon nitride/silicon oxide spacer stack. This may reduce cycle time and increase process station throughput, and may avoid interlayer defects formed by potential film layer incompatibility. In a second scenario, an antireflective layer for lithographic patterning applications may be deposited as a stack of SiON or amorphous silicon and SiOC with tunable optical properties.

Figure 13:
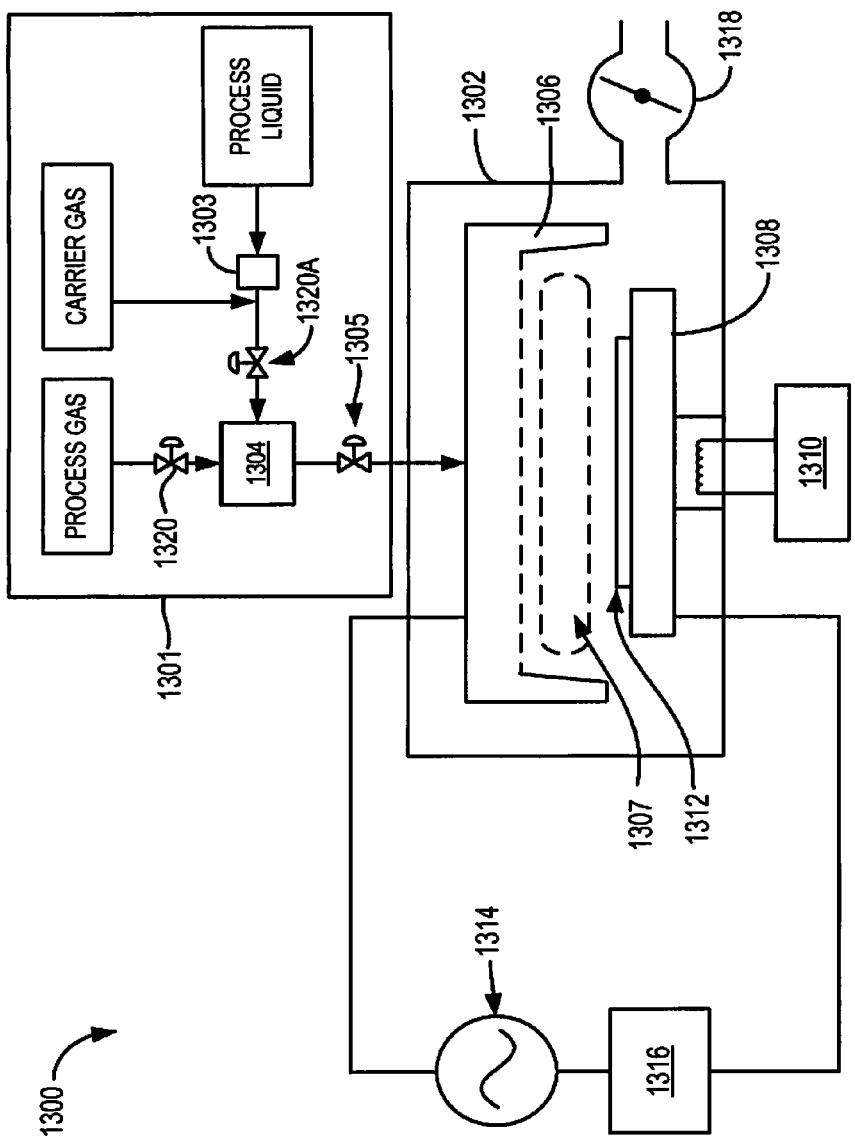
FIG. 13 schematically shows an example process station according to an example of the present disclosure.
Figure 24:
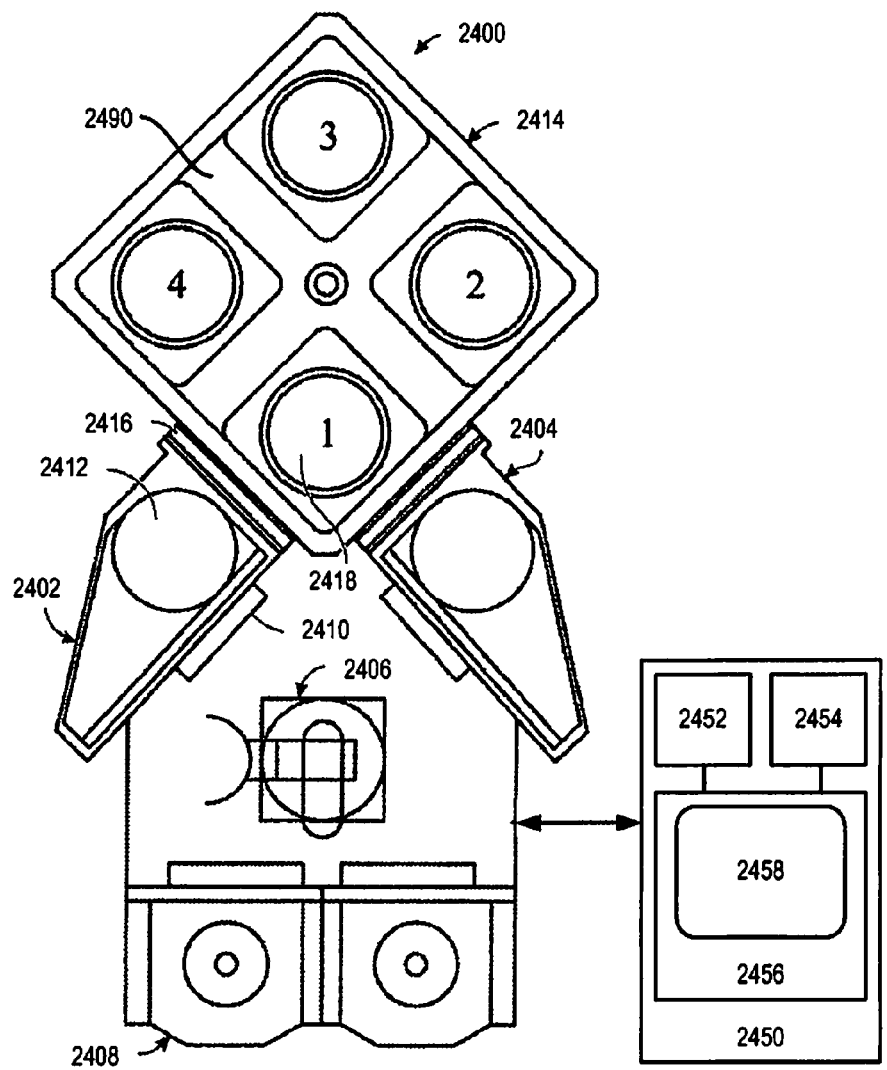
FIG. 24 schematically shows an example process tool including a plurality of process stations and a controller according to an example of the present disclosure.

It will be appreciated that any suitable process station may be employed with one or more of the examples described above. For example, FIG. 13 schematically shows an example of a CFD process station 1300. For simplicity, CFD process station 1300 is depicted as a standalone process station having a process chamber body 1302 for maintaining a low-pressure environment. However, it will be appreciated that a plurality of CFD process stations 1300 may be included in a common low-pressure process tool environment. While the example depicted in FIG. 13 shows one process station, it will be appreciated that, in some examples, a plurality of process stations may be included in a processing tool. For example, FIG. 24 depicts an example of a multi-station processing tool 2400. Further, it will be appreciated that, in some examples, one or more hardware parameters of CFD process station 1300, including those discussed in detail below, may be adjusted programmatically by one or more computer controllers.

CFD process station 1300 fluidly communicates with reactant delivery system 1301 for delivering process gases to a distribution showerhead 1306. Reactant delivery system 1301 includes a mixing vessel 1304 for blending and/or conditioning process gases for delivery to showerhead 1306. One or more mixing vessel inlet valves 1320 may control introduction of process gases to mixing vessel 1304.

Some reactants, like BTBAS, may be stored in liquid form prior to vaporization and subsequent delivery to the process station. For example, the example of FIG. 13 includes a vaporization point 1303 for vaporizing liquid reactant to be supplied to mixing vessel 1304. In some examples, vaporization point 1303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some examples, delivery piping downstream of vaporization point 1303 may be heat traced. In some examples, mixing vessel 1304 may also be heat traced. In one non-limiting example, piping downstream of vaporization point 1303 has an increasing temperature profile extending from approximately 100 degrees Celsius to approximately 150 degrees Celsius at mixing vessel 1304.

In some examples, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 1303. In one scenario, a liquid injector may be mounted directly to mixing vessel 1304. In another scenario, a liquid injector may be mounted directly to showerhead 1306.

In some examples, flow through a liquid injector may be controlled by an actuator, such as a controlled plunger, pintle valve, piezo valve, etc. Additionally, in some examples, the liquid injector may have little or no volume between the actuator and an exit aperture of the liquid injector. For example, the actuator may directly seal the exit aperture of the liquid injector. This may reduce an amount of liquid retained by capillary or other forces downstream of the actuator. Such liquid might continue to evaporate after injection stops, causing a liquid reactant pulse to taper off gradually instead of ending abruptly, potentially causing small particles on interaction with incompatible process gases and/or causing an uncontrolled exposure of liquid reactant.

In some examples, a liquid injector may be controlled to generate an injection profile. For example, a liquid injector may be instructed to inject a plurality of smaller exposures rather than a single large exposure to extend exposure time, improve saturation coverage, etc. Further, one or more of the constituent smaller exposures may be modulated to further address one or more of these issues.

It will be appreciated that any suitable liquid injector may be employed within the scope of the present disclosure. For example, in a first scenario, an automotive fuel injector including a pintle valve may be used as a liquid injector. Example droplets provided by an automotive fuel injector may be, but are not limited to, droplets sized from 5 microns to 40 microns. Example injection pulse widths may include, but are not limited to, widths from 1 ms to 50 ms.

In a second scenario, one or more micro-electromechanical systems (MEMS) injectors including piezoelectric pumps may be used as liquid injectors. For example, a plurality of MEMS injectors may be arranged in a stack at one or more showerheads, providing liquid injection capability for a plurality of liquid reactants. Example MEMS injector droplets may include, but are not limited to, droplets sized from 10 microns to 30 microns. Example MEMS injection pulse widths may include, but are not limited to, widths from 1 ms to 500 ms.

In a third scenario, Hall-effect injectors may be used as a liquid injector. This may provide liquid injection control that is resistant to RF interference. Example Hall-effect injector droplets may include, but are not limited to, droplets sized from 5 microns to 50 microns. Example Hall-effect injection pulse widths may include, but are not limited to, widths from 1 ms to 500 ms. Thus, it will be appreciated that any suitable liquid injector may be included at a vaporization point in some examples, including ejector tubes, venture tubes, etc. Alternatively, in some examples a liquid injector may be omitted.

Liquid pressure upstream of the injector may be set at any suitable delivery pressure to cause atomization and/or flashing of the liquid. In some examples, upstream pressure may be provided by a push gas for pressurizing a liquid storage reservoir. Example pressure differentials across a liquid injector may include, but are not limited to, pressure differentials of approximately 0.3 bar to 5 bar.

In some examples, a liquid flow controller upstream of vaporization point 1303 may be provided for controlling a mass flow of liquid for vaporization and delivery to process station 1300. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some examples, the LFC may be dynamically switched between a feedback control mode and a direct control mode. In some examples, the LFC may be dynamically switched from a feedback control mode to a direct control mode by disabling a sense tube of the LFC and the PID controller.

In the direct control mode, the plunger valve of the LFC may be adjusted in proportion to a supplied control voltage independently of a control signal provided by the PID controller. Put another way, adjustment of the plunger valve in the direct control mode causes the LFC to function as a controlled orifice for regulating liquid flow. In some examples, the LFC may include one or more autocalibration modes for defining a proportional relationship between a voltage and a plunger valve opening amount.

In some examples, the plunger valve may be opened to a preset position prior to opening a mixing vessel inlet valve 1320A. Upon opening mixing vessel liquid inlet valve 1320A, vaporized liquid reactant may immediately being flowing to mixing vessel 1304. After a prescribed time, the control voltage for the LFC may be set to close the plunger valve, causing liquid flow through the LFC to cease. In some examples, mixing vessel inlet valve 1320A may be closed concurrently with a closing of the plunger valve, which may provide an approximately square-wave exposure of vaporized liquid reactant.

Figure 14:
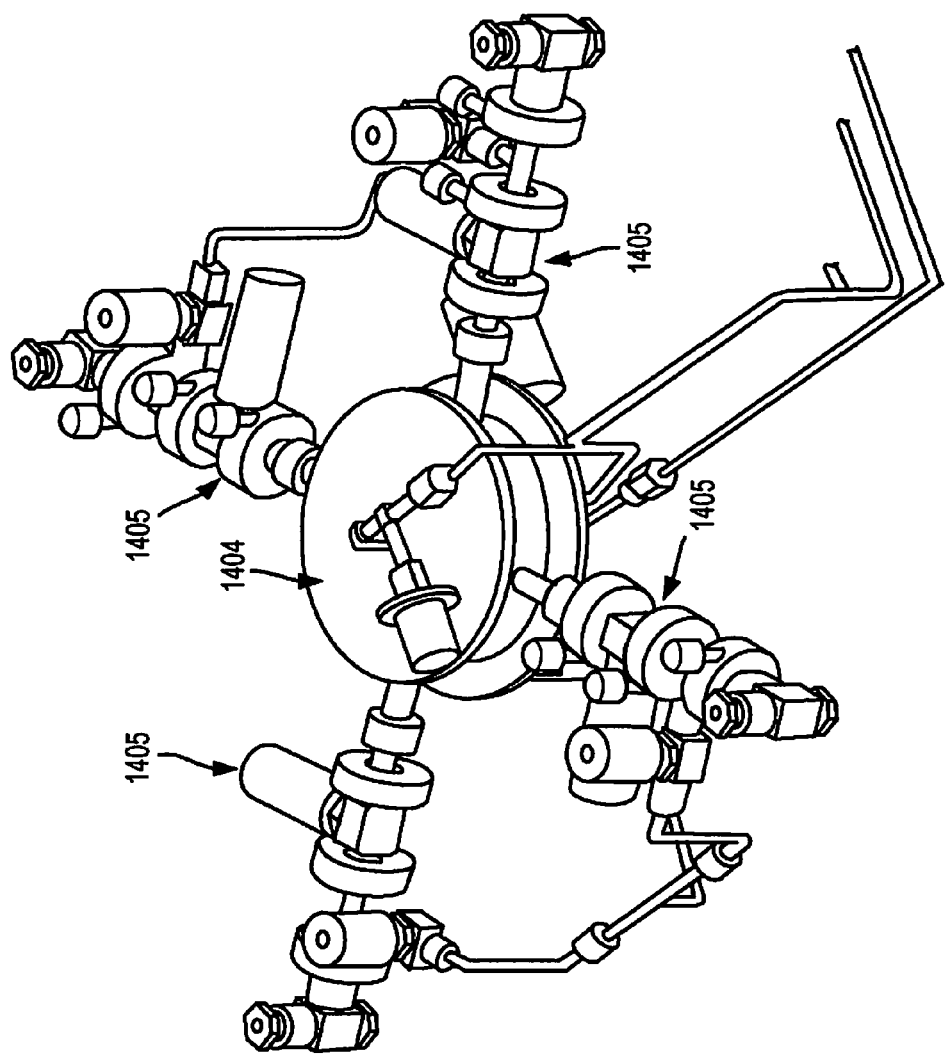
FIG. 14 shows a perspective view of an example reactant distribution system including a mixing vessel and a plurality of mixing vessel outlet valves according to an example of the present disclosure.
Figure 15:
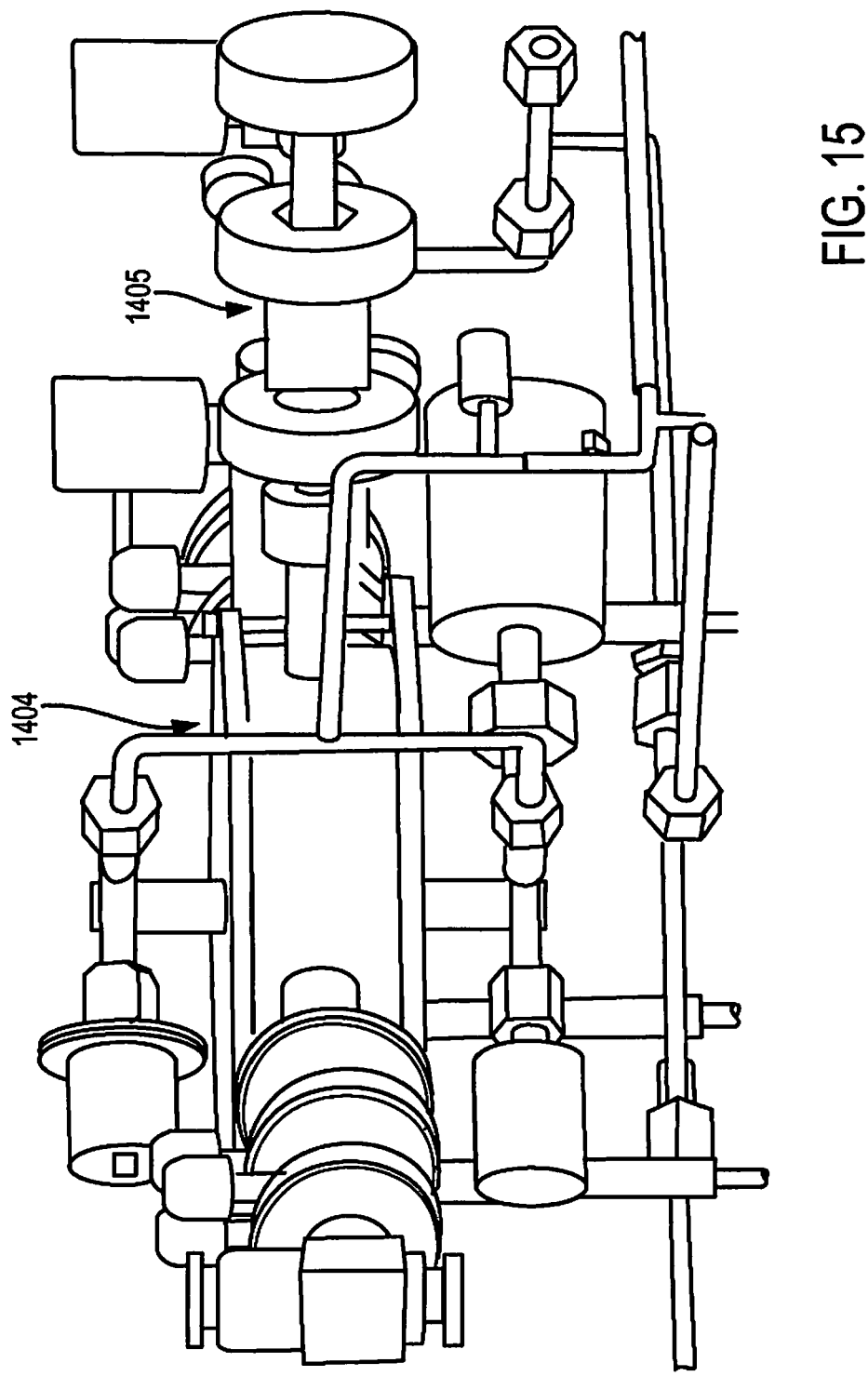
FIG. 15 shows a side view of the reactant distribution system example depicted in FIG. 14.

In some examples, a mixing vessel outlet valve 1305 may be located between mixing vessel 1304 and a distribution showerhead 1306 for isolating mixing vessel 1304 from showerhead 1306. FIG. 14 shows perspective view of an example of a mixing vessel 1404 and four mixing vessel outlet valves 1405 for supplying four process station showerheads (not shown). FIG. 15 shows a side view of a portion of the example of the mixing vessel depicted in FIG. 14. While FIGS. 14 and 15 depict an example of a mixing vessel configured to supply process gases to four process stations, it will be appreciated that any suitable number of process stations may be supplied process gases from any suitable number of mixing vessels using any suitable number of mixing vessel outlet valves. Isolating mixing vessel 1304 may provide a confined space of known volume for collecting, conditioning, and/or blending various gases prior to delivery to showerhead 1306. Monitoring the pressure and/or temperature of mixing vessel 1304 may provide a basis from which to calculate and/or control mass delivery of various process gases to showerhead 1306. In one non-limiting example, a number of moles of a reactant vapor exposure may be calculated from a pressure measurement taken from an isothermal mixing vessel using the ideal gas equation, though it will be appreciated that any suitable equation of state may be used in other scenarios. For example, in one specific example, a pressure of approximately 400 Torr in an approximately 1 liter mixing vessel may provide up to 40 exposure equivalents of process gas to a 50 liter volume distributed over one or more process stations.

Figure 16:
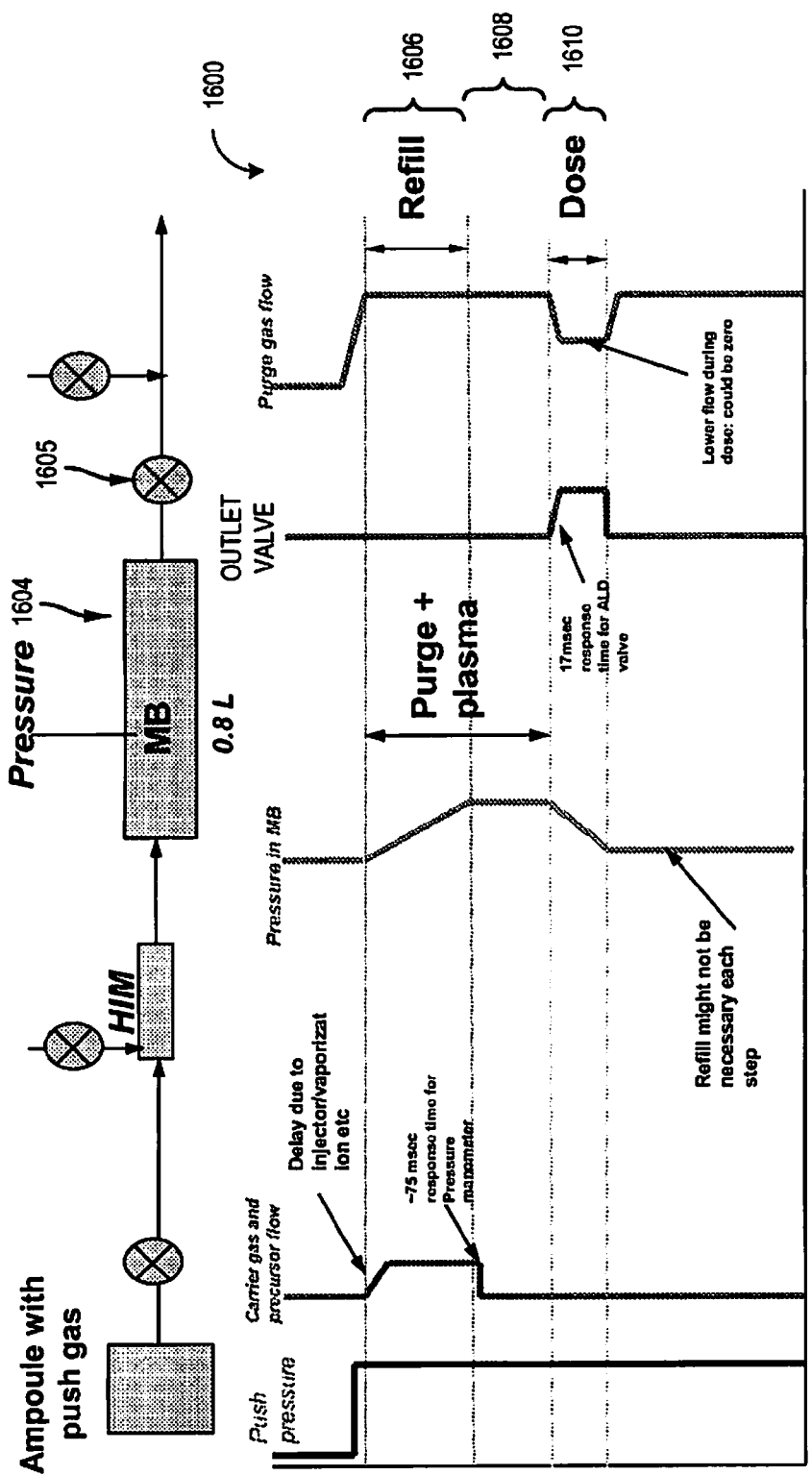
FIG. 16 schematically shows an example timing diagram for an example reactant distribution system according to an example of the present disclosure.

In some examples, a pre-determined exposure of a reactant may be stored during a mixing vessel filling phase for later delivery to showerhead 1306. For example, FIG. 16 shows an example of a mixing vessel timing diagram 1600. As depicted in the example of FIG. 16, mixing vessel 1604 is filled with reactant gas vapor during a fill phase 1606, which is concurrent with sweep and plasma activation phases of a CFD process in an associated process station. A mixing vessel pressure is monitored during fill phase 1606. Upon reaching a mixing vessel pressure set point corresponding to a pre-determined exposure of the reactant gas, reactant gas flows are turned off. The reactant gas is then stored in mixing vessel 1604 until the end of storage phase 1608, which coincides with the end of the sweep and plasma activation phases of the associated CFD process.

Mixing vessel outlet valve 1605 opens at the beginning of exposure phase 1610, supplying reactant gas to the associated process station. At the end of exposure phase 1610, mixing vessel outlet valve 1605 closes, stopping reactant flow to the process station. In one scenario, mixing vessel 1604 may be completely emptied of the reactant gas during exposure phase 1610. In another scenario, exposure phase 1610 may end before mixing vessel 1604 is completely emptied; the remaining reactant gas in mixing vessel 1604 may be removed through a process station bypass line (not shown) or may be stored in mixing vessel 1604 for later delivery to the process station.

Figure 17:
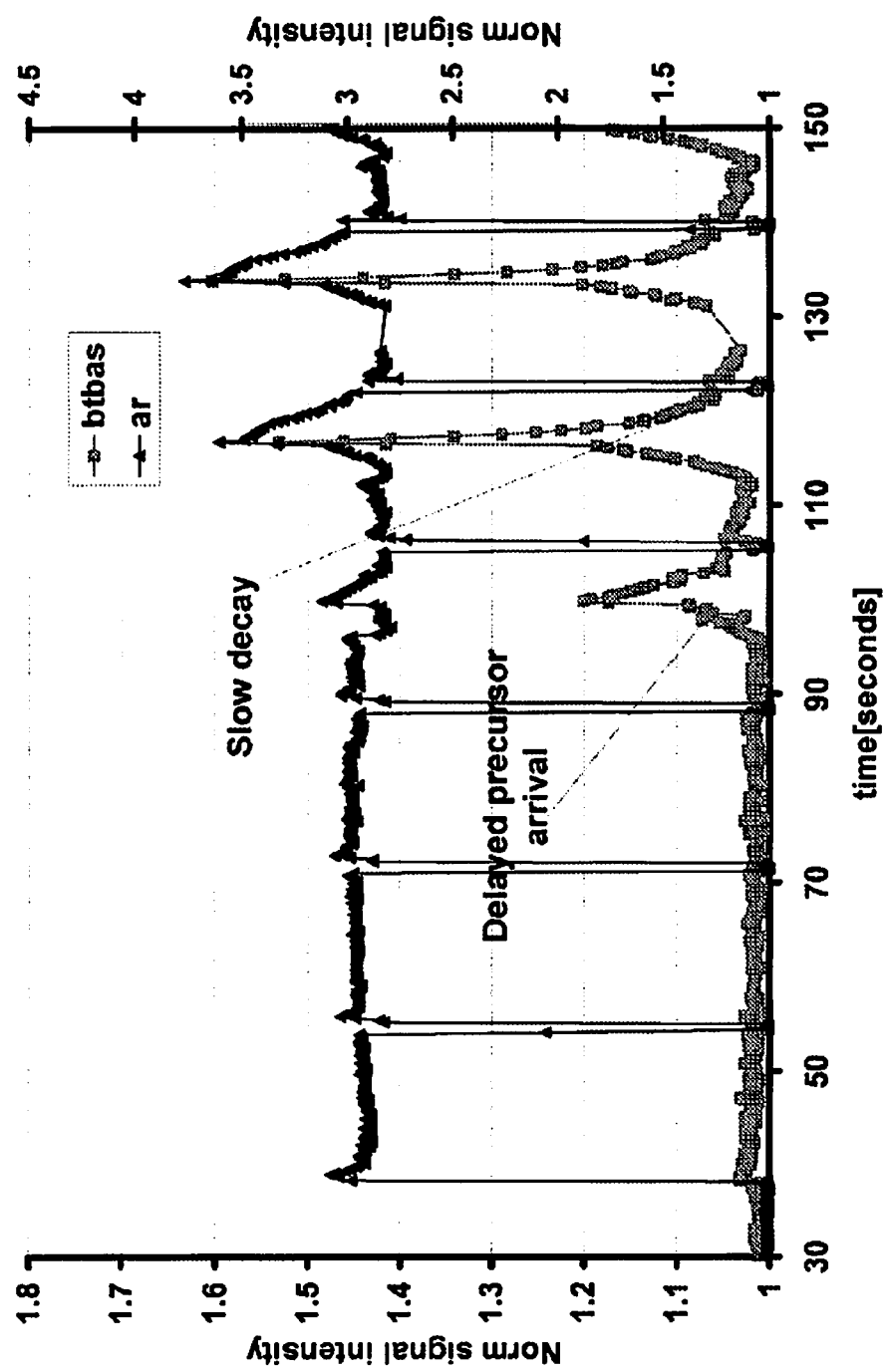
FIG. 17 schematically shows example travel and sweep time delays for a reactant delivery system.

For some reactant gases, there may be a travel delay time associated with a length of delivery pipe between mixing vessel outlet valve 1305 and showerhead 1306. Further, a similar delay time may be associated with removing process gases from delivery pipes upstream of showerhead 1306. For example, FIG. 17 shows example travel delay times for example reactant BTBAS and example sweep gas argon. Locating mixing vessel outlet valve 1305 closer to showerhead 1306 may produce more discrete reactant exposure and sweep pulses than those produced when mixing vessel outlet valve 1305 is located farther from showerhead 1306. This may reduce a time needed to complete a reactant and/or sweep phase of a CFD process. Thus, in one non-limiting example, mixing vessel outlet valve 1305 may be located immediately upstream of showerhead 1306.

Showerhead 1306 distributes process gases toward substrate 1312. In the example shown in FIG. 13, substrate 1312 is located beneath showerhead 1306, and is shown resting on a pedestal 1308. It will be appreciated that showerhead 1306 may have any suitable shape, and may have any suitable number and arrangement of ports for distributing processes gases to substrate 1312.

Figure 21:
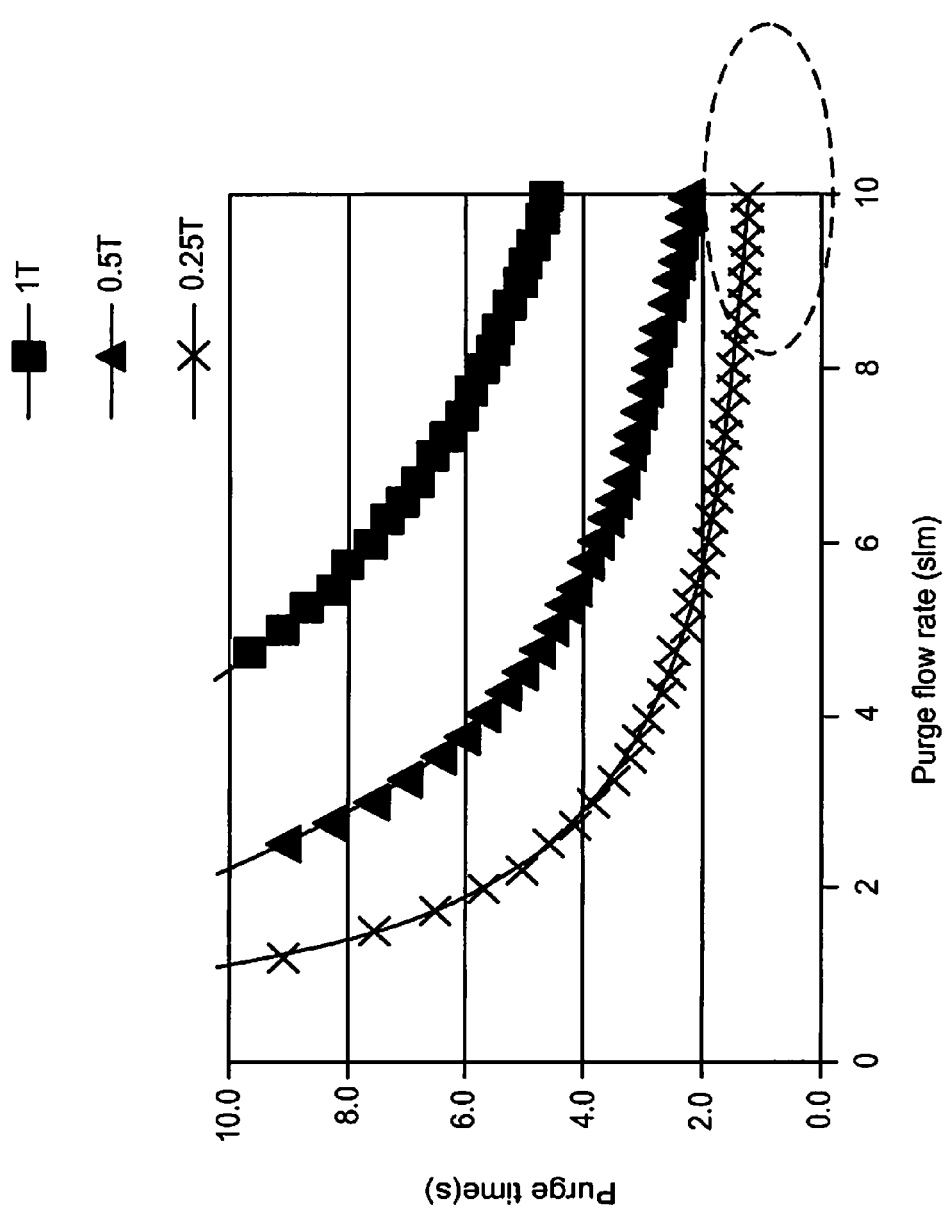
FIG. 21 schematically shows example correlations between a sweep time and a sweep flow rate of a dual-zone showerhead at various pressures according to an example of the present disclosure.

In some examples, a microvolume 1307 is located beneath showerhead 1306. Performing a CFD process in a microvolume rather than in the entire volume of a process station may reduce reactant exposure and sweep times, may reduce times for altering CFD process conditions (e.g., pressure, temperature, etc.), may limit an exposure of process station robotics to process gases, etc. FIG. 21 shows examples of correlations between a sweep flow rate of a microvolume and a sweep time for the microvolume for different microvolume pressure conditions. Example microvolume sizes include, but are not limited to, volumes between 0.1 liter and 2 liters.

In some examples, pedestal 1308 may be raised or lowered to expose substrate 1312 to microvolume 1307 and/or to vary a volume of microvolume 1307. For example, in a substrate transfer phase, pedestal 1308 may be lowered to allow substrate 1312 to be loaded onto pedestal 1308. During a CFD process phase, pedestal 1308 may be raised to position substrate 1312 within microvolume 1307. In some examples, microvolume 1307 may completely enclose substrate 1312 as well as a portion of pedestal 1308 to create a region of high flow impedance during a CFD process.

Optionally, pedestal 1308 may be lowered and/or raised during portions of the CFD process to modulate process pressure, reactant concentration, etc., within microvolume 1307. In one scenario where process chamber body 1302 remains at a base pressure during the CFD process, lowering pedestal 1308 may allow microvolume 1307 to be evacuated. Example ratios of microvolume to process chamber volume include, but are not limited to, volume ratios between 1:500 and 1:10. It will be appreciated that, in some examples, pedestal height may be adjusted programmatically by a suitable computer controller.

In another scenario, adjusting a height of pedestal 1308 may allow a plasma density to be varied during plasma activation and/or treatment cycles included in the CFD process. At the conclusion of the CFD process phase, pedestal 1308 may be lowered during another substrate transfer phase to allow removal of substrate 1312 from pedestal 1308.

While the example microvolume variations described herein refer to a height-adjustable pedestal, it will be appreciated that, in some examples, a position of showerhead 1306 may be adjusted relative to pedestal 1308 to vary a volume of microvolume 1307. Further, it will be appreciated that a vertical position of pedestal 1308 and/or showerhead 1306 may be varied by any suitable mechanism within the scope of the present disclosure. In some examples, pedestal 1308 may include a rotational axis for rotating an orientation of substrate 1312. It will be appreciated that, in some examples, one or more of these example adjustments may be performed programmatically by one or more suitable computer controllers.

Figure 18:
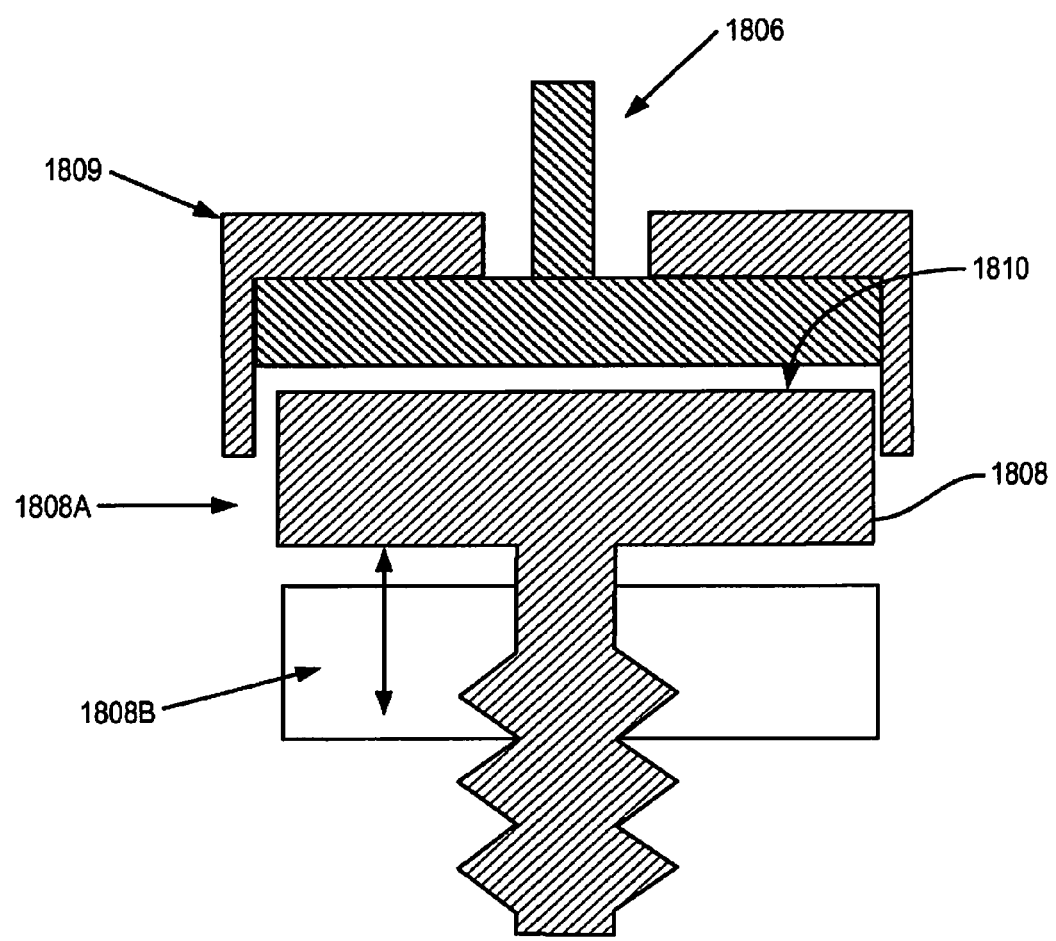
FIG. 18 schematically shows an example skirt enclosure for a microvolume of a process station according to an example of the present disclosure.

In one example, microvolume 1307 is partially enclosed at the top and along a perimeter by showerhead 1306. For example, FIG. 18 schematically shows an example of a skirt 1809 for a microvolume of a process station. As illustrated in the example of FIG. 18, pedestal 1808 is raised in a first pedestal position 1808A, positioning a portion of pedestal 1808 and an entire substrate support surface 1810 within a circumferential space of skirt 1809. Pedestal 1808 may also be lowered to a second pedestal position 1808B for, among other things, facilitating substrate transfer by one or more substrate handling robots (not shown). In some examples, skirt 1809 may not form a seal with pedestal 1808 and/or a substrate to avoid generating small particles during pedestal movements.

In the example of FIG. 18, skirt 1809 and showerhead 1806 are depicted as separate elements. In one non-limiting example, skirt 1809 may be made of a non-conducting material, such as a ceramic, electrically isolating showerhead 1806 from other portions of the process station. However, it will be appreciated that, in some examples, a skirt and showerhead may be a unitary element. It will be also appreciated that, in some examples, one or more openings may be included within a sidewall of skirt 1809 for differentially pumping the microvolume, and that one or more of such openings may be dynamically controlled.

Figure 19:
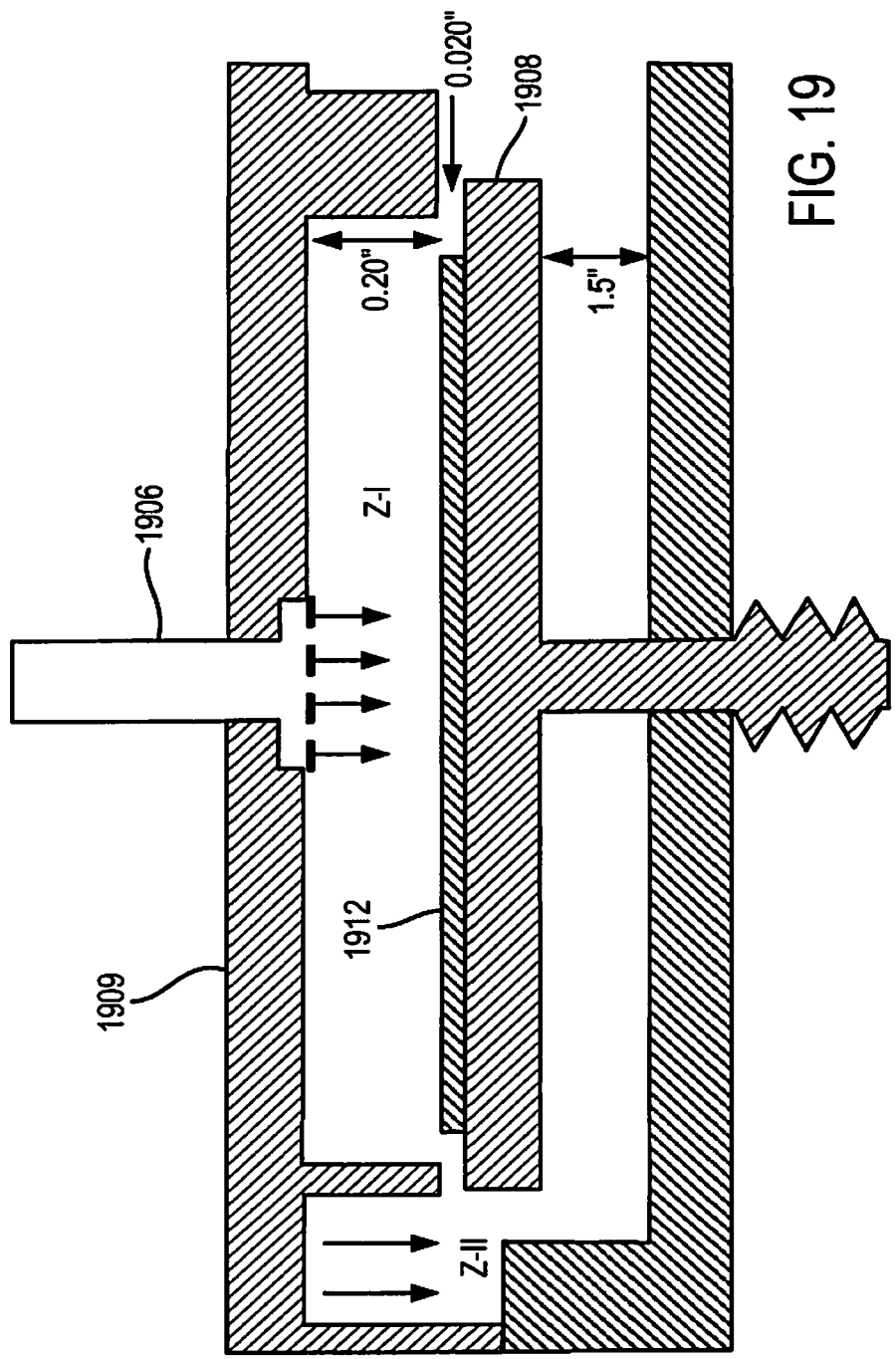
FIG. 19 schematically shows an example showerhead including a plurality of microvolumes for a process station according to an example of the present disclosure.

Additionally or alternatively, in some examples, a plurality of microvolumes may be formed within a skirt. For example, FIG. 19 shows an example of a skirt 1909 including a first microvolume Z-I above substrate 1912 and a second microvolume Z-II circumferentially surrounding a portion of pedestal 1908. In some examples, flow in microvolume Z-I may be non-uniform. Additionally or alternatively, in some examples, pressure in microvolume Z-II may be non-uniform. Example volumes of microvolume Z-I include, but are not limited to, volumes in a range from about 0.1 L to 2 L. Example volumes of microvolume Z-II include, but are not limited to, volumes in a range from about 10 L to 50 L.

In some examples, a pressure gradient between microvolumes Z-I and Z-II may be formed such that a pressure in microvolume Z-II exceeds a pressure in microvolume Z-1. Such a pressure gradient may prevent fugitive emissions of process gases from microvolume Z-I, conserving process reactants, avoiding particle-generating processes in the process station, etc. In some examples, microvolume Z-II may have an independent sweep gas supply. Non-limiting examples of sweep gases for microvolume Z-II include nitrogen, argon, helium, etc.

Figure 20:
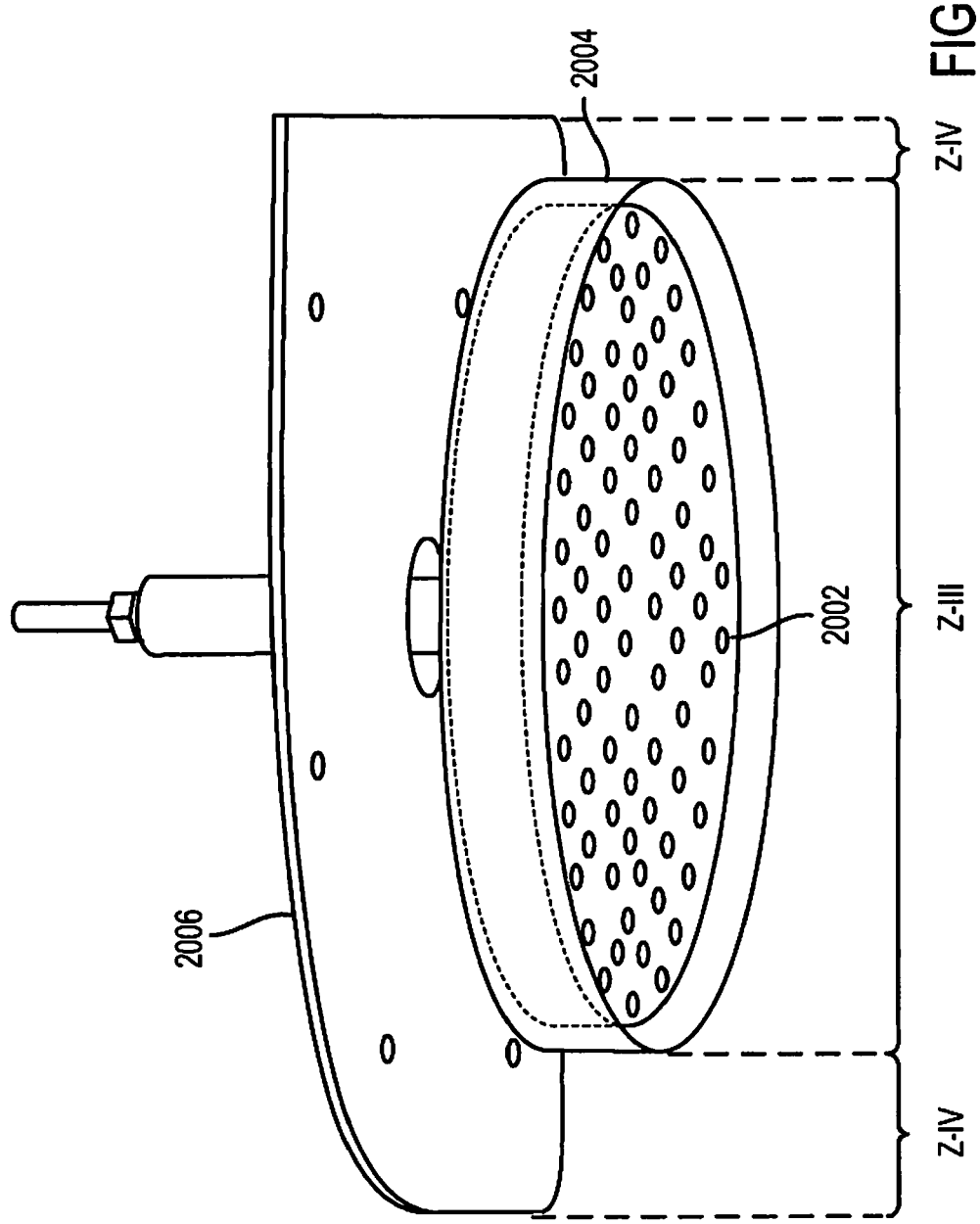
FIG. 20 schematically shows another example of a plurality of microvolumes included in a process station according to an example of the present disclosure.

While the example of FIG. 19 depicts a plurality of microvolumes formed within a skirt, it will be appreciated that, in some examples, a portion of a first microvolume may be separated from a portion of a second microvolume by a portion of a skirt. For example, FIG. 20 shows a perspective view of an example of a showerhead 2002. As depicted in the example of FIG. 20, first microvolume Z-III is circumferentially separated from a second microvolume Z-IV in part by skirt 2004. Sweep gas for microvolume Z-IV is provided via plate 2006. Thus, it will be appreciated that any suitable arrangement of a plurality of microvolumes within the process station may be employed within the scope of the present disclosure.

Returning to the example shown in FIG. 13, showerhead 1306 and pedestal 1308 electrically communicate with RF power supply 1314 and matching network 1316 for powering a plasma. In some examples, the plasma energy may be controlled by controlling one or more of a process station pressure, a gas concentration, an RF source power, an RF source frequency, and a plasma power pulse timing. For example, RF power supply 1314 and matching network 1316 may be operated at any suitable power to form a plasma having a desired composition of radical species. Examples of suitable powers include, but are not limited to, powers between 100 W and 5000 W for a 300 mm wafer. Likewise, RF power supply 1314 may provide RF power of any suitable frequency. In some examples, RF power supply 1314 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some examples, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some examples, one or more plasma parameters may be programmatically adjusted based on measurements from such in-situ plasma monitors. For example, an OES sensor may be used in a feedback loop for providing programmatic control of plasma power. It will be appreciated that, in some examples, other monitors may be used to monitor the plasma and other process characteristics. Such monitors may include, but are not limited to, infrared (IR) monitors, acoustic monitors, and pressure transducers.

In some examples, the plasma may be controlled via input/output control (IOC) sequencing instructions. The CFD processes described herein may employ precise timing of valves, plasma ignition, mass flow controllers (MFCs), among others, during CFD cycles. In one way to make this possible, valve and other commands are delivered to digital input-output controllers (IOC), sometimes in discrete packets of information, containing instructions for time-critical commands. These commands may direct operation of all or a part of a CFD cycle's sequence. An IOC translates the information in a packetized sequence and delivers digital or analog command signals directly to the appropriate hardware component. This implementation reduces delays in command execution at the valve, MFC, plasma source, etc.

The IOCs can be physically located at various points in the apparatus; e.g., within the process module or on a stand-alone power rack standing some distance away from the process module. There may be multiple IOCs in each module (e.g., 3 per module). With respect to the actual instructions included in a sequence, all commands for controlling valves, plasma sources, etc. may be included in a single IOC sequence. This assures that the timing of all the devices is tightly controlled from an absolute standpoint and also relative to each other. Alternatively, there may be multiple IOC sequences running at any given time. This allows for different aspects of a CFD cycle to run in parallel. For example, it allows the plasma ignition aspects of a cycle to run in parallel with the precursor delivery aspects of a cycle. Additionally, it allows multiple operations to run at various stations in a reactor. For example, one sequence may run for stations 1-2 with all timing controlled for all the hardware components needed to deposit oxide at those stations, and a second sequence may run concurrently to deposit CFD nitride at stations 3-4. Examples of IOC architectures and implementations may be found in U.S. Pat. No. 7,477,948 (filed Nov. 6, 2006), and U.S. Pat. No. 7,725,205 (filed Sep. 21, 2006), both incorporated herein by reference in their entireties.

Figure 22:
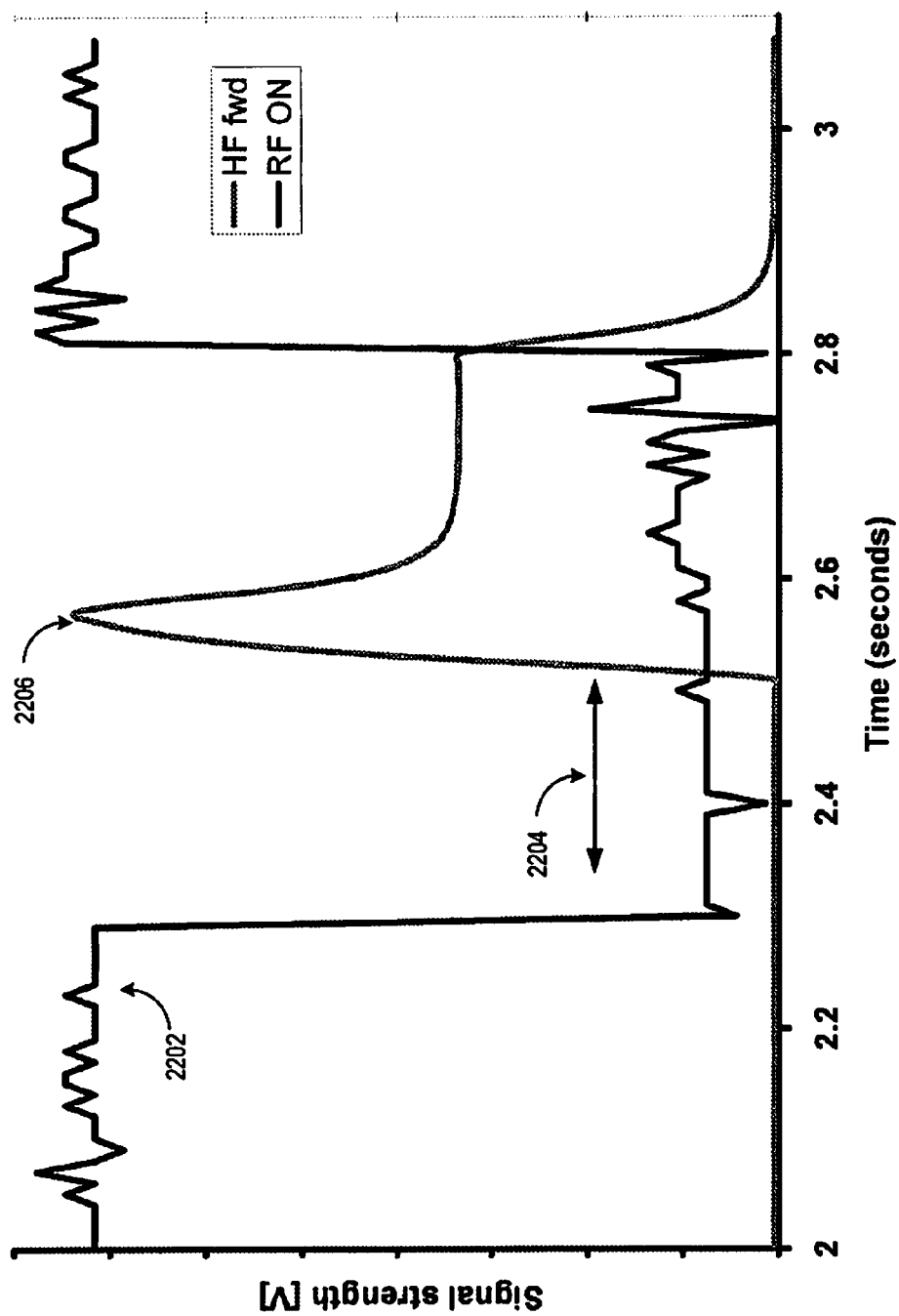
FIG. 22 schematically shows an example correlation between signal strength and time for plasma initiation according to an example of the present disclosure.

In one example, the instructions for setting plasma conditions for a plasma process phase may be included in a corresponding plasma activation recipe phase of a CFD process recipe. In some cases, process recipe phases may be sequentially arranged, so that all instructions for a CFD process phase are executed concurrently with that process phase. It will be appreciated that some aspects of plasma generation may have well-characterized transient and/or stabilization times that may prolong a plasma process phase. Put another way, such time delays may be predictable. Such time delays may include a time to strike the plasma and a time to stabilize the plasma at the indicated power setting. For example, FIG. 22 illustrates an example transient delay 2204 between a plasma ignition command signal 2202 and a forward power response 2206 for a plasma. Thus, in some examples, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

Figure 23:
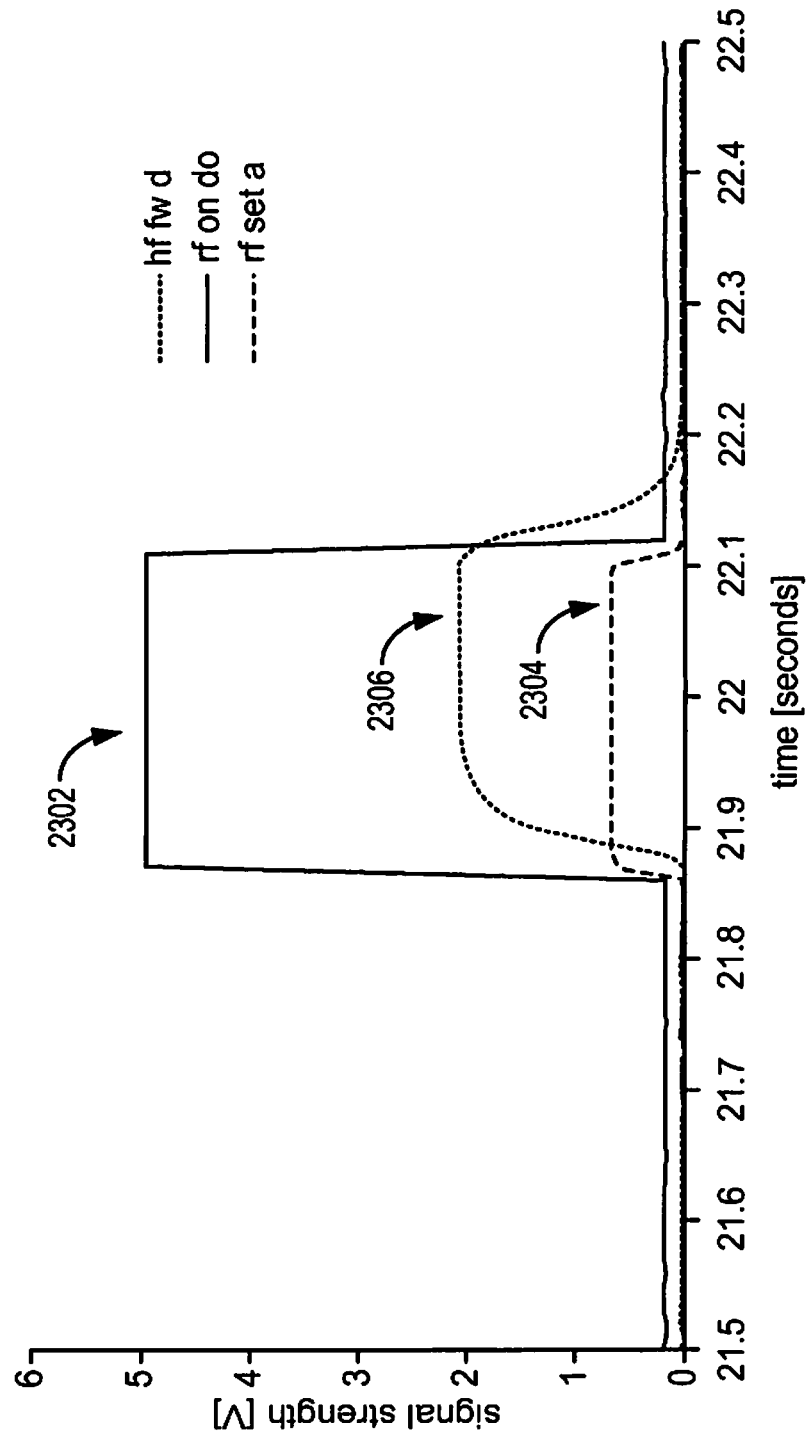
FIG. 23 schematically shows another example correlation between signal strength and time for plasma initiation control according to an example of the present disclosure.

In some examples, the above-described approach may allow an RF generator controller to stabilize at the indicated power setting before the plasma process phase begins. In some examples, a time to activate and stabilize a plasma may be reduced from approximately 200 ms to approximately 20 ms. For example, FIG. 23 illustrates an example plasma ignition command signal 2302, a plasma power setting 2304, and a forward power response 2306 for a plasma according to an example of the present disclosure. While the specific example described above relates to plasma ignition, it will be appreciated that, in some examples, one or more other time delays may be predictable, such that various control schemes and/or process recipes may be adapted to compensate for the time delay. Example time delays include, but are not limited to, time delays associated with stabilizing a liquid or gas flow rate, time delays associated with stabilizing a substrate and/or process station temperature, and time delays associated with stabilizing a process chamber and/or mixing vessel pressure.

Normally, an IOC implements a sequence of events and then awaits further instructions. In certain aspects described herein, the IOC is programmed so that it can loop over a sequence of instructions repeatedly. In one example, the sequence of instructions defines a set of operations associated with a single cycle of a CFD process. This might involve applying a command sequence for providing a plasma in the reaction chamber for a defined phase of the CFD cycle. The relevant IOC sequence of events might involve a particular delay period during which the plasma is not activated, then a very steep ramp up to a particular level of applied RF power, followed by holding that level applied power for a particular period of time, then dropping the power back to zero or some other predefined level, again for a defined period of time. When a sequence of events such as this is programmed into the IOC, it need not be resent for each cycle. Rather, the IOC maintains the sequence of instructions in some form of persistent memory and re-executes them repeatedly, cycle-by-cycle, over the course of a CFD deposition process. For example, 20 cycles of CFD may be performed over the course of a film deposition process. The plasma controlled sequence of events would be delivered and installed once in the IOC, which would then loop over that sequence of events repeatedly, 20 cycles in this example, until the complete CFD film was deposited.

Another aspect of the IOC control implemented in accordance with this disclosure is the ability to repeatedly turn off and turn on the flow of a particular precursor or other process gas over the course of a CFD process. This allows the precursor or other valuable material to be conserved, which is not always the case in conventional deposition processes employing continual flow and intermittent divert of precursors. In addition to preserving material, there may be other benefits to stop and start flow of a reactant. For example, it is frequently necessary to purge excess precursor from over the wafer before striking an RF plasma for a CFD process. Furthermore, certain examples require the use of two (or more) precursors which should not be allowed to meet in the chamber. So a typical flow may proceed as follows: (a) Flow Precursor A; (b) Purge Precursor A; (c) Flow Precursor B, (d) Purge Precursor B, and (e) Repeat steps (a)-(d) as needed.

In one example, the IOC may be programmed to repeatedly turn off and turn on the flow of a valuable precursor in a looping, cycle-by-cycle, fashion over the course of CFD process. In "turning on" the flow of precursor from its source, the sequence of instructions may account for a line charge delay associated with providing the precursor from its source to the showerhead or other inlet to the reaction chamber. This means that the timing of the initiation or execution of the precursor delivery operation must occur at some defined period of time prior to the actual required delivery of the precursor to the reaction chamber. Thus, the IOC sequence of events associated with delivery of the precursor may be executed in parallel with a different IOC's sequence of events associated with, for example, triggering a purge of a different reactant or ignition of a plasma in the reactor. In another example, if it is desired that the flow a particular reactant to the reactor terminate prior to igniting a plasma intended to drive a reaction between reactants on the surface of the wafer, the IOC events programmed to ignite the plasma may begin to execute prior to the expected termination of flow of the second reactants to the reaction chamber. More specifically, the initial execution of the command to ignite the plasma may occur at a time earlier than the expected termination of the flow of the second reactant, which time equals the delay associated with plasma power being delivered to the reactor after receipt of the plasma ignition command.

In conventional deposition processes, plasma strikes last on the order of a few seconds or more in duration. In various implementations described herein, much shorter plasma strikes are applied during a CFD cycle. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various examples disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with CFD cycles.

Another aspect of event programming for CFD cycles involves an error recovery mechanism which treats each CFD cycle as a binary event. In other words, any given cycle either occurred or did not occur. A partially completed cycle is treated such that it did not occur (or vice versa). In one example, if a malfunction takes place during a cycle, the cycle is treated as having not occurred. Thus, for example, if a given CFD film formation process is designed to require 20 discrete CFD cycles, and on the 15th of these 20 cycles a malfunction occurs, but the malfunction is promptly repaired, the partially completed $15^{th}$ cycle is not counted. Thus, another five cycles are performed until the film formation process is complete. Various malfunctions can occur and will be understood to those of skill the art. As one example, a mass flow controller for delivering precursor or oxidant to the reaction chamber may be designed to operate at a delivery rate of 10 L per second, but during a malfunction it operates at only 4 L per second.

In some examples, pedestal 1308 may be temperature controlled via heater 1310. Further, in some examples, pressure control for CFD process station 1300 may be provided by butterfly valve 1318. As shown in the example of FIG. 13, butterfly valve 1318 throttles a vacuum provided by a downstream vacuum pump (not shown). However, in some examples, pressure control of process station 1300 may also be adjusted by varying a flow rate of one or more gases introduced to CFD process station 1300.

As described above, one or more process stations may be included in a multi-station processing tool. FIG. 24 shows a schematic view of an example of a multi-station processing tool 2400 with an inbound load lock 2402 and an outbound load lock 2404, either or both of which may comprise a remote plasma source. A robot 2406, at atmospheric pressure, is configured to move wafers from a cassette loaded through a pod 2408 into inbound load lock 2402 via an atmospheric port 2410. A wafer is placed by the robot 2406 on a pedestal 2412 in the inbound load lock 2402, the atmospheric port 2410 is closed, and the load lock is pumped down. Where the inbound load lock 2402 comprises a remote plasma source, the wafer may be exposed to a remote plasma treatment in the load lock prior to being introduced into a processing chamber 2414. Further, the wafer also may be heated in the inbound load lock 2402 as well, for example, to remove moisture and adsorbed gases. Next, a chamber transport port 2416 to processing chamber 2414 is opened, and another robot (not shown) places the wafer into the reactor on a pedestal of a first station shown in the reactor for processing. While the example depicted in FIG. 24 includes load locks, it will be appreciated that, in some examples, direct entry of a wafer into a process station may be provided.

The depicted processing chamber 2414 comprises four process stations, numbered from 1 to 4 in the example shown in FIG. 24. Each station has a heated pedestal (shown at 2418 for station 1), and gas line inlets. It will be appreciated that in some examples, each process station may have different or multiple purposes. For example, in some examples, a process station may be switchable between a CFD and PECVD process mode. Additionally or alternatively, in some examples, processing chamber 2414 may include one or more matched pairs of CFD and PECVD process stations. While the depicted processing chamber 2414 comprises four stations, it will be understood that a processing chamber according to the present disclosure may have any suitable number of stations. For example, in some examples, a processing chamber may have five or more stations, while in other examples a processing chamber may have three or fewer stations.

FIG. 24 also depicts an example of a wafer handling system 2490 for transferring wafers within processing chamber 2414. In some examples, wafer handling system 2490 may transfer wafers between various process stations and/or between a process station and a load lock. It will be appreciated that any suitable wafer handling system may be employed. Non-limiting examples include wafer carousels and wafer handling robots. FIG. 24 also depicts an example of a system controller 2450 employed to control process conditions and hardware states of process tool 2400. System controller 2450 may include one or more memory devices 2456, one or more mass storage devices 2454, and one or more processors 2452. Processor 2452 may include a CPU or computer, analog and/or digital input/output connections, stepper motor controller boards, etc.

In some examples, system controller 2450 controls all of the activities of process tool 2400. System controller 2450 executes system control software 2458 stored in mass storage device 2454, loaded into memory device 2456, and executed on processor 2452. System control software 2458 may include instructions for controlling the timing, mixture of gases, chamber and/or station pressure, chamber and/or station temperature, wafer temperature, target power levels, RF power levels, substrate pedestal, chuck and/or susceptor position, and other parameters of a particular process performed by process tool 2400. System control software 2458 may be configured in any suitable way. For example, various process tool component subroutines or control objects may be written to control operation of the process tool components necessary to carry out various process tool processes. System control software 2458 may be coded in any suitable computer readable programming language.

In some examples, system control software 2458 may include input/output control (IOC) sequencing instructions for controlling the various parameters described above. For example, each phase of a CFD process may include one or more instructions for execution by system controller 2450. The instructions for setting process conditions for a CFD process phase may be included in a corresponding CFD recipe phase. In some examples, the CFD recipe phases may be sequentially arranged, so that all instructions for a CFD process phase are executed concurrently with that process phase.

Other computer software and/or programs stored on mass storage device 2454 and/or memory device 2456 associated with system controller 2450 may be employed in some examples. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 2418 and to control the spacing between the substrate and other parts of process tool 2400.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some examples, there may be a user interface associated with system controller 2450. The user interface may include a display screen, graphical software displays of the apparatus and/or process conditions, and user input devices such as pointing devices, keyboards, touch screens, microphones, etc.

In some examples, parameters adjusted by system controller 2450 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 2450 from various process tool sensors. The signals for controlling the process may be output on the analog and digital output connections of process tool 2400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 2450 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various examples described herein.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is to be understood that the configurations and/or approaches described herein are exemplary in nature, and that these specific examples or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted Likewise, the order of the above-described processes may be changed.

According to the present disclosure, the methods described for depositing a film such as silicon carbo-nitride (SiCN), silicon oxide (SiO) and silicon nitride (SiN) films can use a silicon-containing reactant selected from a precursor group including di-tert-butyl diazidosilane, bis(ethylmethylamido) silane, bis(diisopropylamino)silane, bis(tert-butylhydrazido) diethylsilane, tris(dimethylamido)silylazide, tris(dimethylamido) silylamide, ethylsilicon triazide, diisopropylaminosilane, and hexakis(dimethylamido)disilazane. The chemical structures and example synthetic protocols are set forth below:

Chemical Structure and Example Synthetic Protocol for Di-tert-butyl diazidosilane Di-tert-butyl diazidosilane has the following chemical structure:

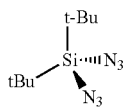

One suitable synthetic protocol for di-tert-butyl diazidosilane is set forth below:

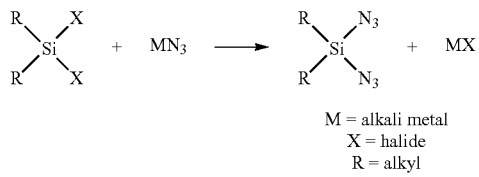

M = alkali metal
X = halide
R = alkyl

A 12 L round bottom flask is equipped with stir shaft with Teflon paddle, reflux condenser, thermowell and pressure equalizing addition funnel and flushed with inert gas for 1 hour. To the flask is added the metal azide, which is slurried in reaction solvent. To the addition funnel is added the silicon halide. The silicon halide is added at room temperature over a period of 30 minutes to the metal azide. After addition is complete, the reaction is allowed to stir for 24 hours.

The mixture is tested for completeness. Complete disappearance of the silicon halide starter indicates the end of the stir period. Once this is determined, the reaction mixture is filtered through a porous glass, stainless steel or Teflon filter medium. The solids are washed with hydrocarbon solvent and filtered into the same vessel as the original mother liquor. The solvent is then stripped off under vacuum to yield crude final product. The final product is fractionally distilled to yield pure silicon azide compound. This synthetic protocol is similar to that described in: Welsh, K. M., Michl, J., West, R. JACS, 1988, 110, 6689, which is hereby incorporated by reference in its entirety.

Chemical Structure and Example Synthetic Protocol for Bis(ethylmethylamido)silane, Bis(diisopropylamino)silane and Bis(tert-butylhydrazido)diethylsilane Bis(ethylmethylamido)silane has the following chemical structure:

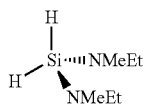

Bis(tert-butylhydrazido)diethylsilane has the following chemical structure:

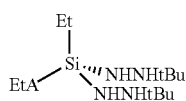

Bis(diisopropylamino)silane has the following chemical structure:

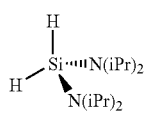

The following example synthetic protocol can be used for bis(ethylmethylamido)silane, bis(diisopropylamino)silane and bis(tert-butylhydrazido)diethylsilane.

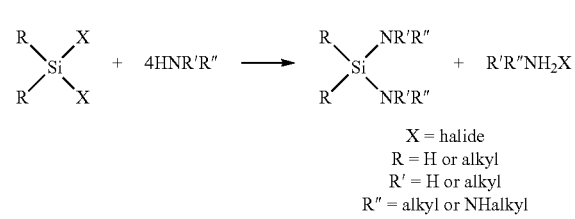

X = halide
R = H or alkyl
R' = H or alkyl
R'' = alkyl or NHalkyl

A 12 L round bottom flask is equipped with stir shaft with Teflon paddle, reflux condenser, thermowell and pressure equalizing addition funnel and flushed with inert gas for 1 hour. To the flask is added the silicon halide in reaction solvent. To the addition funnel is added the amine or hydrazine derivative and this is added to the silicon halide at 0-10 C over a period of 1 hour. After addition is complete, the reaction is allowed to stir for 24 hours as it warms to room temperature. The mixture is tested for completeness.

Complete disappearance of the silicon halide starter indicates the end of the stir period. Once this is determined, the reaction mixture is filtered through a porous glass, stainless steel or Teflon filter medium. The solids are washed with hydrocarbon solvent and filtered into the same vessel as the original mother liquor. The solvent is then stripped off under vacuum to yield crude final product. The final product is fractionally distilled to yield pure silylamide.

Chemical Structure and Example Synthetic Protocol for Ethylsilicon Triazide

Ethylsilicon triazide has the following chemical structure:

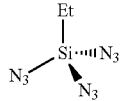

The following example synthetic protocol can be used for ethylsilicon triazide:

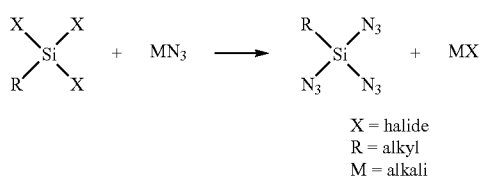

X = halide
R = alkyl
M = alkali

A 12 L round bottom flask is equipped with stir shaft with Teflon paddle, reflux condenser, thermowell and pressure equalizing addition funnel and flushed with inert gas for 1 hour. To the flask is added the metal azide, which is slurried in reaction solvent. To the addition funnel is added the silicon halide. The silicon halide is added at room temperature over a period of 30 minutes to the metal azide. After addition is complete, the reaction is allowed to stir for 24 hours. The mixture is tested for completeness.

Complete disappearance of the silicon halide starter indicates the end of the stir period. Once this is determined, the reaction mixture is filtered through a porous glass, stainless steel or Teflon filter medium. The solids are washed with hydrocarbon solvent and filtered into the same vessel as the original mother liquor. The solvent is then stripped off under vacuum to yield crude final product. The final product is fractionally distilled to yield pure silicon azide compound.

Chemical Structure and Example Synthetic Protocol for Diisopropylaminosilane

Diisopropylaminosilane has the following chemical structure:

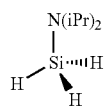

One suitable synthetic protocol for diisopropylaminosilane can be found in US Patent Publication No. US2006/0258173, which is hereby incorporated by reference in its entirety.

Chemical Structure and Example Synthetic Protocol for Hexakis(dimethylamido)disilazane Hexakis(dimethylamido)disilazane has the following chemical structure:

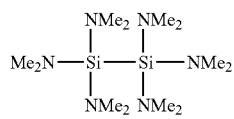

The reaction is performed similar to those hexakis(dialkylamido)disilanes synthesized in US Patent Publication No. US2004/096582 A1, which is hereby incorporated by reference in its entirety.

Chemical Structure and Example Synthetic Protocol for Tris(dimethylamido)silylazide and Tris(dimethylamido)silylamide Tris(dimethylamido)silylazide has the following chemical structure:

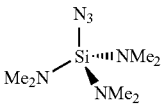

Tris(dimethylamido)silylamide has the following chemical structure:

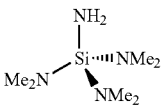

One suitable synthetic protocol for tris(dimethylamido)silylazide and tris(dimethylamido)silylamide is set forth below:

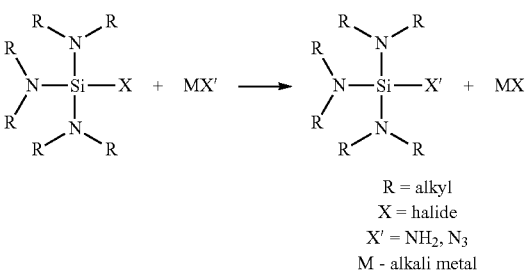

R = alkyl
X = halide
X' = $NH_2$, $N_3$
M - alkali metal

A 12 L round bottom flask is equipped with stir shaft with Teflon paddle, reflux condenser, thermowell and pressure equalizing addition funnel and flushed with inert gas for 1 hour. To the flask is added the metal amide or azide and slurried in reaction solvent. To the addition funnel is added the tris(dialkylamido)silyl halide and this is added to the metal amide or metal azide slurry over a period of 30 minutes.

The reaction is allowed to stir for 24-48 hours while monitoring the mixture for completeness. Complete disappearance of tris(dialkylamido)silyl halide starter indicates the end of the stir period. Once this is determined, the reaction mixture is filtered through a porous glass, stainless steel or Teflon filter medium. The solids are washed with hydrocarbon solvent and filtered into the same vessel as the original mother liquor. The solvent is then stripped off under vacuum to yield crude final product. The final product is fractionally distilled to yield pure silylamide or silylazide.

Using the silicon-containing reactant selected from the precursor group set forth above enables deposition of conformal film at lower temperatures. For example, deposition can be performed at temperatures less than or equal to 400° C. In some circumstances, using these lower deposition temperatures resolves thermal budget and integration concerns. For example only, the method may be used to deposit a SiN film such as $Si_3N_4$ at 350° C. However, some of the precursors in the precursor group described above may be used to deposit other films such as SiCN and SiO.

The silicon-containing reactants selected from the precursor group are Halogen-free, which alleviates corrosion concerns and reduces toxicity with waste-stream management. The silicon-containing reactants in the precursor group are liquids at room temperature. All of the silicon-containing reactants in the precursor group are readily deliverable in semiconductor processing systems. For example, the all of the silicon-containing reactants in the precursor group may be used with conventional interlayer dielectric (ILD) systems such as the Vector ILDS systems available from Novellus.

The method according to the present disclosure can be used to deposit a $Si_3N_4$ film (chemical precursor(s) and process conditions) for semiconductor processing applications capable of meeting step-coverage, fill, defect, reliability, and electrical requirements for the nominal 1× nm memory and 22/16 nm generation logic nodes.

In a first example, the method was used to create a PEALD SiN film using the precursors. Generalized conditions have been demonstrated to yield CFD SiN films with the Tris (dimethylamido)silylazide precursor: the precursor [$(Me_2N)_3SiN_3$] with $NH_3+5\%$ $H_2$, ATRP35 and $NH_3$ plasma, the substrate temperature was 350° C., the bubbler temperature was 50° C. and vapor draw was used. Plasma was 200 W with reflected power average of approximately 2 W. The plasma composition was $NH_3+5\%$ $H_2$, $N_2$ at 56.5 sccm, $H_2$ at 13.5 sccm and pulse length of 5 s.

The subject matter of the present disclosure includes all novel and nonobvious combinations and subcombinations of the various processes, systems and configurations, and other features, functions, acts, and/or properties disclosed herein, as well as any and all equivalents thereof.

What is claimed is:

1. A method of depositing a film on a substrate surface, comprising:
    providing a substrate in a reaction chamber;
    selecting a silicon-containing reactant from a precursor group consisting of di-tert-butyl diazidosilane, tris(dimethylamido)silylazide, and bis(tert-butylhydrazido)diethylsilane;
    introducing the silicon-containing reactant in vapor phase into the reaction chamber; and
    introducing a second reactant in vapor phase into the reaction chamber.

2. The method of claim 1, further comprising:
    introducing the silicon-containing reactant under conditions allowing the silicon-containing reactant to adsorb onto the substrate surface; and
    exposing the substrate surface to plasma to drive a reaction between the silicon-containing reactant and the second reactant on the substrate surface to form the film.

3. The method of claim 1, further comprising introducing the second reactant into the reaction chamber while the silicon-containing reactant is adsorbed on the substrate surface and without first sweeping the silicon-containing reactant out of the reaction chamber.

4. The method of claim 1, further comprising flowing the second reactant to the substrate surface at one of a constant flow rate, a non-constant flow rate and an intermittent flow rate.

5. The method of claim 1, wherein:
    the film comprises SiN;
    the film forms a conformal structure; and
    deposition of the film is performed at a temperature less than or equal to 400° C.

6. A method of depositing a film on a substrate surface, comprising:
    (a) providing a substrate in a reaction chamber;
    (b) selecting a silicon-containing reactant from a precursor group consisting of di-tert-butyl diazidosilane, bis(ethylmethylamido)silane, bis(diisopropylamino)silane, bis(tert-butylhydrazido)diethylsilane, tris(dimethylamido)silylazide, tris(dimethylamido)silylamide, ethylsilicon triazide, diisopropylaminosilane, and hexakis(dimethylamido)disilazane;
    (c) introducing the silicon-containing reactant in vapor phase into the reaction chamber under conditions allowing the silicon-containing reactant to adsorb onto the substrate surface;
    (d) introducing a second reactant in vapor phase into the reaction chamber while the silicon-containing reactant is adsorbed on the substrate surface, wherein the second reactant is introduced without first sweeping the silicon-containing reactant out of the reaction chamber;
    (e) exposing the substrate surface to plasma to drive a reaction between the silicon-containing reactant and the second reactant on the substrate surface to form the film; and
    (f) sweeping out the second reactant in vapor phase prior to (e).

7. The method of claim 6, wherein the plasma is ignited while at least one of the silicon-containing reactant and the second reactant is in a gas phase while being exposed to the substrate.

8. The method of claim 6, wherein the silicon-containing reactant and the second reactant do not react with one another in the vapor phase.

9. The method of claim 6, wherein:
    the film comprises SiN film; and
    deposition of the film is performed at a temperature less than or equal to 400° C.

10. The method of claim 6, further comprising flowing the second reactant to the substrate surface at a non-constant flow rate during (d).

11. The method of claim 6, wherein the silicon-containing reactant and the second reactant co-exist in vapor phase, and wherein the silicon-containing reactant and the second reactant do not appreciably react with one another until exposure to plasma in (e).

12. The method of claim 6, wherein the film formed in (e) forms a conformal structure.

13. The method of claim 6, further comprising, after (e), depositing additional film directly on a portion of the film by chemical vapor deposition.

14. The method of claim 6, further comprising flowing the second reactant to the substrate surface at one of a constant flow rate, a non-constant flow rate and an intermittent flow rate.

15. A method of depositing a film on a substrate surface, comprising:
    (a) providing a substrate in a reaction chamber;
    (b) selecting a silicon-containing reactant from a precursor group consisting of di-tert-butyl diazidosilane, bis(ethylmethylamido)silane, bis(diisopropylamino)silane, bis(tert-butylhydrazido)diethylsilane, tris(dimethylamido)silylazide, tris(dimethylamido)silylamide, ethylsilicon triazide, diisopropylaminosilane, and hexakis(dimethylamido)disilazane;
    (c) introducing the silicon-containing reactant in vapor phase into the reaction chamber under conditions allowing the silicon-containing reactant to adsorb onto the substrate surface;
    (d) introducing a second reactant in vapor phase into the reaction chamber while the silicon-containing reactant is adsorbed on the substrate surface;
    (e) exposing the substrate surface to plasma to drive a reaction between the silicon-containing reactant and the second reactant on the substrate surface to form the film; and (f) exposing the substrate surface to the second reactant after sweeping the silicon-containing reactant out of the reaction chamber but prior to (e).

\* \* \* \* \*